US 9,350,357 B2

(12) United States Patent
Sato et al.

(10) Patent No.: US 9,350,357 B2
(45) Date of Patent: May 24, 2016

(54) RECONFIGURABLE SEMICONDUCTOR DEVICE

(71) Applicant: TAIYO YUDEN CO., LTD., Tokyo (JP)

(72) Inventors: Masayuki Sato, Tokyo (JP); Koshi Sato, Saitama (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 14/438,835

(22) PCT Filed: Oct. 27, 2013

(86) PCT No.: PCT/JP2013/079050
§ 371 (c)(1),
(2) Date: Apr. 27, 2015

(87) PCT Pub. No.: WO2014/065424
PCT Pub. Date: May 1, 2014

(65) Prior Publication Data
US 2015/0280717 A1      Oct. 1, 2015

(30) Foreign Application Priority Data

Oct. 28, 2012   (JP) .................................. 2012-237353

(51) Int. Cl.
*H03K 19/177*    (2006.01)
*G11C 8/10*      (2006.01)

(52) U.S. Cl.
CPC .............. *H03K 19/1776* (2013.01); *G11C 8/10* (2013.01); *H03K 19/17728* (2013.01)

(58) Field of Classification Search
CPC ................... H03K 19/1776; H03K 19/17728; G11C 8/10
USPC .................. 326/37–41, 47; 716/116
See application file for complete search history.

(56) References Cited

U.S. PATENT DOCUMENTS 5,815,726 A    9/1998   Cliff
5,868,666 A    2/1999   Okada et al.
(Continued)

FOREIGN PATENT DOCUMENTS

JP    H7-154241 A    6/1995
JP    H11-8547 A     1/1999
(Continued)

OTHER PUBLICATIONS

Hironaka et al., "Consideration of MPLD Architecture for High Performance Computing", IEICE Technical Report, CPSY2008-31, Oct. 24, 2008, vol. 108, No. 273, pp. 13-18, the Institute of Electronics Information and Communication Engineers (IEICE), Tokyo Japan (Cited in the related U.S. Appl. No. 13/805,287 and English abstract included as a concise explanation of relevance).
(Continued)

*Primary Examiner* — Dylan White
(74) *Attorney, Agent, or Firm* — Chen Yoshimura LLP

(57) ABSTRACT

A reconfigurable semiconductor device includes a plurality of logic units connected to each other via address lines or data lines, each of the logic units including: a plurality of address lines; a plurality of data lines; a first address decoder that decodes addresses inputted from some of the address lines; a second address decoder that decodes addresses inputted from the other of the address lines; a first memory cell unit having a plurality of memory cells and selecting, among said plurality of memory cells, a predetermined number of memory cells in accordance with the address decoded by the first address decoder; and a second memory cell unit having a plurality of memory cells and selecting, among said plurality of memory cells, a predetermined number of memory cells in accordance with the address decoded by the second address decoder.

26 Claims, 41 Drawing Sheets

(56) References Cited

U.S. PATENT DOCUMENTS

| | | | |
|---|---|---|---|
| 6,417,691 | B1 | 7/2002 | Goodman et al. |
| 6,998,872 | B1 | 2/2006 | Chirania et al. |
| 7,170,315 | B2 | 1/2007 | Bakker et al. |
| 2005/0134308 | A1 | 6/2005 | Okada et al. |
| 2006/0017459 | A1 | 1/2006 | Kanno et al. |
| 2007/0222477 | A1 | 9/2007 | Lewis et al. |
| 2009/0119491 | A1 | 5/2009 | Nishino et al. |
| 2009/0154282 | A1 | 6/2009 | Satoh |
| 2009/0290444 | A1 | 11/2009 | Satoh |
| 2010/0188923 | A1 | 7/2010 | Satoh |
| 2010/0257335 | A1 | 10/2010 | Hanai et al. |
| 2012/0007635 | A1 | 1/2012 | Hironaka et al. |
| 2013/0100750 | A1* | 4/2013 | Ishiguro ............ H03K 19/1776 365/189.011 |
| 2015/0022232 | A1* | 1/2015 | Satou ................ H03K 19/1776 324/762.01 |
| 2015/0042377 | A1* | 2/2015 | Satou .............. H03K 19/17732 326/16 |
| 2015/0095860 | A1* | 4/2015 | Satou ................. G06F 17/5054 716/103 |
| 2015/0286762 | A1* | 10/2015 | Sato ..................... H03K 19/173 716/103 |

FOREIGN PATENT DOCUMENTS

| | | |
|---|---|---|
| JP | 2003-149300 A | 5/2003 |
| JP | 2003-224468 A | 8/2003 |
| JP | 2005-182654 A | 7/2005 |
| JP | 2006-33579 A | 2/2006 |
| JP | 2009-194676 A | 8/2009 |
| JP | 2010-239325 A | 10/2010 |
| JP | 2010-244238 A | 10/2010 |
| WO | 2007/060738 A1 | 5/2007 |
| WO | 2007/060763 A1 | 5/2007 |
| WO | 2007/114059 A1 | 10/2007 |
| WO | 2009/001426 A1 | 12/2008 |
| WO | 2011/162116 A1 | 12/2011 |

OTHER PUBLICATIONS

Taomoto et al., "Design and Implementation of a GUI Tool for Circuit Design on MPLDs", IEICE Technical Report, RECONF2010-27, Sep. 24, 2010, vol. 110, No. 204, pp. 55-60, the Institute of Electronics Information and Communication Engineers (IEICE), Tokyo Japan (Cited in the related U.S. Appl. No. 13/805,287 and English abstract included as a concise explanation of relevance).

International Search Report (ISR) issued in PCT/JP2011/063461 mailed in Sep. 2011. (Cited in the related U.S. Appl. No. 13/805,287.)

Written Opinion (PCT/ISA/237) issued in PCT/JP2011/063461 mailed in Sep. 2011. (Cited in the related U.S. Appl. No. 13/805,287.).

Japanese Office Action dated Aug. 26, 2013, in a counterpart Japanese patent application No. 2012-189334. (Cited in the related U.S. Appl. No. 13/805,287.).

International Search Report (ISR) issued in PCT/JP2013/079050 mailed in Nov. 2013.

U.S. Appl. No. 13/805,287 patented on Feb. 10, 2015 and U.S. Appl. No. 14/552,042, filed Nov. 24, 2014.

Written Opinion (PCT/ISA/237) issued in PCT/JP2013/079050 mailed in Nov. 2013.

* cited by examiner

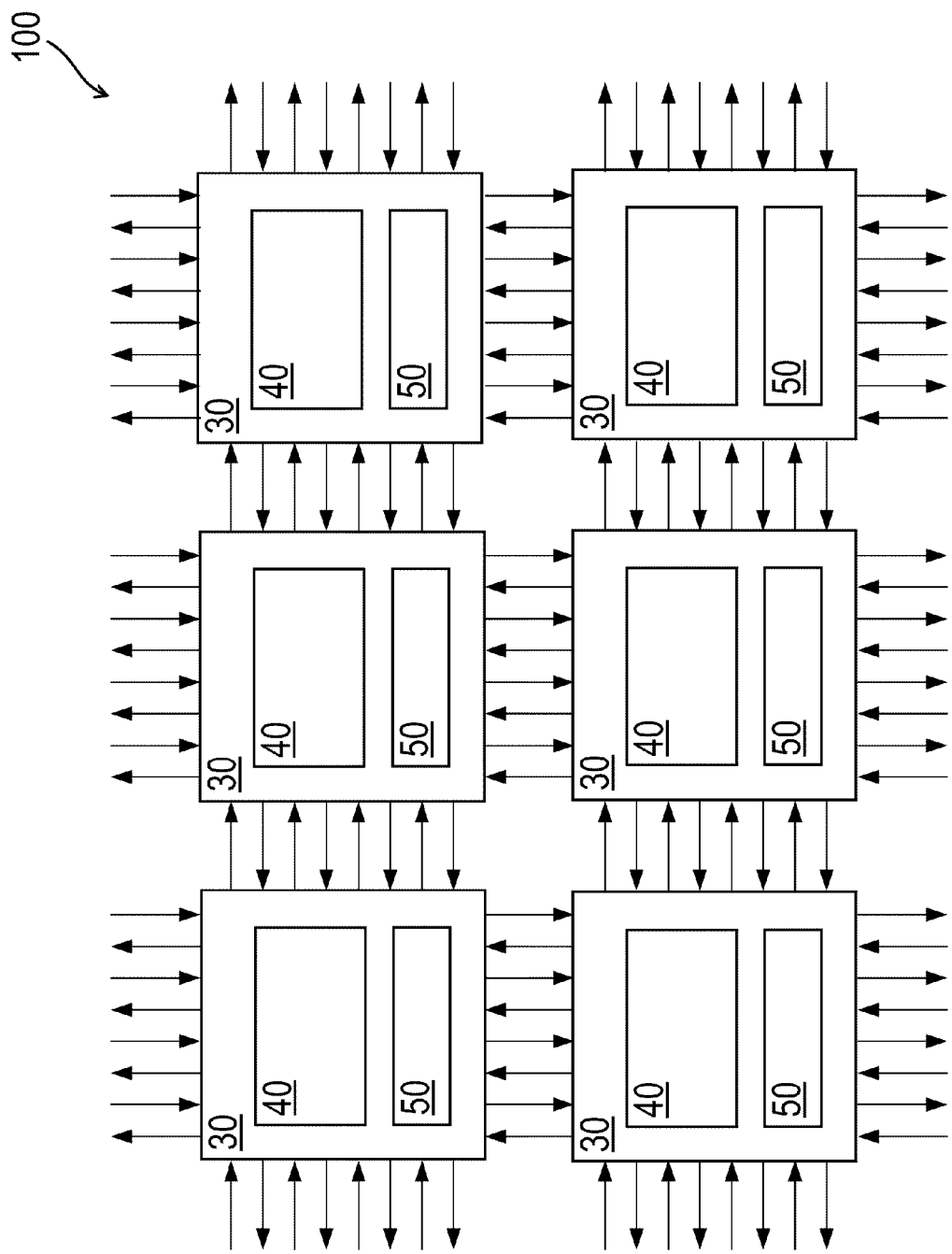

| A0 | A1 | A2 | A3 | D0 | D1 | D2 | D3 |
|---|---|---|---|---|---|---|---|
| 0 | 0 | 0 | 0 | 0 | * | * | * |
| 1 | 0 | 0 | 0 | 1 | * | * | * |
| 0 | 1 | 0 | 0 | 1 | * | * | * |
| 1 | 1 | 0 | 0 | 1 | * | * | * |
| 0 | 0 | 1 | 0 | 0 | * | * | * |
| 1 | 0 | 1 | 0 | 1 | * | * | * |
| 0 | 1 | 1 | 0 | 1 | * | * | * |
| 1 | 1 | 1 | 0 | 1 | * | * | * |
| 0 | 0 | 0 | 1 | 0 | * | * | * |
| 1 | 0 | 0 | 1 | 1 | * | * | * |
| 0 | 1 | 0 | 1 | 1 | * | * | * |
| 1 | 1 | 0 | 1 | 1 | * | * | * |
| 0 | 0 | 1 | 1 | 1 | * | * | * |
| 1 | 0 | 1 | 1 | 1 | * | * | * |
| 0 | 1 | 1 | 1 | 1 | * | * | * |
| 1 | 1 | 1 | 1 | 1 | * | * | * |

A0 ─────────────→ D1
A1 ─────────────→ D2
A2 ─────────────→ D3
A3 ─────────────→ D0

FIG. 37
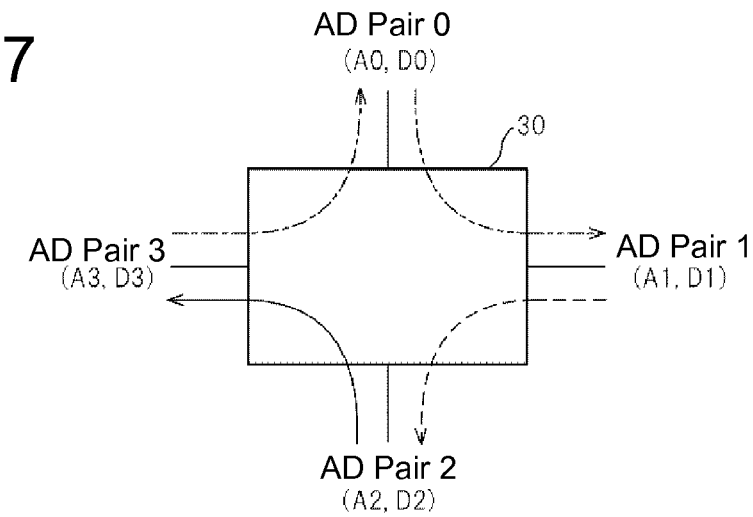
FIG. 38
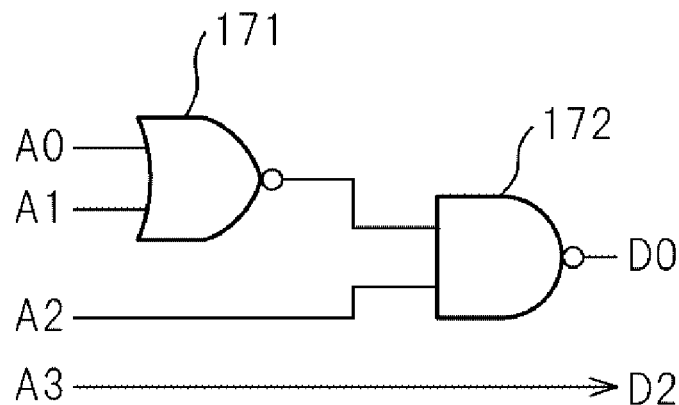
FIG. 39
| A0 | A1 | A2 | A3 | D0 | D1 | D2 | D3 |
|----|----|----|----|----|----|----|----|
| 0 | 0 | 0 | 0 | 0 | * | 0 | * |
| 1 | 0 | 0 | 0 | 0 | * | 0 | * |
| 0 | 1 | 0 | 0 | 0 | * | 0 | * |
| 1 | 1 | 0 | 0 | 1 | * | 0 | * |
| 0 | 0 | 1 | 0 | 0 | * | 0 | * |
| 1 | 0 | 1 | 0 | 0 | * | 0 | * |
| 0 | 1 | 1 | 0 | 0 | * | 0 | * |
| 1 | 1 | 1 | 0 | 0 | * | 0 | * |
| 0 | 0 | 0 | 1 | 0 | * | 1 | * |
| 1 | 0 | 0 | 1 | 0 | * | 1 | * |
| 0 | 1 | 0 | 1 | 0 | * | 1 | * |
| 1 | 1 | 0 | 1 | 1 | * | 1 | * |
| 0 | 0 | 1 | 1 | 0 | * | 1 | * |
| 1 | 0 | 1 | 1 | 0 | * | 1 | * |
| 0 | 1 | 1 | 1 | 0 | * | 1 | * |
| 1 | 1 | 1 | 1 | 0 | * | 1 | * |

RECONFIGURABLE SEMICONDUCTOR DEVICE

TECHNICAL FIELD

The present invention relates to a reconfigurable semiconductor device.

BACKGROUND ART

Programmable logic devices (PLDs) in which the circuit configuration can be switched, such as field-programmable gate arrays (FPGA), are in wide use (Patent Document 1, for example). The applicant or inventor has developed "memory-based programmable logic devices (MPLD)" (registered trademark) in which a circuit configuration is constituted of memory cell units. MPLDs are disclosed in Patent Document 1 below, for example. In MPLDs, memory arrays referred to as "multiple lookup tables" (MLUTs) are connected to each other. MLUTs store truth table data and form wiring elements and logic elements. MPLDs realize almost the same functions as FPGAs by having these MLUTs arranged in an array and connected to each other.

Also, MPLDs are devices having flexibility in terms of logic regions and wiring regions by using MLUTs both as logic elements and wiring elements by truth table data (Patent Document 2, for example), and differ from FPGAs having specialized switching circuits at the connections between memory cell units.

Additionally, multi-directional type MLUTs (Patent Document 1) having address lines or data lines inputting or outputting in multiple directions, and rectangular type MLUTs (Patent Document 3) that are rectangular and that input and output data in only the horizontal direction are disclosed as types of MLUTs. The connection between MLUTs is achieved by forming a pair including 1 bit each of an address line and a data line, thereby realizing pseudo-bidirectional lines. These pseudo-bidirectional lines are referred to as an "AD pair." For multi-directional type MLUTs, adjacent MLUTs are connected by one AD pair, and thus, data transmitted between adjacent MLUTs is 1 bit.

RELATED ART DOCUMENTS

Patent Documents

Patent Document 1: Japanese Patent Application Laid-Open Publication No. 2010-239325
Patent Document 2: U.S. Pat. No. 5,815,726 Specification
Patent Document 3: WO 2011/162116

SUMMARY OF THE INVENTION

Problems to be Solved by the Invention

If a data process coded for multi-bit computation is achieved by MLUTs, then there is a need for the multiple bits to be split into smaller bit sizes (hereinafter, "bit slicing"), and for bit computation to be performed by a plurality of MLUTs. A multi-directional type MLUT can only input/output one piece of data or address to an adjacent MLUT, and thus, can only transmit 1 bit of data to the adjacent MLUT. Thus, in multi-bit computation, bit slicing is required for 1 bit, and thus, there is an increase in the number of MLUTs needed. If, for example, an 8-bit adder is configured using MLUTs, then the adder requires eight MLUTs, each of which computes 1 bit at a time, and there is also a need for MLUTs realizing logic circuits in order to add the computation results.

Means for Solving the Problems

Aspects to solve the above-mentioned problems are indicated in the following items:
1. A reconfigurable semiconductor device, including:
a plurality of logic units connected to each other by address lines or data lines, wherein each of the logic units includes:
a plurality of address lines;
a plurality of data lines;
a first address decoder that decodes an address inputted from some of the plurality of address lines;
a second address decoder that decodes an address inputted from the other of the plurality of address lines;
a first memory cell unit having a plurality of memory cells, the first memory cell receiving the address decoded by the first address decoder and selecting, among the plurality of memory cells, a predetermined number of memory cells in accordance with the decoded address; and
a second memory cell unit having a plurality of memory cells, the first memory cell receiving the address decoded by the second address decoder and selecting, among the plurality of memory cells, a predetermined number of memory cells in accordance with the decoded address.

According to the semiconductor device above, the number of memory cell units increases in proportion to the square of the number of address lines, and thus, even if the number of data lines is the same, if the number of address lines in each memory cell unit is decreased, then it is possible to reduce the total number of memory cells needed.

2. The semiconductor device according to item 1, wherein the first and second memory cell units are multiple lookup tables.

This semiconductor device clearly differs from an FPGA, which realizes a selection circuit by wiring connection, in that the semiconductor device uses a multiple lookup table in order to perform operations as the logic element and/or the connective element.

3. The semiconductor device according to item 1, wherein the logic units are rectangular, and are each connected on one side to other logic units through the plurality of address lines or the plurality of data lines, the logic units being connected to the other logic units through the plurality of address lines or the plurality of data lines from another side opposite to the one side.

Because a multi-bit data process can be performed on adjacent logic units, it is possible to reduce the number of logic units used in a data process configured by a program performing multi-bit computation.

4. The semiconductor device according to item 3,
wherein the plurality of address lines are divided into a first plurality of address lines and a second plurality of address lines,
wherein in the first memory cell unit, the predetermined number of memory cells are selected by the decoded address provided by the first plurality of address lines from the one side, the predetermined number of memory cells respectively outputting data stored therein to a first plurality of data lines, respectively, the predetermined number being twice as many as the number of the first plurality of address lines,
wherein in the second memory cell unit, the predetermined number of memory cells are selected by the decoded address provided by the second plurality of address lines from the another side, the predetermined number of memory cells respectively outputting data stored therein to a second plurality of data lines, respectively, the predetermined number being twice as many as the number of the second plurality of address lines, and wherein in each of the logic units, some of the first plurality of data lines and some of the second plurality of data lines are outputted to the one side, and the other of the first plurality of data lines and the other of the second plurality of data lines are outputted to the another side.

By increasing the number of pieces of data in each memory cell unit to greater than the number of addresses and by making allowing data to be outputted in two directions from each memory cell unit, the number of memory cells needed can be reduced, and it is possible to enable data output in two directions.

5. The semiconductor device according to item 4, wherein the first memory cell unit stores first truth table data for outputting data to the one side and second truth table data for outputting data to the another side in response to address input from the one side, wherein the second memory cell unit stores third truth table data for outputting data to the one side and fourth truth table data for outputting data to the another side in response to address input from the another side, and wherein a direction of output of the data is changed according to the first to fourth truth table data.

6. The semiconductor device according to item 3, wherein the plurality of address lines are divided into a first plurality of address lines and a second plurality of address lines, wherein in the first memory cell unit, the predetermined number of memory cells are selected by the decoded address provided by the first plurality of address lines from the one side, the predetermined number of memory cells respectively outputting data stored therein to a first plurality of data lines, respectively, the predetermined number being twice as many as the number of the first plurality of address lines, wherein in the second memory cell unit, the predetermined number of memory cells are selected by the decoded address provided by the second plurality of address lines from the another side, the predetermined number of memory cells respectively outputting data stored therein to a second plurality of data lines, respectively, the predetermined number being the same as the number of the second plurality of address lines, and wherein in each of the logic units, the second plurality of data lines and some of the first plurality of data lines are outputted to the one side, and the other of the first plurality of data lines are outputted to the another side.

By restricting output in the return direction to any of the memory cells, it is possible to further reduce the number of memory cells needed.

7. The semiconductor device according to item 1, wherein each of the first and second memory cell units is configured to do either or both of the following:

operate as a logic circuit by storing truth table data for outputting to the data lines logic calculations of values stored in memory cells selected by some of the address lines; and operate as a connecting circuit by storing truth table data for outputting to the data lines that are connected to address lines of other logic units, values stored in memory cells selected by some of the address lines.

8. The semiconductor device according to item 1, wherein the first memory cell unit and the second memory cell unit each store a plurality of truth table data and are connected to a second plurality of address lines outputting data identifying one of the plurality of truth table data.

It is possible to provide a reconfigurable semiconductor device able to control redundant addresses using high capacity memory by page switching control.

9. The semiconductor device according to item 1, wherein the second memory cell unit stores a plurality of truth table data and is connected to a second plurality of address lines outputting data identifying one of the plurality of truth table data, and wherein some of the data lines of the first memory cell unit are connected to the second plurality of address lines, and the first memory cell unit stores truth table data for identifying the one of the plurality of truth table data in the second memory cell unit and outputs to the second plurality of address lines the data identifying the one of the plurality of truth table data.

By using high capacity memory, it is also possible to perform page switching control.

10. The semiconductor device according to item 8, wherein the second plurality of address lines are connected to an exterior.

11. The semiconductor device according to any one of items 1 to 10, wherein each of the logic units includes:

data input lines;

data output lines; and a reconfigurable logic multiplexer that does either or both of the following: couples data input from the data input lines and data output to the data output lines selectively in response to the truth table data; and outputs data resulting from logic calculation of the data input to the data output lines in response to the truth table data, and wherein the logic units adjacent to each other through the data input lines and the data output lines are connected.

12. The semiconductor device according to item 11, further including: a holding unit that holds truth table data read from the memory cell unit and outputs the held truth table data to the reconfigurable logic multiplexer.

13. The semiconductor device according to item 11 or 12, wherein the reconfigurable logic multiplexer selects and outputs any of the truth table data held in the holding unit by data input from the data input lines.

14. A method of controlling a reconfigurable semiconductor device, wherein the reconfigurable semiconductor device includes a plurality of logic units connected to each other by address lines or data lines, wherein each of the logic units includes:

a plurality of address lines;

a plurality of data lines;

a first address decoder;

a second address decoder;

a first memory cell unit having a plurality of memory cells; and a second memory cell unit having a plurality of memory cells, and wherein the method includes:

decoding by the first address decoder an address inputted from some of the plurality of address lines;

decoding by the second address decoder an address inputted from the other of the plurality of address lines;

selecting a predetermined number of memory cells in the first memory cell unit in accordance with the address decoded by the first address decoder; and selecting a predetermined number of memory cells in the second memory cell unit in accordance with the address decoded by the second address decoder.

15. The method of controlling a reconfigurable semiconductor device according to item 14, wherein the first and second memory cell units are multiple lookup tables.

16. The method of controlling a reconfigurable semiconductor device according to item 14, wherein the logic units are rectangular, and are each connected on one side to other logic units through the plurality of address lines or the plurality of data lines, the logic units being connected to the other logic units through the plurality of address lines or the plurality of data lines from another side opposite to the one side.

17. The method of controlling a reconfigurable semiconductor device according to item 16,
wherein the plurality of address lines are divided into a first plurality of address lines and a second plurality of address lines,
wherein in the first memory cell unit, the predetermined number of memory cells are selected by the decoded address provided by the first plurality of address lines from the one side, the predetermined number of memory cells respectively outputting data stored therein to a first plurality of data lines, respectively, the predetermined number being twice as many as the number of the first plurality of address lines,
wherein in the second memory cell unit, the predetermined number of memory cells are selected by the decoded address provided by the second plurality of address lines from the another side, the predetermined number of memory cells respectively outputting data stored therein to a second plurality of data lines, respectively, the predetermined number being twice as many as the number of the second plurality of address lines, and
wherein in each of the logic units, some of the first plurality of data lines and some of the second plurality of data lines are outputted to the one side, and the other of the first plurality of data lines and the other of the second plurality of data lines are outputted to the another side.

18. The method of controlling a reconfigurable semiconductor device according to item 17,
wherein the first memory cell unit stores first truth table data for outputting data to the one side and second truth table data for outputting data to the another side in response to address input from the one side,
wherein the second memory cell unit stores third truth table data for outputting data to the one side and fourth truth table data for outputting data to the another side in response to address input from the another side, and
wherein a direction of output of the data is changed according to the first to fourth truth table data.

19. The method of controlling a reconfigurable semiconductor device according to item 16,
wherein the plurality of address lines are divided into a first plurality of address lines and a second plurality of address lines,
wherein in the first memory cell unit, the predetermined number of memory cells are selected by the decoded address provided by the first plurality of address lines from the one side, the predetermined number of memory cells respectively outputting data stored therein to a first plurality of data lines, respectively, the predetermined number being twice as many as the number of the first plurality of address lines,
wherein in the second memory cell unit, the predetermined number of memory cells are selected by the decoded address provided by the second plurality of address lines from the another side, the predetermined number of memory cells respectively outputting data stored therein to a second plurality of data lines, respectively, the predetermined number being the same as the number of the second plurality of address lines, and
wherein in each of the logic units, the second plurality of data lines and some of the first plurality of data lines are outputted to the one side, and the other of the first plurality of data lines are outputted to the another side.

20. The method of controlling a reconfigurable semiconductor device according to item 14,
wherein each of the first and second memory cell units is configured to do either or both of the following:
operate as a logic circuit by storing truth table data for outputting to the data lines logic calculations of values stored in memory cells identified by certain the address lines; and
operate as a connecting circuit by storing truth table data for outputting to the data lines, connected to address lines of other logic units, values stored in memory cells identified by certain the address lines.

21. The method of controlling a reconfigurable semiconductor device according to item 14, wherein the first memory cell unit and the second memory cell unit each store a plurality of truth table data and are connected to a second plurality of address lines outputting data identifying one of the plurality of truth table data.

22. The method of controlling a reconfigurable semiconductor device according to item 14,
wherein the second memory cell unit stores a plurality of truth table data and is connected to a second plurality of address lines outputting data identifying one of the plurality of truth table data, and
wherein some of the data lines of the first memory cell unit are connected to the second plurality of address lines, and the first memory cell unit stores truth table data for identifying the one of the plurality of truth table data in the second memory cell unit and outputs to the second plurality of address lines the data identifying the one of the plurality of truth table data.

23. The method of controlling a reconfigurable semiconductor device according to item 21, wherein the second plurality of address lines are connected to an exterior.

24. The method of controlling a reconfigurable semiconductor device according to any one of items 14 to 23,
wherein the logic unit includes:
data input lines;
data output lines; and
a reconfigurable logic multiplexer,
wherein the logic units adjacent to each other through the data input lines and the data output lines are connected,
wherein the reconfigurable logic multiplexer couples data input from the data input lines with the data output to the data output lines selectively in response to the truth table data, and
wherein the data resulting from logic calculation of the data input is outputted to the data output lines in response to the truth table data.

25. The method of controlling a reconfigurable semiconductor device according to item 24, further including:
a holding unit that holds truth table data read from the memory cell unit and outputs the held truth table data to the reconfigurable logic multiplexer,
wherein the reconfigurable logic multiplexer selects and outputs any of the truth table data held in the holding unit by data input from the data input lines.

26. A non-transitory storage medium that stores instructions executable by a reconfigurable semiconductor device,
wherein the semiconductor device includes a plurality of logic units connected to each other by address lines or data lines, wherein each of the logic units includes:
a plurality of address lines;
a plurality of data lines;
a first address decoder;
a second address decoder;
a first memory cell unit having a plurality of memory cells; and a second memory cell unit having a plurality of memory cells,
wherein the first address decoder decodes an address inputted from some of the plurality of address lines,
wherein the second address decoder decodes an address inputted from the other of the plurality of address lines,
wherein the logic units are rectangular, and are each connected on one side to other logic units through the plurality of address lines or the plurality of data lines, the logic units being connected to other logic units through the plurality of address lines or the plurality of data lines from another side opposite to the one side, and
wherein the instructions cause the reconfigurable semiconductor device to perform one of the following operations in the first or second memory cell unit:
causing the first or second memory cell unit to output a result of logic calculation on values stored in memory cells selected by the address lines connected to the one side, to the data lines connected on the another side opposite to the one side so that the first or second memory cell unit operates as a logic circuit; and
causing the first or second memory cell unit to output values stored in memory cells selected by the address lines connected to the one side, to the data lines connected on the another side opposite to the one side so that the first or second memory cell unit operates as a connecting circuit.

27. The non-transitory storage medium according to item 26, wherein the first and second memory cell units are multiple lookup tables.

28. The non-transitory storage medium according to item 26,
wherein the plurality of address lines are divided into a first plurality of address lines and a second plurality of address lines,
wherein in the first memory cell unit, the predetermined number of memory cells are selected by the decoded address provided by the first plurality of address lines from the one side, the predetermined number of memory cells respectively outputting data stored therein to a first plurality of data lines, respectively, the predetermined number being twice as many as the number of the first plurality of address lines,
wherein in the second memory cell unit, the predetermined number of memory cells are selected by the decoded address provided by the second plurality of address lines from the another side, the predetermined number of memory cells respectively outputting data stored therein to a second plurality of data lines, respectively, the predetermined number being twice as many as the number of the second plurality of address lines, and
wherein in each of the logic units, some of the first plurality of data lines and some of the second plurality of data lines are outputted to the one side, and the other of the first plurality of data lines and the other of the second plurality of data lines are outputted to the another side.

29. The non-transitory storage medium according to item 26,
wherein the first memory cell unit stores first truth table data for outputting data to the one side and second truth table data for outputting data to the another side in response to address input from the one side,
wherein the second memory cell unit stores third truth table data for outputting data to the one side and fourth truth table data for outputting data to the another side in response to address input from the another side, and
wherein, in the first or second memory cell unit, a process to change a direction of output of the data according to the first to fourth truth table data is executed.

30. The non-transitory storage medium according to item 26,
wherein the first memory cell unit has a plurality of memory cells identified by a first plurality of address lines from the one side, the plurality of memory cells outputting to a first plurality of data lines numbering twice as many as the first plurality of address lines,
wherein the second memory cell unit has a plurality of memory cells identified by a second plurality of address lines from the another side, the plurality of memory cells outputting to a second plurality of data lines of which there are the same number as the second plurality of address lines, and
wherein, in the first or second memory cell unit, in each of the logic units, the second plurality of data lines and some of the first plurality of data lines are outputted to the one side, and the other of the first plurality of data lines are outputted to the another side.

31. The non-transitory storage medium according to item 26,
wherein the second memory cell unit stores a plurality of truth table data and is connected to a second plurality of address lines outputting data identifying one of the plurality of truth table data, and
wherein some of the data lines of the first memory cell unit are connected to the second plurality of address lines, and the first memory cell unit stores truth table data for identifying the one of the plurality of truth table data in the second memory cell unit and outputs to the second plurality of address lines the data identifying the one of the plurality of truth table data.

32. The non-transitory storage medium according item 26,
wherein each of the logic unit includes:
data input lines;
data output lines; and
a reconfigurable logic multiplexer,
wherein the memory cell units the logic units adjacent to each other through the data input lines and the data output lines are connected,
wherein the reconfigurable logic multiplexer couples data input from the data input lines with the data output to the data output lines selectively in response to the truth table data, and
wherein a process is executed to output the data resulting from logic calculation of the data input to the data output lines in response to the truth table data.

33. A storage medium, storing the program according to any one of items 26 to 32.

Effects of the Invention

The semiconductor device of the present embodiment can reduce the required number of memory cells by transmitting data of a plurality of bits of data to adjacent logic units, and by reducing the number of input addresses to the memory cell unit included in the logic unit. In addition, it is possible to provide a reconfigurable semiconductor device able to control redundant addresses using high capacity memory by page switching control.

BRIEF DESCRIPTION OF THE DRAWINGS

FIG. 25 shows an example of an array of four-direction MLUTs.

FIG. 37 shows an example of a connective element realized by an MLUT having four AD pairs.

FIG. 38 shows an example of one MLUT operating as a logic element and a connective element.

FIG. 39 shows a truth table of the logic element and the connective element shown in FIG. 38.

FIG. 42A shows an example of configuration data stored in the left memory cell unit of an MLUT 30A.

FIG. 42B shows an example of configuration data stored in the right memory cell unit of the MLUT 30A.

FIG. 42C shows an example of configuration data stored in the left memory cell unit of an MLUT 30B.

FIG. 42D shows an example of configuration data stored in the right memory cell unit of the MLUT 30B.

FIG. 42E shows an example of configuration data stored in the left memory cell unit of an MLUT 30C.

FIG. 42F shows an example of configuration data stored in the right memory cell unit of the MLUT 30C.

FIG. 42G shows an example of configuration data stored in the left memory cell unit of an MLUT 30D.

FIG. 42H shows an example of configuration data stored in the right memory cell unit of the MLUT 30D.

FIG. 42I shows an example of configuration data stored in the left memory cell unit of an MLUT 30E.

FIG. 42J shows an example of configuration data stored in the right memory cell unit of the MLUT 30E.

DETAILED DESCRIPTION OF EMBODIMENTS

Unlike multi-directional type MLUTs, bidirectional type MLUTs are limited to two sides where input/output is performed, and a plurality of bits are inputted to/outputted from adjacent MLUTs, and thus, it is possible to reduce the number of MLUTs used by bit slicing.

MLUTs are constituted of memory cell units, and require the same number of data lines as address lines, and thus, the memory cell units require a number of memory cells equal to the number of address lines squared, multiplied by the number of data lines. Therefore, by reducing the number of address lines, it is possible to dramatically decrease the number of memory cells. The MLUT (multiple lookup table) of the present embodiment has a memory cell unit configuration differing from conventional MLUTs.

An object of the semiconductor device of the present embodiment is to reduce the required number of memory cells by performing data processing of a plurality of bits of data on adjacent logic units, and by reducing the number of input addresses to the memory cell unit included in the logic unit.

Below, (1) an MRLD, (2) a multi-directional type MLUT, (3) a bidirectional type MLUT, (4) a two-memory cell unit type MLUT, (5) a comparison example with an FPGA, (6) a usage example of a high capacity memory, (7) an MLUT using a multiplexer, (8) a logic or connecting operation of an MPLD, and (9) a method of generating truth table data will be described in that order with reference to drawings.

(1) MRLD

Figure 1:
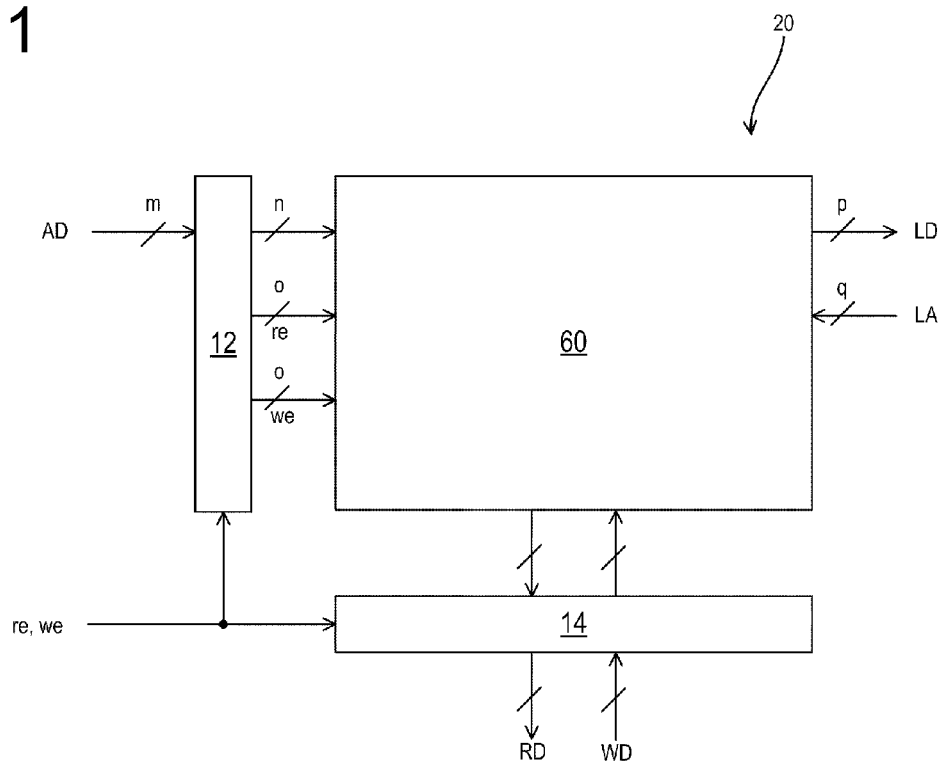
FIG. 1 shows an example of an overall configuration of a semiconductor device of the present embodiment.

FIG. 1 shows an example of an overall configuration of a semiconductor device of the present embodiment. Below, the reconfigurable semiconductor device will be referred to as an MRLD (memory-based reconfigurable logic device; registered trademark). MRLDs have almost the same function as FPGAs, but the structures thereof differ from each other. FPGAs are constituted of LUTs, switch blocks, connection blocks, and the like, and the ratio of logic resources and wiring resources is fixed. By contrast, MRLDs have a configuration in which the logic elements and the wiring elements known as MLUTs are both arranged as usable elements. By this configuration, it is possible to increase the proportion of the total area taken up by the logic region.

MRLDs, like "MPLDS (registered trademark)," have MLUTs directly connected to each other without a wiring element therebetween, but differ from MPLDs in that MRLDs can make effective use of the function of synchronous SRAMs supplied as the memory IP.

In FIG. 1, "20" indicates the MRLD, which is the reconfigurable semiconductor device. The MRLD 20 has an MLUT array 60 in which a plurality of MLUTs are arranged in an array as the logic units, a decoder 12 that determines a memory read or write operation of the MLUTs, and an input/output unit 14.

The MLUT 30 is constituted of memory. The memory elements of memories respectively have data designated as a truth table stored therein, and thus, the MLUT 30 performs a logic operation using a logic element, a connective element, or the logic element and connective element.

The logic operation of the MRLD 20 relies on a logic address LA and logic data LD depicted with solid lines. The logic address LA is used as the input signal of the logic circuit. The logic data LD is used as the output signal of the logic circuit. The logic address LA of the MLUT 30 is connected to the data line of the logic operation data LD of the adjacent MLUT.

The logic realized by the logic operation of the MRLD 20 is realized by truth table data stored in the MLUT 30. A certain number of MLUTs 30 operate as logic elements as combined circuits including AND circuits, adders, and the like. Other MLUTs operate as connective elements connecting the MLUTs 30 that are combined circuits. The rewriting of the truth table data for the MLUTs 30 to be logic elements and connective elements is performed by writing data to the memory.

The writing operation of the MRLD 20 is performed by the writing address AD and the writing data WD, and the reading operation is performed by the writing address AD and the reading data RD.

The writing address AD is an address to identify a memory cell in the MLUT 30. The writing address AD identifies an nth memory cell using an m number of signal lines, n being equal to $2^m$. The writing address AD is used both for reading from and writing to memory, and the writing address AD is decoded by the decoder 12 through the m number of signal lines to select the target memory cell. In the present embodiment, decoding of the logic operation address LA, which will be described later, is performed by a decoder in the MLUT 30.

The decoder 12 decodes the writing address AD in accordance with control signals such as a read enable signal re and a write enable signal we, and the decoded address n is outputted to the MLUT 30. The decoded address n is used as an address to identify the memory cell in the MLUT 30.

The input/output unit 14 writes writing data WD according to the write enable signal we and outputs reading data RD according to the read enable signal re.

Figure 2:
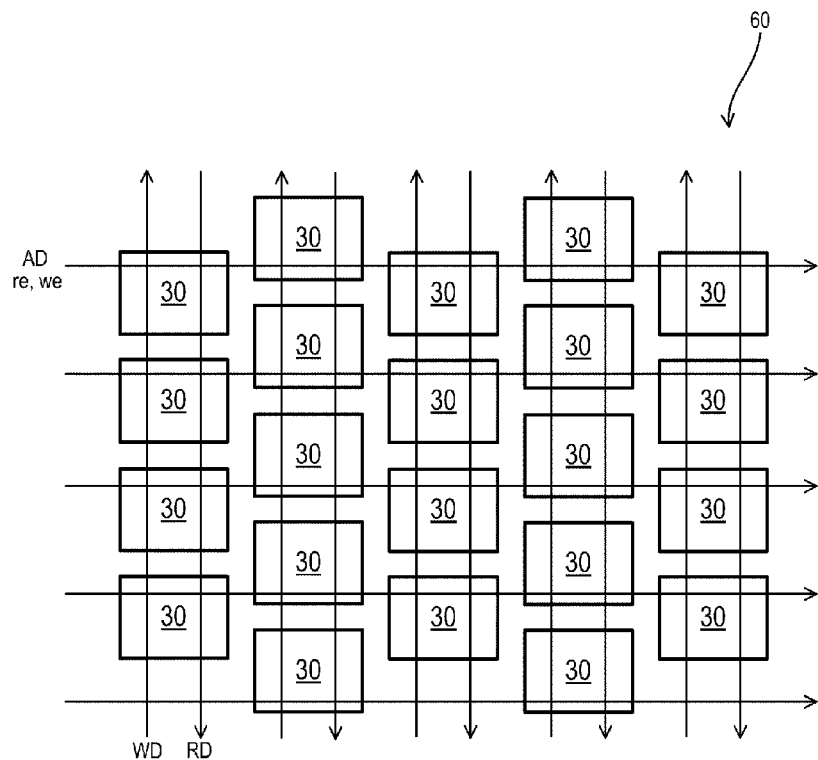
FIG. 2 shows an example of an MLUT array.

FIG. 2 shows an example of an MLUT array. In FIG. 2 the connection by the address lines and the data lines connecting the MLUTs 30 are not shown in detail; the address lines and the data lines will be described using FIG. 3 and the like below. As shown, the MLUT array 60 has MLUTs 30 arranged in an array. Each MLUT is connected to respective signal lines for the writing address AD, the write enable signal we, the read enable signal re, the writing data WD, and the reading data RD.

(2) Multi-Directional Type MLUT

Figure 3:
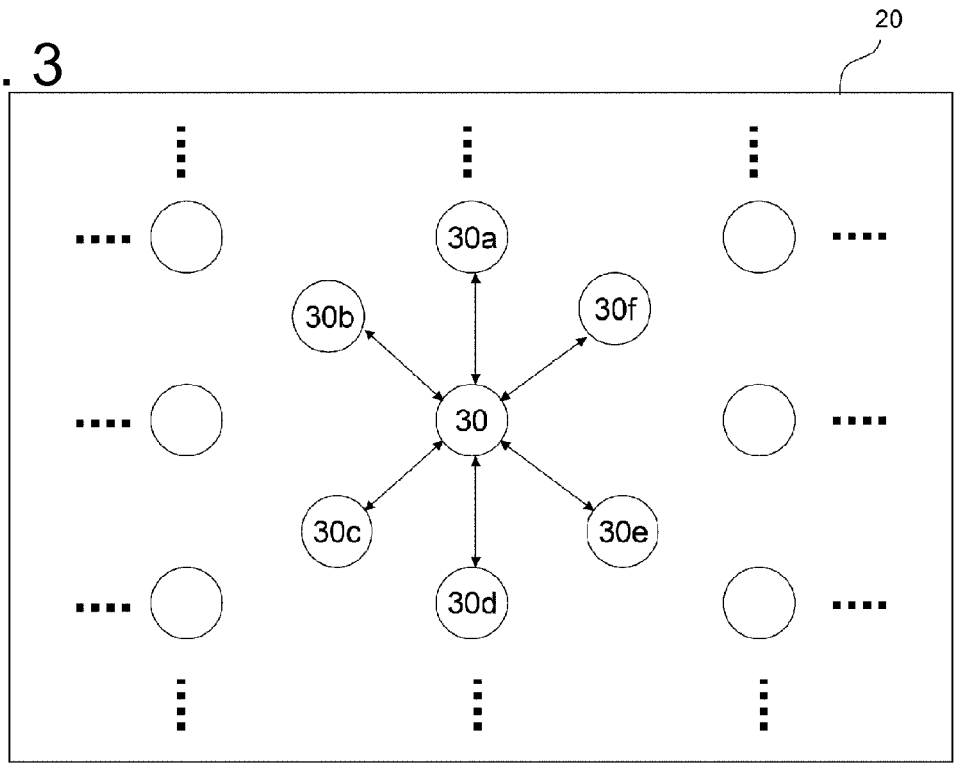
FIG. 3 shows a configuration example of MLUTs being connected to each other by one address line or data line.

FIG. 3 shows a configuration example of MLUTs being connected to each other by one address line or data line. The MRLD 20 shown in FIG. 3 shows MLUTs 30a to 30f configured such that the connection between adjacent MLUTs is achieved by one address or data line.

As described above, an AD pair is defined as a set including an address line and a data line. In the drawings below, FIG. 3, for example, when a double-headed arrow is shown, this represents an AD pair, and when a single-headed arrow is shown as in FIG. 12 to be described later, this indicates either the address line or the data line.

Figure 4:
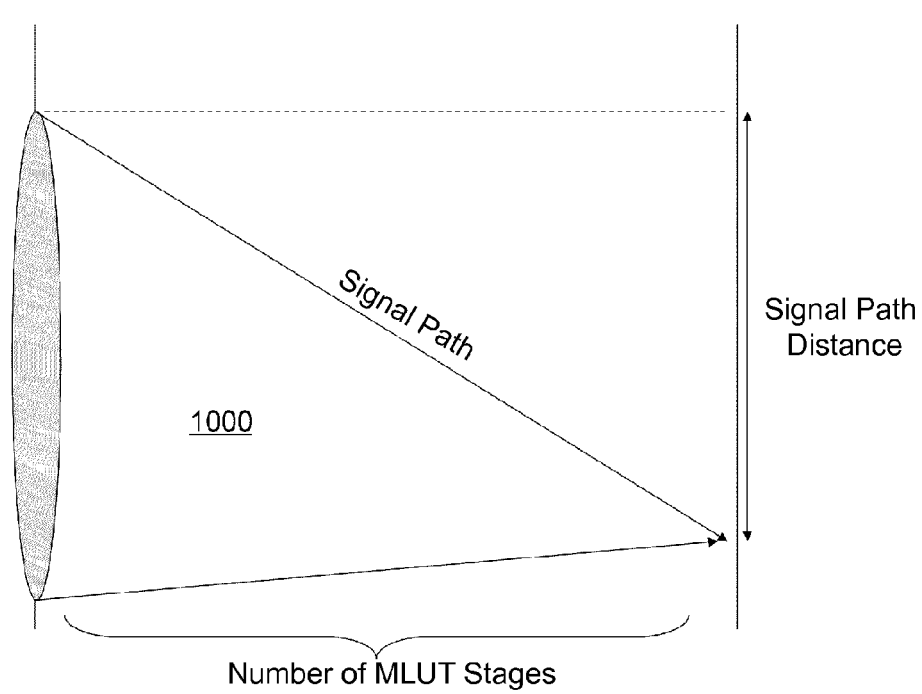
FIG. 4 is an example of a logic cone.

FIG. 4 is an example of a logic cone. Using this logic cone, a case in which usage of a multi-directional type MLUT would be difficult will be described. The logic cone indicates a group (group of circuits) defined by all input and logic circuit elements affecting the output of one combination logic circuit. The logic cone shown in FIG. 4 has a plurality of flip-flops (FF) operating under one clock signal, although this is not shown, and a combination logic circuit connects the output of an FF to the D-input of an FF. When performing synthesis using the C programming language, variables are expressed by flip-flops and placed in the input/output ends, and the circuit data is generated between FFs. If a certain clock signal in an input terminal array 1010 enters the FF, then the values of all FFs are updated, and if the FF values are updated, then all combination circuits operate, and the range of effect spreads to the lower stage circuits until the next clock signal arrives, thereby determining the input of an FF at the output terminal array 1020. In this manner, a logic cone 1000, which is a group defined by all input and logic circuit elements affecting one FF output, is formed. The MLUT stage number shown in FIG. 4 will be described later using FIG. 7.

(2.1) Problem of Multi-Directional MLUTs; Increasing Number of MLUTs Used for Connection In multi-directional MLUTs, if one MLUT can constitute a desired logic cone, then the number of MLUTs used as connective elements decreases, which results in a decrease in the number of MLUTs used. However, if the logic cone crosses a plurality of MLUTs, the data transmission bandwidth between MLUTs is 1 bit, and thus, data goes in different directions at the connections between MLUTs, and the memory regions used as the connective elements increase. Thus, in order to configure a desired logic cone, there is a need for a plurality of MLUTs, and a case in which each MLUT is configured by clustering logic circuits is referred to as "MLUT clustering." In addition, high level programming languages such as C involve a plurality of bits. If functions coded in a programming language such as C are realized by a multi-directional-type MLUT, then the plurality of bits are calculated by bit slicing, and a data flow such as synthesizing data that has been calculated occurs, and thus, the number of MLUTs used as the connective element increases, and the number of MLUTs used increases.

If the number of data lines and address lines connected to the MLUTs is increased and the memory cell unit increases in size as a result, then data transmission between MLUTs does not occur, and the number of MLUTs used as connective elements is reduced. However, if the number of data lines and address lines is increased in this manner, then the number of adjacently connected MLUTs also increases, and the number of input/output units in each MLUT increases in various directions, which complicates the structure.

(2.2) Problem of Multi-Directional-Type MLUTs; Increasing MLUTs in Use

Figure 5:
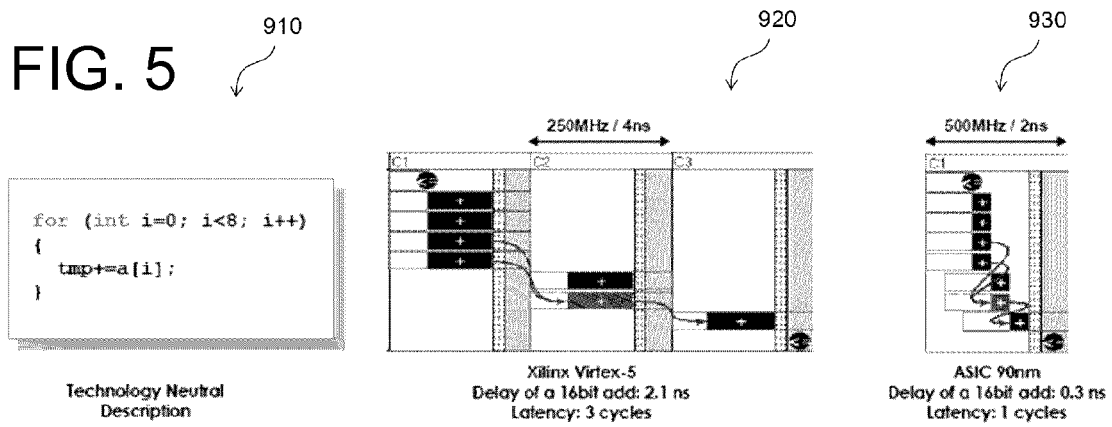
FIG. 5 shows an example of logic synthesis written in C in an FPGA.

A high level synthesis method to construct functions in C is disclosed as a method of logic synthesis of an FPGA, and has been put into practical use. FIG. 5 shows an example of logic synthesis written in C in an FPGA. 910 is an example of code written in C. 920 is an example of high level synthesis in C in an FPGA. 930 is an example of high level synthesis in C in an ASIC. In the high level synthesis 920 written in C, with the variables in C as registers, computation therebetween is expressed in combinational circuits to construct functions. This is an example pertaining to FPGAs, and logic is broken up according to FPGA logic expressions and run. The high level synthesis 930 written in C is an example pertaining to ASICs instead of FPGAs; because logic expressions are freely made in ASICs, they can be processed all at once, and variable data is processed by registers. In this manner, the C language process is generally done by processing a data array, adding it to the register, and moving on to the next process (data path process).

As shown in FIG. 5, the data flow in C is written and controlled to construct operations, which results in a unidirectional flow. Thus, the data bits form data arrays of 8 bits, 16 bits, or the like. The data array length can be selected by C synthesis tools, but data arrays are generally written to be at least 3 bits.

(3) Bidirectional-Type MLUT

Figure 6:
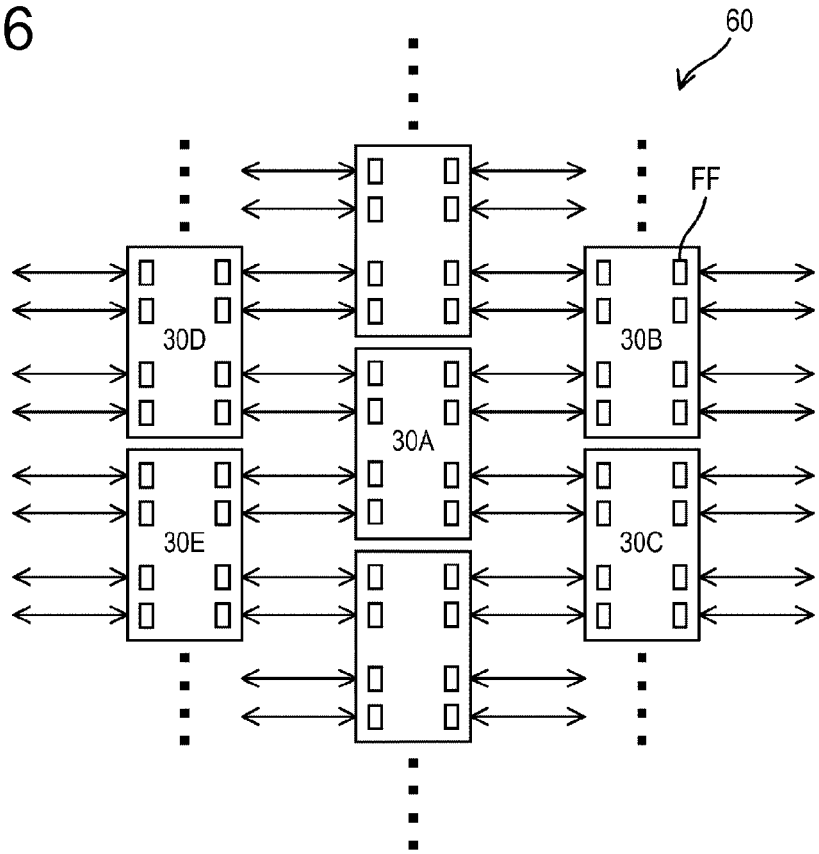
FIG. 6 shows a configuration example of MLUTs being connected to each other by a plurality of address lines or data lines.

FIG. 6 shows a configuration example of MLUTs being connected to each other by a plurality of address lines or data lines. The MLUTs 30A to 30E shown in FIG. 6 have FFs on the data output ends, and the configuration of these FFs is described later with reference to FIG. 15A. The MLUT 30A is connected to other adjacent MLUTs 30B to 30E through two address lines or data lines; in other words, the connection among MLUTs is done through a plurality of address lines or data lines. In such a configuration, adjacent MLUTs are connected by a plurality of AD pairs, and thus, data transmitted to adjacent MLUTs is a plurality of bits (4 bits in the example of FIG. 6). In addition, the address lines and data lines are limited to bidirectional connection (left and right in FIG. 6) instead of multi-directional connection. Furthermore, while the directions are limited in number to two, the number of adjacent MLUTs is not limited to two, and is greater than two; in order to increase the number of configuration possibilities, two MLUTs can connect to each input and output side (this may be referred to as "interleaved arrangement"). For example, the MLUT 30A is connected to the MLUTs 30B and 30C on the right side and to the MLUTs 30D and 30E on the left side. Such MLUTs are known as "bidirectional-type MLUTs."

The MLUT of the present embodiment is rectangular, and is connected on one side to other logic units through a plurality of address lines or a plurality of data lines, the MLUT being connected to other MLUTs through the plurality of address lines or the plurality of data lines from another side opposite to the one side.

Unlike the multi-directional-type MLUT, the bidirectional-type MLUT can process multi-bit data by having a plurality of data lines and address lines, and the input and output direction data flow can be limited, and thus, logic libraries can be made with ease.

In other words, because a multi-bit data process can be performed on adjacent MLUTs, it is possible to reduce the number of MLUTs used in a data process configured by a program performing multi-bit computation (written in C, for example).

(3.1) Number of Logical Stages Necessary for Bidirectional-Type MLUT

Figure 7:
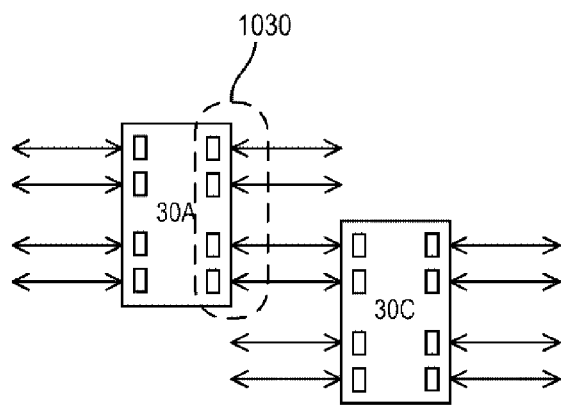
FIG. 7 is a drawing for describing an n-value.

Below, the method of determining how many bidirectional-type MLUTs are necessary for a logic cone will be described using the definition of an n-value. FIG. 7 is a drawing for describing the n-value, and describes the n-value using the MLUTs 30A and 30C depicted in FIG. 6. The "n-value" is defined as the number 1030 of address lines or data lines extending from each side of the MLUTs 30A and 30C facing each other. In the multi-directional-type MLUT of FIG. 3, there are as many sides as there are of adjacent MLUTs, and thus, the number of address lines or data lines extending from each side is "1," which means that the n-value is "1." The 4-bit long-type MLUT shown in FIGS. 6 and 7 is rectangular, but requires a plurality of bits to be transmitted, and thus, the number of address lines or data lines extending from each side is "4," and therefore, the n-value is "4." In bidirectional-type MLUTs, as a result of the relation with adjacent MLUTs, the data transmission amount is half of the n-value, and the signal path is offset by one stage, and therefore, in order to attain the longest signal path, a number of steps equal to the signal path distance divided by (n-value/2) is required. The number of logical stages of MLUTs indicates the number of stages of MLUTs that need to be arranged horizontally in order to realize a desired circuit. The number of logical stages of MLUTs is represented in the following formula.

number of logical stages of MLUT=$m/(n\text{-value}/2)$.     Formula 1:

Here, m is the signal path distance, and indicates an input signal line to be the logic cone.

In the example shown in FIG. 7, the n-value is "4," but there are two adjacent MLUTs in each direction, and thus, the (n-value/4) is equal to "2." The logical computation in the C language is performed in 8 bits, and if there are eight logic cone input data lines, then the number of MLUT logical stages is four. In other words, if 8-bit computation is performed by MLUTs, four MLUTs are required.

(3.2) Example of Bidirectional-Type MLUT Slicing

Figure 8:
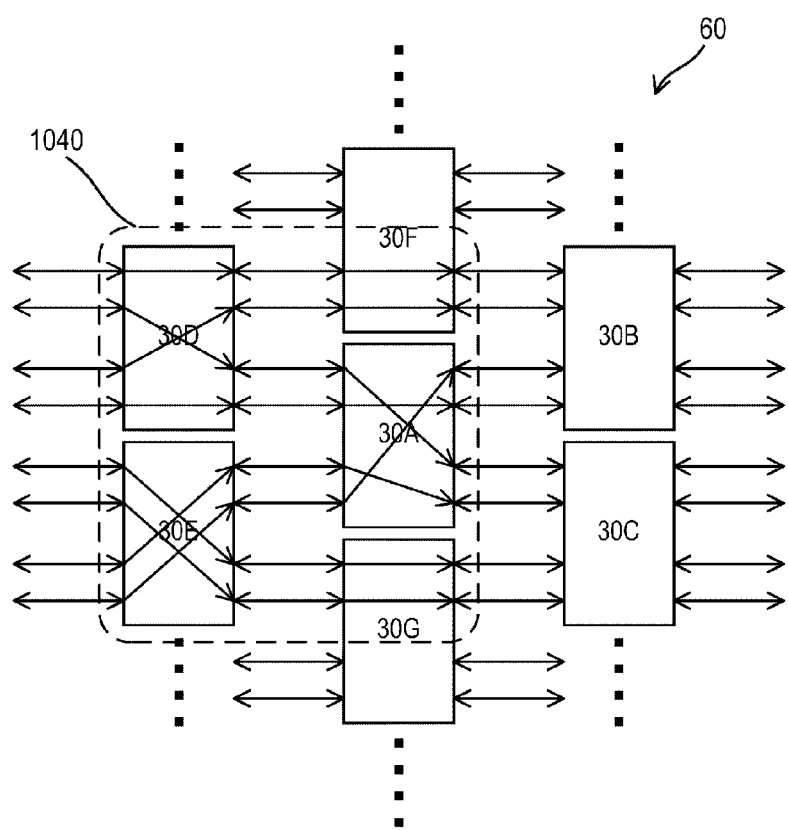
FIG. 8 shows an example of slicing bidirectional type MLUTs.
Figure 9:
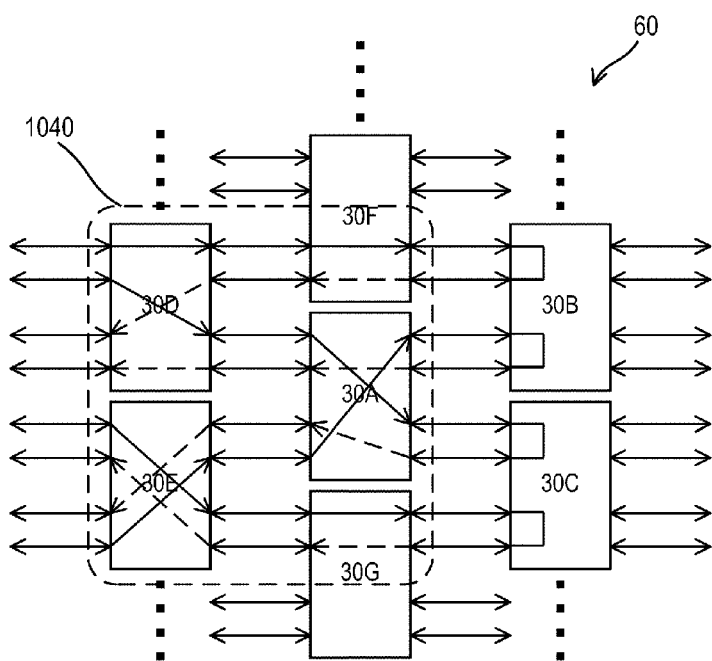
FIG. 9 shows an example of slicing bidirectional type MLUTs.
Figure 10:
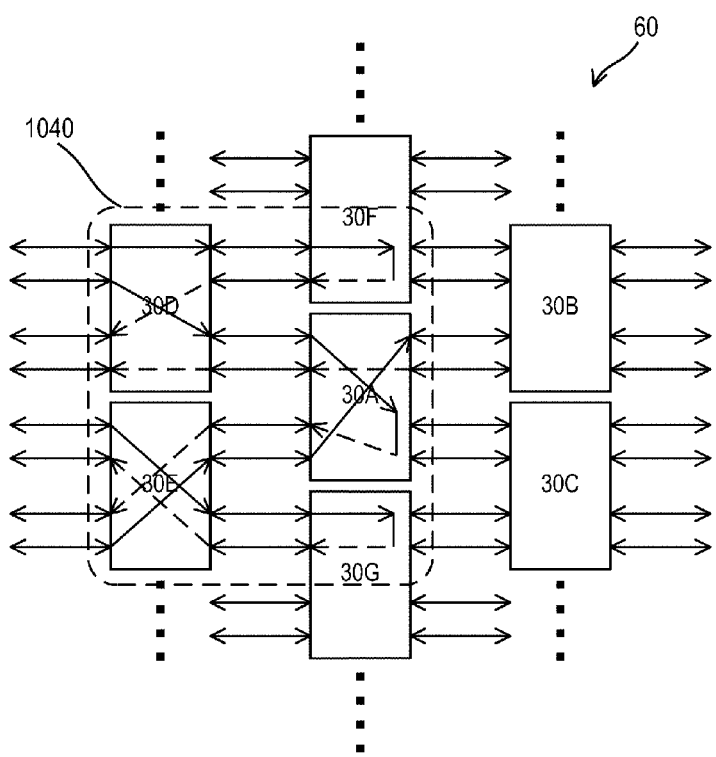
FIG. 10 shows an example of slicing bidirectional type MLUTs.

FIGS. 8 to 10 show examples of MLUT slicing. FIG. 8 is a drawing of MLUTs having data connections to the right. In FIG. 8, 1040 shows the number of logical stages in the MLUTs necessary for 8-bit input. In FIG. 8, five MLUTs are needed. As shown in FIG. 8, MLUT slicing can be performed by dividing a combinational circuit constituting a logic cone by the number of logical stages in the MLUT. Logical computation can be performed on the combinational circuit that has undergone MLUT slicing for all input combinations (equal to $2^n$ if the n-value is used), and the truth table data of this logical computation can be determined.

FIGS. 9 and 10 show a connection allowing data to return by bidirectional-type MLUTs. The MLUTs are connected bidirectionally, and thus, by using a plurality of MLUTs, data connection allowing data to return from the right to the left can be used. The examples shown with the dotted lines indicate a connection for allowing data to return. Although the right direction flow is not shown, there is a data flow towards the left as a result of data returning, while maintaining the right direction flow indicated with the reference character 1040 in FIG. 8. FIG. 9 shows an example in which the MLUTs 30B and 30C have a connection allowing the return of data, and FIG. 10 shows an example in which the MLUT 30A performs logical computation and has a connection allowing the return of data.

As shown in FIG. 10, if, in the bidirectional-type MLUT, truth table data returning a signal to an MLUT terminal is written, then the signal can be returned. In addition, in this example, return direction truth table data is separately required in addition to outbound direction truth table data, and thus, one MLUT needs to store the return direction truth table data in addition to the outbound direction truth table data, thereby allowing the number of MLUTs to be reduced. Conventionally, as shown in FIGS. 9 and 10, bidirectional-type MLUTs had a configuration allowing return processing. However, the MLUT of the present embodiment is configured such that one MLUT stores two pieces of truth table data each realizing data flow in one direction, thereby clearly differentiating both pieces of truth table data.

(3.3) Bit Slicing in Bidirectional-Type MLUT

A wiring arrangement method by which the C programming language allows the truth table data to be directly determined will be described. The int computation in C is 16 bits, for example. Thus, a 16 bit register is generated, and the bit value stored in the register is computed, thereby realizing the combinational circuit. If there is an MLUT that has a 16-bit n-value, then operations can be performed by storing the result as truth table data, but MLUTs having an n-value of 16 use 16 addresses and require $2^{16}$ memory cells, and thus, if MLUTs are used as the component unit, then this results in a large amount of unused memory regions, making this configuration unrealistic. A solution is to slice bits to convert to the MLUT-based computation method. If there is an MLUT having an n-value of 4, then C language code dividing 16 bits into four parts is written. Doing so in C is common. For example, 32 bit calculation is done using the float variable type, but can be coded as an int.

Figure 11:
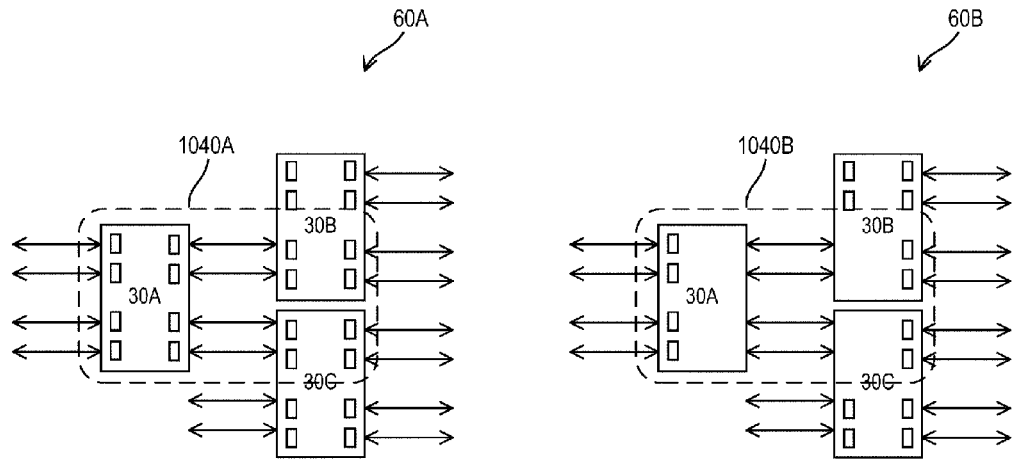
FIG. 11 shows an example of bit slicing of bidirectional type MLUTs.

FIG. 11 shows an example of using an FF in bidirectional type MLUTs. If code to slice the 16 bits into 4-bit pieces is written in C, then MLUT logical stages shown in 1040A and 1040B are determined. 60A is an example in which respective FFs of the MLUTs are used in a logic circuit, and 60B is an example in which FFs are not used in the logic circuit. FFs being present in the respective MLUTs in 60B results in a clock delay, and thus, operation speed can be increased by stopping usage of FFs as shown in 20B in which FFs are not used in intermediate MLUTs.

(4) 2-Memory Cell Unit-Type MLUT

The MLUT described below includes a plurality of address lines, a plurality of data lines, a first address decoder that decodes addresses inputted from some of the plurality of address lines, a second address decoder that decodes addresses inputted from other address lines, a first memory cell unit having memory cells at intersections between a decoding line of the first address decoder and the data line, and a second memory cell unit having memory cells at intersections between a decoding line of the second address decoder and the data lines.

The MLUTs output data from memory cells identified by addresses inputted from the address lines, and this data is truth table data that realizes a desired logic element and/or connective element. The configuration of the MLUT and the truth table data stored therein will be described below, but "data processing" of the logic element and/or connective element by the truth table data can be realized by reading the truth table data by and address decoder, for example, using MLUTs as a hardware resource. A method of controlling a semiconductor device is realized by the hardware constituting the MLUTs such as address decoders, and by reading truth table data.

(4.1) Two Memory Cell Units

Figure 12:
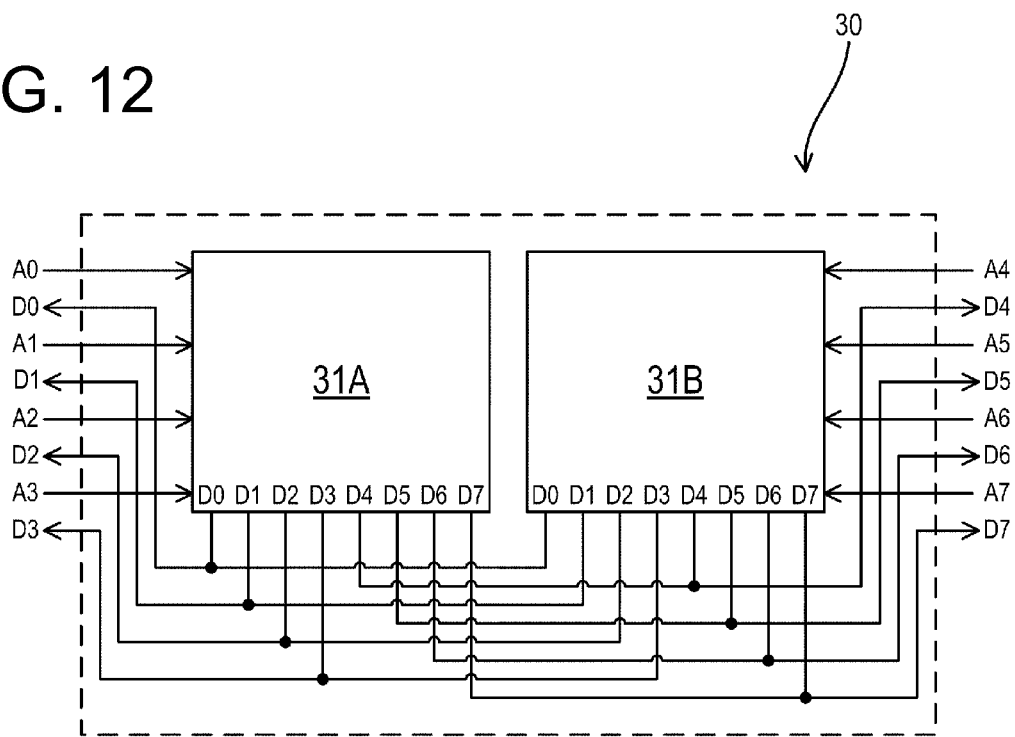
FIG. 12 shows an example of an MLUT of the present embodiment.

FIG. 12 shows an example of an MLUT of the present embodiment. The MLUT 30 shown in FIG. 12 has memory cell units 31A and 31B. The memory cell unit is static random access memory (SRAM), for example. As shown in FIG. 12, the memory cell unit 31A has a plurality of memory cells defined by a first plurality of address lines extending from one side, the plurality of memory cells outputting data to a first plurality of data lines of which there are twice as many as the first plurality of address lines; the memory cell unit 31B has a plurality of memory cells defined by a second plurality of address lines extending from another side, the plurality of memory cells outputting data to a second plurality of data lines of which there are twice as many as the second plurality of address lines; and the MLUT 30 has some of the first plurality of data lines and the second plurality of data lines to one side, and some other of the first plurality of data lines and the second plurality of data lines to another side.

As described with reference to FIG. 10, each memory cell unit has truth table data stored in memory cells for each direction. Thus, each of the memory cell units 31A and 31B stores truth table data for the right to left direction and truth table data for the left to right direction. In other words, the MLUTs each store four pieces of truth table data defining the data output direction identified by the truth table data.

By increasing the number of pieces of data in each memory cell unit to greater than the number of addresses and by allowing data to be outputted in two directions from each memory cell unit, the number of memory cells needed can be reduced, and it is possible to enable data output in two directions. FIG. 12 is a schematic drawing, and the decoders and the like, which are circuits peripheral to the memory cell unit, are not shown, but will be described with reference to FIG. 15A.

Each of the memory cell units 31A and 31B stores truth table data in order to output to the data line logic calculations stored in a memory cell identified by a certain address line and operates as a logic circuit, and/or stores truth table data in order to output to the data line connected to the address line of another MLUT a value stored in a memory cell identified by a certain address line and operates as a connecting circuit. The MLUT realizing a desired function using truth table data will be described in the section (8) Logic or Connecting Operation of MRLDs.

Conventionally, one memory cell unit constituted an MLUT and the memory cell unit used as the MLUT had an equal width for the address line and the data line. Thus, the memory cell unit having eight address lines shown in FIG. 12 has $2^8$ (256) decoded address lines and eight bit lines, and thus, requires 2,046 (256×8) memory cells. The MLUT in FIG. 12 has undergone memory slicing, and thus, only 16 decoded address lines are required. Thus, the number of memory cells in use can be cut down to 256 (16×8×2).

In other words, by reducing the number of input address lines to the memory cell units included in the MLUT, the number of memory cells needed can be greatly reduced. A portion of the logic calculation that could be done in the conventional configuration cannot be done with this configuration, but this will be described later with reference to FIG. 13.

As shown in FIG. 12, the AD pairs have inputs and outputs left and right, and thus, the memory cell units 31 transmit the output data D0 to D7 for the inputted address signals A0 to A3 to the output ends D0 to D3 for the input address side and to the output ends D4 to D7 for other memory cell units. The connective configuration for causing the outputted signal to return to the signal input direction will be referred to below as "feedback." The memory cells for the output ends D0 to D3 of the memory cell unit 31A are limited to the feedback direction truth table data, and the memory cells for the output data D4 to D7 are limited to the right to left direction truth table data. The memory cell units 31B similarly transmit the output data D0 to D7 for the inputted address signals A0 to A3 to the output ends D0 to D3 for the input address side and to the output ends D4 to D7 for other memory cell units.

The connecting portions for the output signals of both memory cell units constitute a wired-OR, or are connected by an OR circuit, and thus, prescribed data can be transmitted.

In this manner, the MLUT of the present embodiment has two memory cell units internally, and address signals to the MLUT are inputted to the address decoders (to be described later with reference to FIG. 15A) of the two memory cell units according to the input direction of the address signals. One address decoder decodes addresses inputted from some of the plurality of address lines, and the other address decoder decodes addresses inputted from the other of the plurality of address lines, for example, and the decoded signal identifies the memory cell connected to the address decoder.

Next, the relation between the address lines and data lines of the MLUT shown in FIG. 12 will be described. The MLUT 30 is a bidirectional-type MLUT, and thus, as a general rule uses the address lines A0 to A3 for the outward direction (left to right direction) and the address lines A4 to A7 for the return direction (right to left direction). The truth table data used for the outward direction and the truth table data used for the return direction are respectively prepared.

If return direction processing is not to be performed, then the truth table data is set such that D0 to D3 in the memory cell unit 31A and D4 to D7 of the memory cell unit 31B are set at "0." If return direction processing is to be performed, then the truth table data is set such that D4 to D7 in the memory cell unit 31A and D0 to D3 of the memory cell unit 31B are set at "0."

A signal inputted from a certain direction can be returned to the input side or outputted to the output side, but logic calculation cannot be performed on two signals having different input directions. This situation is shown in FIG. 13.

Figure 13:
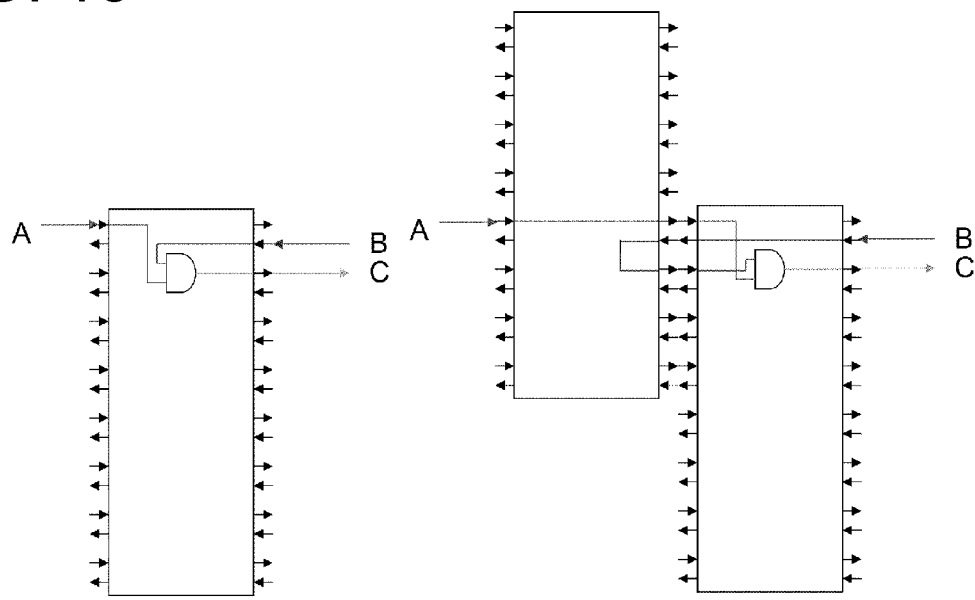
FIG. 13 shows an example of a circuit configuration realized by MLUTs of the present embodiment.

FIG. 13 shows an example of a circuit configuration realized by MLUTs of the present embodiment. The MLUT 30A is constituted of one memory cell unit, and the MLUTs 30B and 30C are each constituted of two memory cell units of the present embodiment. The MLUT 30A performs an AND calculation on the A address signal from the left and the B address signal from the right using an AND circuit, and outputs a C data signal. On the other hand, the MLUTs 30A and 30B cannot perform logic calculation on two signals having different input directions, and thus, it is not possible to configure a connecting circuit outputting a signal towards the signal input direction. As a result, in the present embodiment, a configuration having many MLUTs is adopted, but is not used in C programming language synthesis for data processing, and thus, there is little disadvantage resulting from not being able to perform logic calculation on the return signals. In addition, if necessary, it is possible to configure a main circuit as shown in the drawing, and thus, there are no limits to the circuit configuration.

FIGS. 9 and 10 showed return processing of data. If bit slicing by a plurality of bit processes is performed, then the data process for the sliced bits becomes long. Thus, if a desired calculation is to be performed, then the MRLD becomes horizontally long. By returning outbound data, which is data traveling towards the right, in addition to data flowing outward towards the right to realize return processing, it is possible to execute long data processes. As described above, the MLUT 30 has directionality, but the memory cell unit 31A can act as a return connecting circuit. Thus, by using the MLUT 30 disposed on the edge as the return circuit, logic calculation is possible for the return direction by causing the data to return at the edge after logic calculation on data in the outbound direction.

Figure 14:
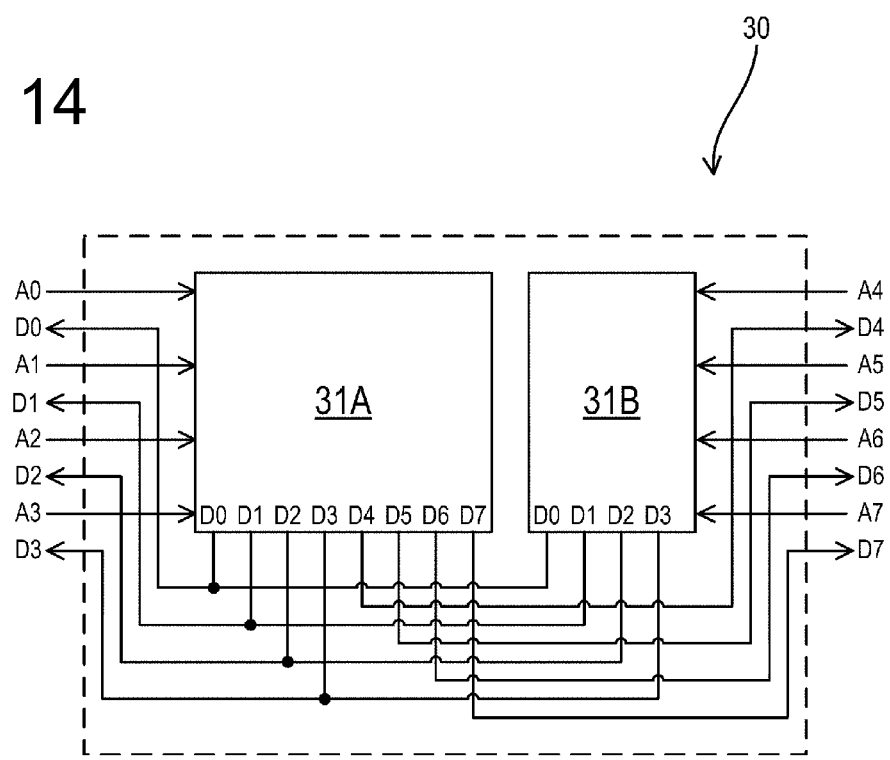
FIG. 14 shows another example of an MLUT of the present embodiment.

FIG. 14 shows another example of an MLUT of the present embodiment. The memory cell unit 31A shown in FIG. 14 has a plurality of memory cells defined by a first plurality of address lines extending from one side, the plurality of memory cells outputting data to a first plurality of data lines of which there are twice as many as the first plurality of address lines; the memory cell unit 31B has a plurality of memory cells defined by a second plurality of address lines extending from another side, the plurality of memory cells outputting data to a third plurality of data lines of which there are the same number as the second plurality of address lines; and the MLUT 30 has some of the first plurality of data lines and the third plurality of data lines to one side, and some other of the first plurality of data lines to another side. By restricting output in the return direction to any of the memory cell units, it is possible to further reduce the number of memory cells needed. As shown in FIG. 12, the memory cell unit 31B disposed to the right has no return output ends D4 to D7, and there are no memory cells for these output ends. On the outbound side, calculation is performed by the memory cell unit 31A, and on the return side, logic calculation is performed with the return operation being restricted, and thus, it is possible to further reduce the number of memory cells needed.

(4.2) Address Decoder for Each Memory Cell Unit

Figure 15A:
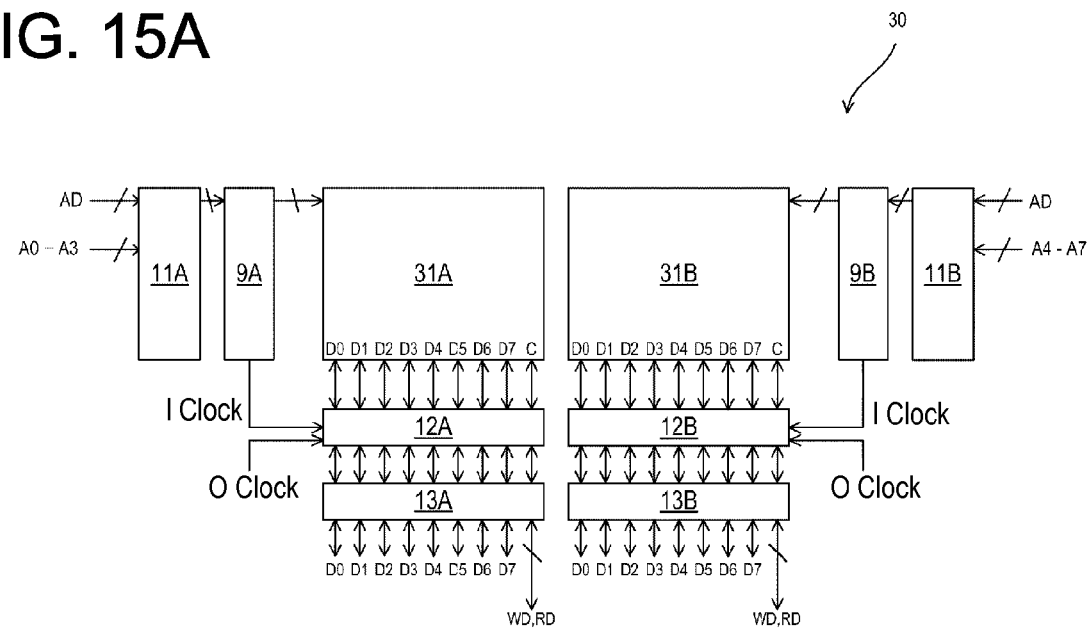
FIG. 15A shows an example of a circuit of an MLUT of the present embodiment.

FIG. 15A shows a circuit example of an MLUT of the present embodiment. The MLUT 30 shown in FIG. 15A has memory cell units 31A and 31B, address decoders 9A and 9B, address selectors 11A and 11B, input/output (I/O) buffers 12A and 12B, and data selectors 13A and 13B. In the MLUT 30, the memory cell units 31A and 31B respectively have address decoders, address selectors, I/O buffers, and data selectors.

The memory cell units 31A and 31B store truth table data for connecting to the left and to the right (return direction). The address decoder 9A decodes addresses A0 to A3 inputted from the left. The address decoder 9B decodes addresses A4 to A7 inputted from the right. In order for this MLUT to have an asynchronous/synchronous SRAM selection circuit, the address decoder is provided with an address transition detector (ATD) circuit and generates an internal clock signal.

The address selectors 11A and 11B select writing addresses AD and logic addresses A0 to A3 and A4 to A7. This example shows a single port memory cell (FIG. 15B) that performs only one of a writing operation and a logic operation. If a dual port memory is to be used, then reading from and writing to a memory cell can be performed simultaneously, which obviates the need for the address selectors 11A and 11B.

The I/O buffers 12A and 12B provide an FF function by reading data from data lines of the memory cell unit in synchronization with either an external clock signal (OClock) or an internal clock (IClock). As for the external clock signal (OClock) and the internal clock signal (IClock), by shortening the period of the internal clock signal, it is possible to speed up operations in synchronization with the internal clock signal, or the like. In order to switch between the external clock signal and the internal clock signal, a one bit array that stores data for controlling the clock signals is provided in the memory cell unit, and with the truth table data, this bit array can be rewritten from an external source. The I/O buffers 12A and 12B include sense amplifiers that amplify the voltages outputted from the bit lines of the memory cells.

The data selectors 13A and 13B are selection circuits that switch output data or writing data during a logic operation.

This structure may be realized by a circuit in which a synchronous SRAM and an asynchronous SRAM are superposed. By this method, a memory IP in a foundry can be used, and thus, it is possible to greatly reduce design costs. However, in such a case, the memory capacity doubles.

The MRLD having the MLUTs performs data processes of a plurality of bits on adjacent MLUTs, and configures a logic unit with a plurality of memory cell units. The number of memory cell units increases in proportion to the square of the number of address lines, and thus, even if the number of data lines is the same, if the number of address lines in each memory cell unit is decreased, then it is possible to reduce the total number of memory cells needed.

Also, a given memory cell unit is connected to a data line outputting data from the first direction to the address input end in the first direction or the second direction opposite to the first direction, and another memory cell unit is connected to a data line outputting data from the second direction to the address input end in the second direction or the first direction; the two memory cell units change the data output direction according to the truth table data. By controlling the data output direction in this manner, it is possible to reduce the number of memory cells needed, although this restricts the reconfigurability of the logic unit.

(4.3 Memory Cell)

Figure 15B:
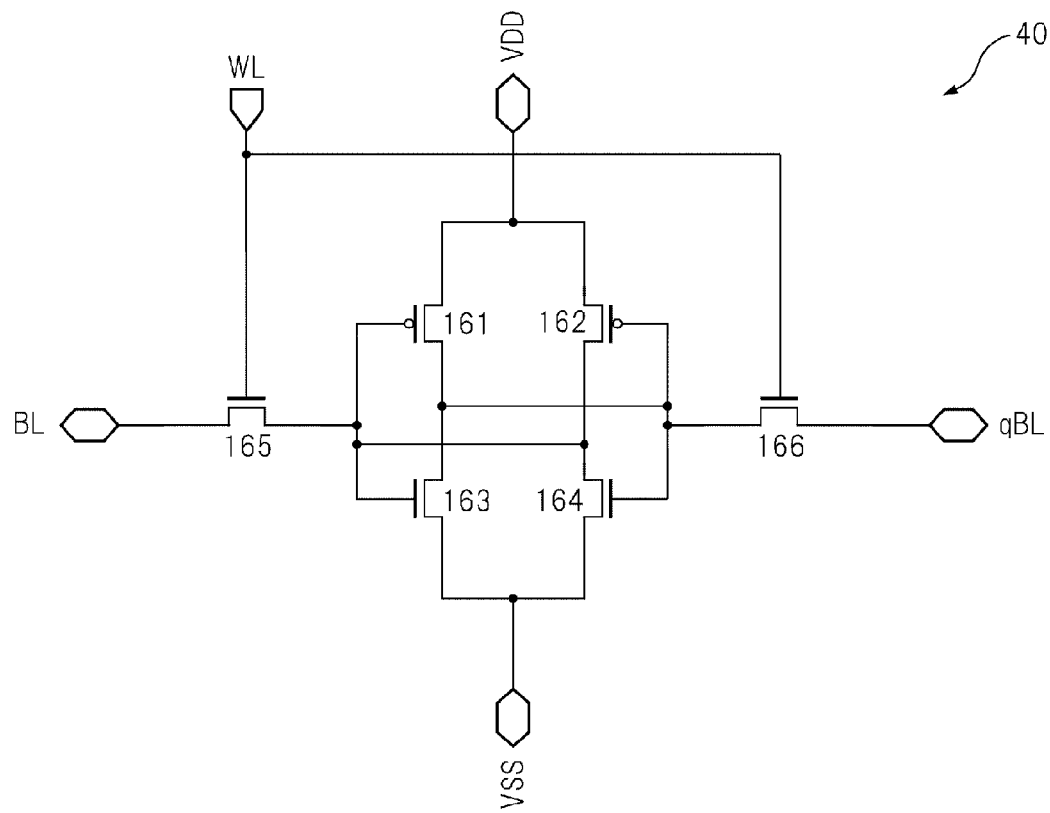
FIG. 15B shows an example of a memory cell.

FIG. 15B shows an example of a single port memory cell. The memory cells (also referred to as a "memory element") are disposed at respective intersections between word lines, which are signal lines for the decoding signals, and bit lines. A memory element 40 shown in FIG. 15B is provided with pMOS (metal oxide semiconductor) transistors 161 and 162, and nMOS transistors 163, 164, 165, and 166. The source of the pMOS transistor 161 and the source of the pMOS transistor 162 are connected to a VDD (power source voltage terminal). The drain of the nMOS transistor 163 and the drain of the nMOS transistor 164 are connected to a VSS (ground voltage terminal).

The drain of the nMOS transistor 165 is connected to a bit line b. The gate of the nMOS transistor 165 is connected to a word line WL. The drain of the nMOS transistor 166 is connected to a bit line /b. The gate of the nMOS transistor 166 is connected to the word line WL.

According to the configuration above, during the writing operation, the memory element 40 stores the signal level transmitted from the bit line b and the bit line /b in the pMOS transistors 161 and 162 and the nMOS transistors 163 and 164 by the signal level "H (high)" in the word line WL. During the reading operation, the memory element 40 transmits the signal level stored in the pMOS transistors 161 and 162 and the nMOS transistors 163 and 164 to the bit line b and the bit line /b by the signal level "H" of the word line WL.

(5) Comparison Example for Comparison with FPGA

Figure 16:
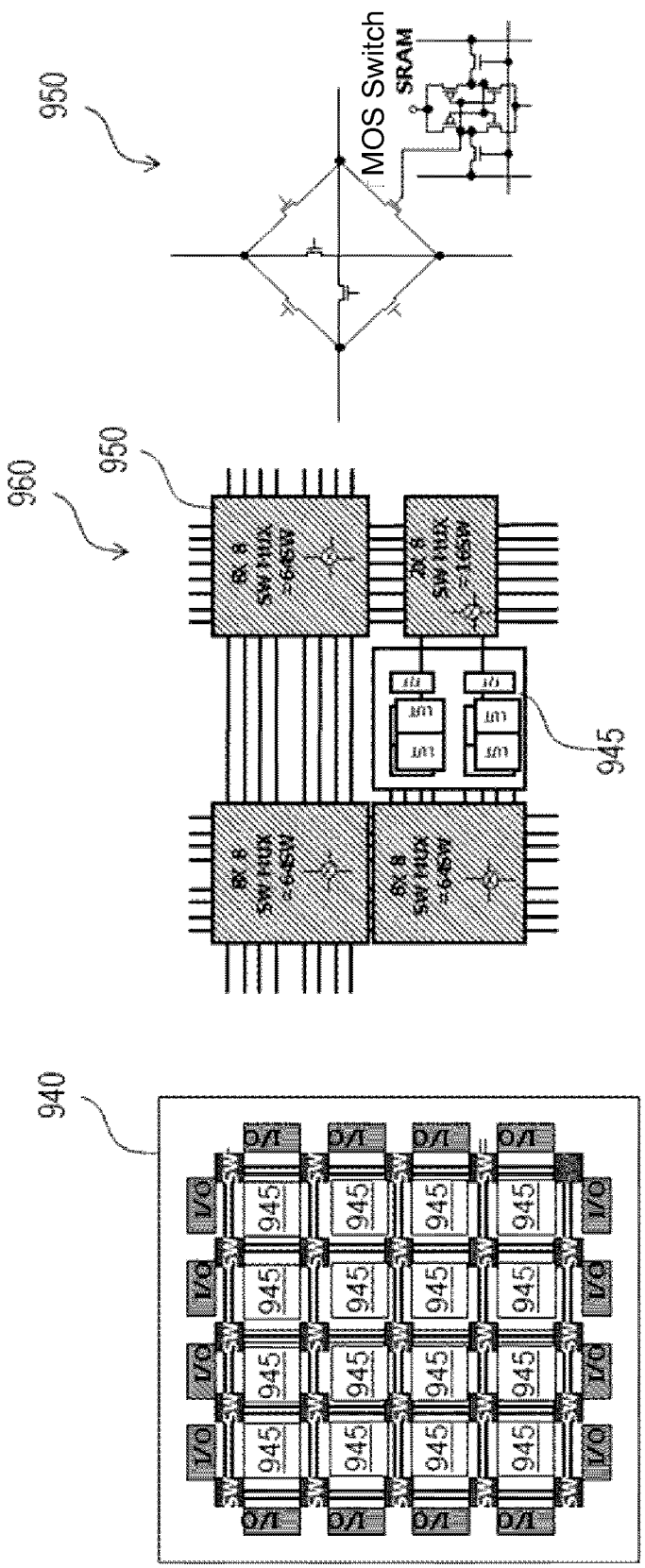
FIG. 16 shows a detailed example of an array of MLUTs of the present embodiment.

FIG. 16 is a drawing for describing a configuration of an FPGA. An FPGA is a device having logic LUTs connected by wiring lines and switches to form a logic circuit. 940 is an island-style FPGA. The FPGA 940 is constituted of logic cells and switch matrices (SW) surrounding the logic cells 945. 960 shows details of the logic cell 945 and 950 shows details of the switch matrix. The logic cell 945 is made of a configurable logic block (CLB). The CLB generally has two stages of 4-input 1-output LUTs (configured so as to be able to activate FFs in the last stage, and can form a sequential circuit), and has a 4-LUT structure having two pages. These LUTs are structured so as to be able to effectively connect to external CLBs. As a result of having two stages of LUTs, there are eight inputs, and there are many switches in order to effectively connect these inputs. The switches are 6-MOS transfer gates, and are connected to the memory nodes of SRAM memory cells such that the switches are controlled to be ON/OFF on the basis of the SRAM data.

The CLB has two 4-input 1-output LUTs, and has a two-stage two-slice structure of these two LUTs. In other words, the memory capacity needed for each CLB is attained by the following formulae.

LUT: 4 addresses (16 bits)

8 LUTs×16 bits=128 bits

Number of Switch Array MOSs

8×8×3 blocks+8×2×1 block=208

Number of MOS Switches Per Switch: 6 MOS Switches

208×6 MOS switches=1,248 bits

Memory Capacity Required for Each CLB=1,376 bits (1.4 Kbits)

Memory Capacity Required for Vertex XC2V3000: 3,584 CLBs×1,376 bits =4,931,584b (4.9 Mb).

As described above, an MLUT including one memory cell unit has eight address lines and eight data lines, and thus, requires 2Kbit memory cells. In order to create an equivalent to a conventional MLUT with CLBs, 10 CLBs must be connected, which means that 20 Kbits of memory capacity are required.

Figure 17:
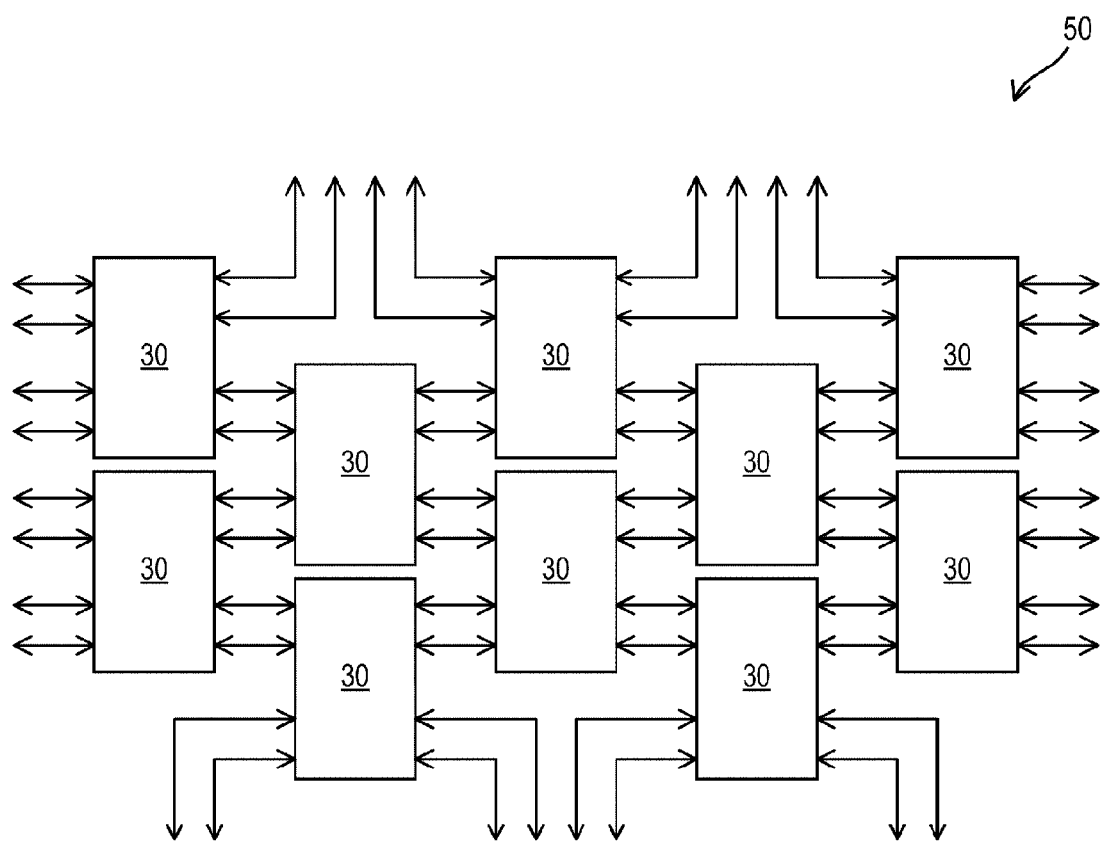
FIG. 17 is a drawing for describing a configuration of an FPGA.

FIG. 17 shows a configuration example of an MLUT block corresponding to CLBs. As described above, CLBs have eight input ends and wiring lines leading to these have a reconfigurable structure, and thus, MLUT blocks also require eight input ends. CLBs have eight input/output lines on the left, right, up, and down, and thus, as shown in FIG. 17, 10 MLUTs are required. In the MLUT block 50 shown in FIG. 17, a portion of the MLUT array 60 is shown.

As shown, the MLUT block 50 has eight input ends and eight output ends. When using 10 MLUTs, the MLUT shown in FIG. 12 is 256 (16×8×2) bits, and the MLUT shown in FIG. 14 is 192 (16×8+16×4) bits. Thus, in the MLUT of the present embodiment, a CLB equivalent of 2.5 Kbits (256×10) or 1.9 Kbits (192×10) are required, and an FPGA having each CLB be close to 1.4 Kbits can be configured. Thus, MRLDs can be used to realize reconfigurable semiconductor devices with the use of general use memory cell units, without the need for special circuits such as FPGAs, and have the same logic synthesis efficiency as FPGAs, thereby allowing for both low manufacturing cost and high logic synthesis efficiency.

As described above, the MRLD of the present embodiment can be configured with a memory capacity close to CLBs of FPGAs, and logic configuration efficiency compared to FPGAs can be raised. The signal transfer returning a signal to a restricted left side can be accomplished by the use of two MLUTs, and thus, this poses no major restriction. CLBs of FPGAs are asymmetric with four input ends and one output end, and thus, there are no significant disadvantages compared to FPGAs. MLUTs are connected to each other, and thus, are more conducive to loading the C programming language, and can function as reconfigurable devices with C directly loaded therein.

The SRAM used as the MLUT memory cell unit is a device commonly used in system on a chip (SoC) configurations.

Because SRAM can be used in the reconfigurable device, an effective reconfigurable device including an SoC can be formed. The SRAM is formed of a few wiring layers, and thus, a low cost reconfigurable device is formed.

(6) Usage Example with Large Capacity Memory

The amount of processes that can be performed by the processor is increasing in commercially available memory devices, which are also becoming higher capacity, while the cost per amount of memory is decreasing. Thus, the MRLD cost can be made lower by using large capacity memory for the MLUT.

However, commercially available memory devices have a different number of address lines than data lines, and thus, in general, there are address lines left over when configuring the address lines and data lines of MRLDs. Furthermore, typical memory often has 8 or 16 data lines due to system requirements, and has 20 or more address lines in order to express the system memory space.

By increasing the n-value, which is the number of input address lines in the MLUT, data processes close to the bit length of the C programming language are also possible, and such MLUTs can function as IPs for increasing the speed of data processes to be performed in the CPU. Below, a configuration example of an MRLD for when large capacity memory is used will be described.

Figure 18:
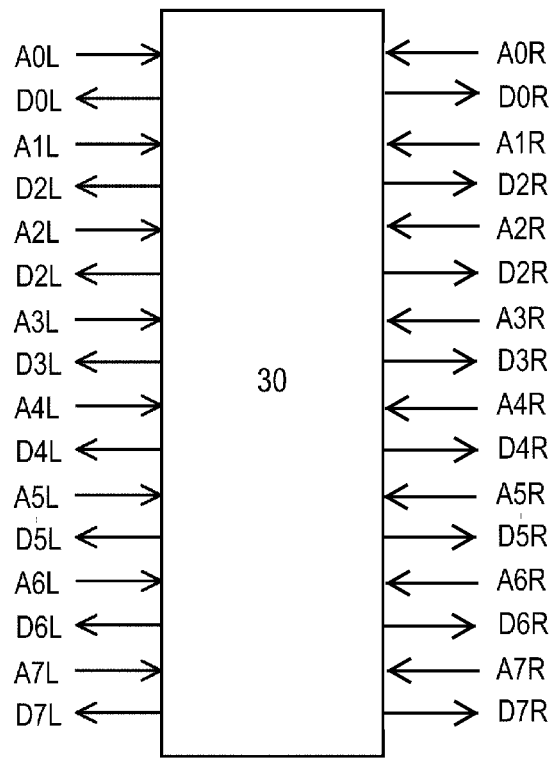
FIG. 18 schematically shows an MLUT configured by horizontally integrating MLUTs including two memory cell units.

FIG. 18 schematically shows an MLUT configured by horizontally integrating MLUTs including two memory cell units. The MLUT 30 shown in FIG. 18 has address lines A0L to A7L as input from the left side, address lines A0R to A7R as input from the right side, data lines D0L to D7L as output to the left side, and data lines D0R to D7L as output to the right side. In the conventional configuration, if the n-value is 8, then the MLUT is 1 Mbit, and the CLB equivalent is 4 Mbits, which would result in an increase in scale. By contrast, in this configuration of the present invention, the amount of memory is 8 Kbits (256 word lines×16 bits×2 MLUTs). The CLB equivalent would be 24 Kbits (8K×3).

Figure 19:
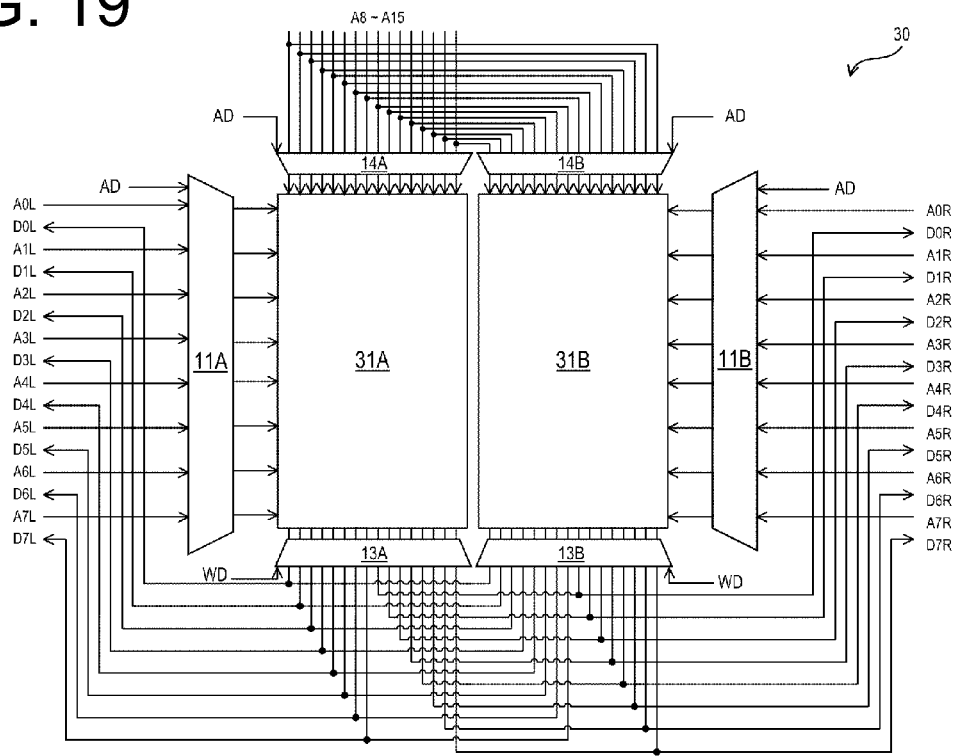
FIG. 19 shows an example of an MLUT using high capacity memory.

FIG. 19 shows an example of an MLUT using high capacity memory. The MLUT 30 shown in FIG. 19 has memory cell units 31A and 31B, and each memory cell unit has 16 address lines and 16 data lines, and thus, is a high capacity memory of 64K×16 bits. Around the memory cell units 31A and 31B are address selectors 11A, 11B, 14A, and 14B, and data selectors 13A and 13B.

Figure 22:
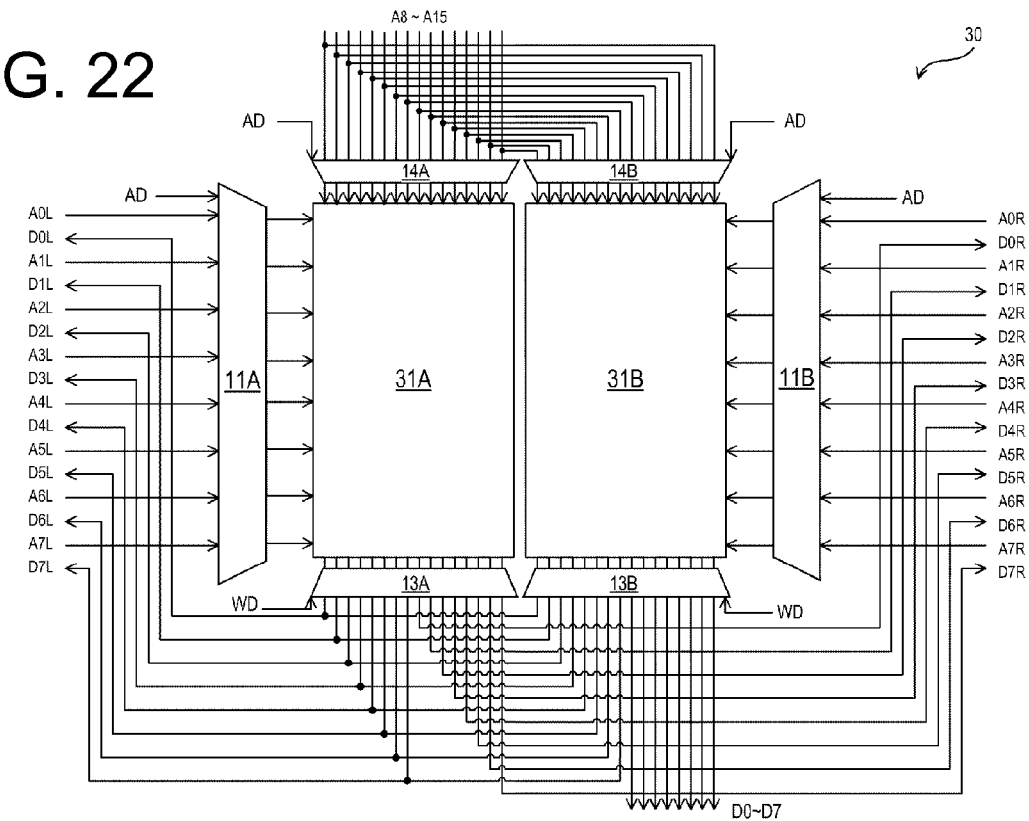
FIG. 22 shows an example of providing a state machine in an MLUT.

The present example aims to make effective use of MLUTs having commercially available high capacity memory. In FIG. 19 and FIG. 22 to be described later, the memory cell units 31A and 31B respectively have address lines A0L to A7L and A8 to A15, and address lines A0R to A7R and A8 to A15 as input.

Also, FIG. 19 and FIG. 22 to be described later are schematic views, and circuits peripheral to the memory cell unit such as decoders are not shown; the decoders 9A and 9B described in FIG. 15A are provided for the respective memory cell units and are disposed between the address selectors 11A and 11B and the memory cell units 31A and 31B. Thus, the decoders may decode all addresses outputted from the address selectors 11A, 11B, 14A, and 14B.

Address selectors 11A, 11B, 14A, and 14B are selection circuits for switching the address line for logic operation or the address for writing. These are necessary if the memory cell is of a single port type. If the memory cell is of a dual port type, then row selectors are not necessary.

The data selectors 13A and 13B are selection circuits that switch output data or writing data WD.

In order to configure an MLUT of high capacity memory, page switching is used. In other words, a plurality of pages (memory regions) having different truth table data are prepared, pages are switched, and the logic state is sequentially switched. In this example shown in FIG. 19, the address lines A0 to A7 constitute one page, and the address lines A8 to A15 identify another page. In other words, the memory cell identified by the address lines A8 to A15 has stored therein truth table data differing from the memory cell identified by the address lines A0 to A7.

Logic operations are performed under memory-reading mode, and configuration is performed during a writing operation. Thus, selectors are used to select between address lines and data lines to switch between the writing address AD and the writing data WD. By having this mechanism, this device can also be used as memory. In addition, by using a multi-port memory, it is possible to omit the selectors. Logic operations are performed under memory-reading mode, and configuration is performed during a writing operation. Thus, selectors are used to select between address lines and data lines to switch between the writing address and the data. By having this mechanism, this device can also be used as memory. In addition, by using a multi-port memory, it is possible to omit the selectors.

In this manner, by restricting output in the return direction to any of the memory cell units, it is possible to further reduce the number of memory cells needed.

Figure 20:
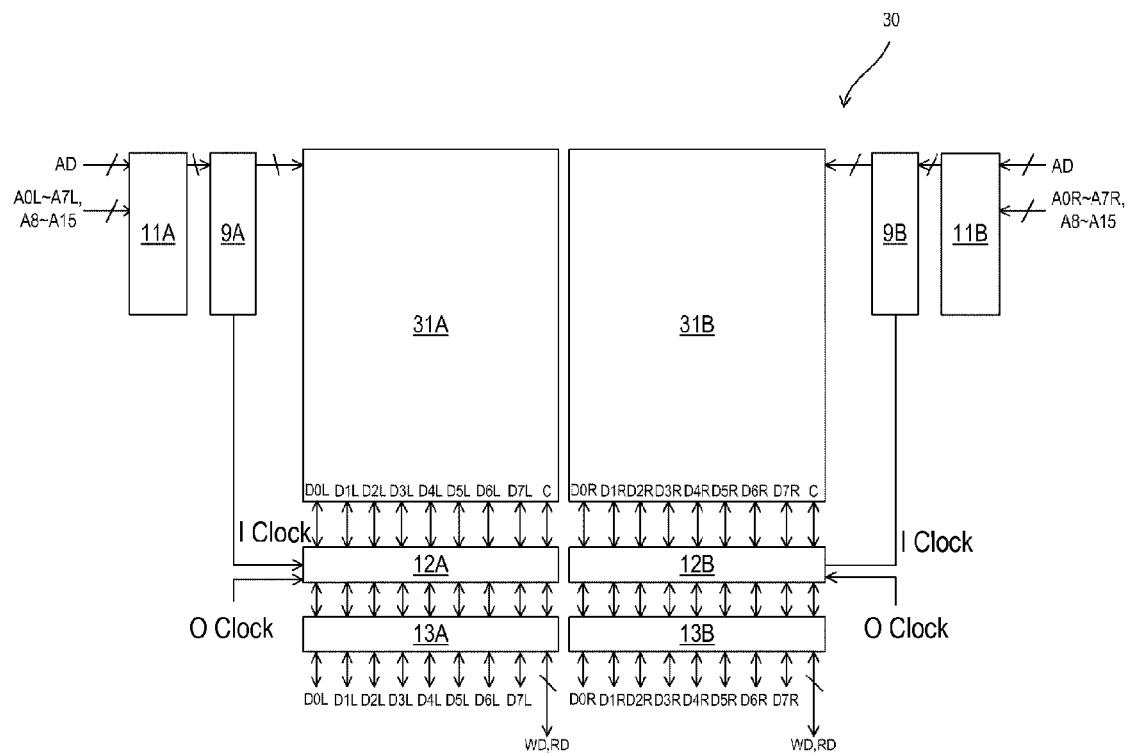
FIG. 20 shows an example of a circuit of the MLUT shown in FIG. 19.

FIG. 20 shows an example of a circuit of the MLUT shown in FIG. 19. The MLUT 30 shown in FIG. 20 has a similar structure to that of the MLUT 30 shown in FIG. 15A, and the input address lines to the memory cell units 31A and 31B are respectively address lines A0L to A7L and A8 to A15, and address lines A0R to A7R and A8 to A15. Thus, the memory cell units 31A and 31B have a high capacity of 524K calculated by $2^{16}$ (65,536) word lines×8 bits.

Figure 21:
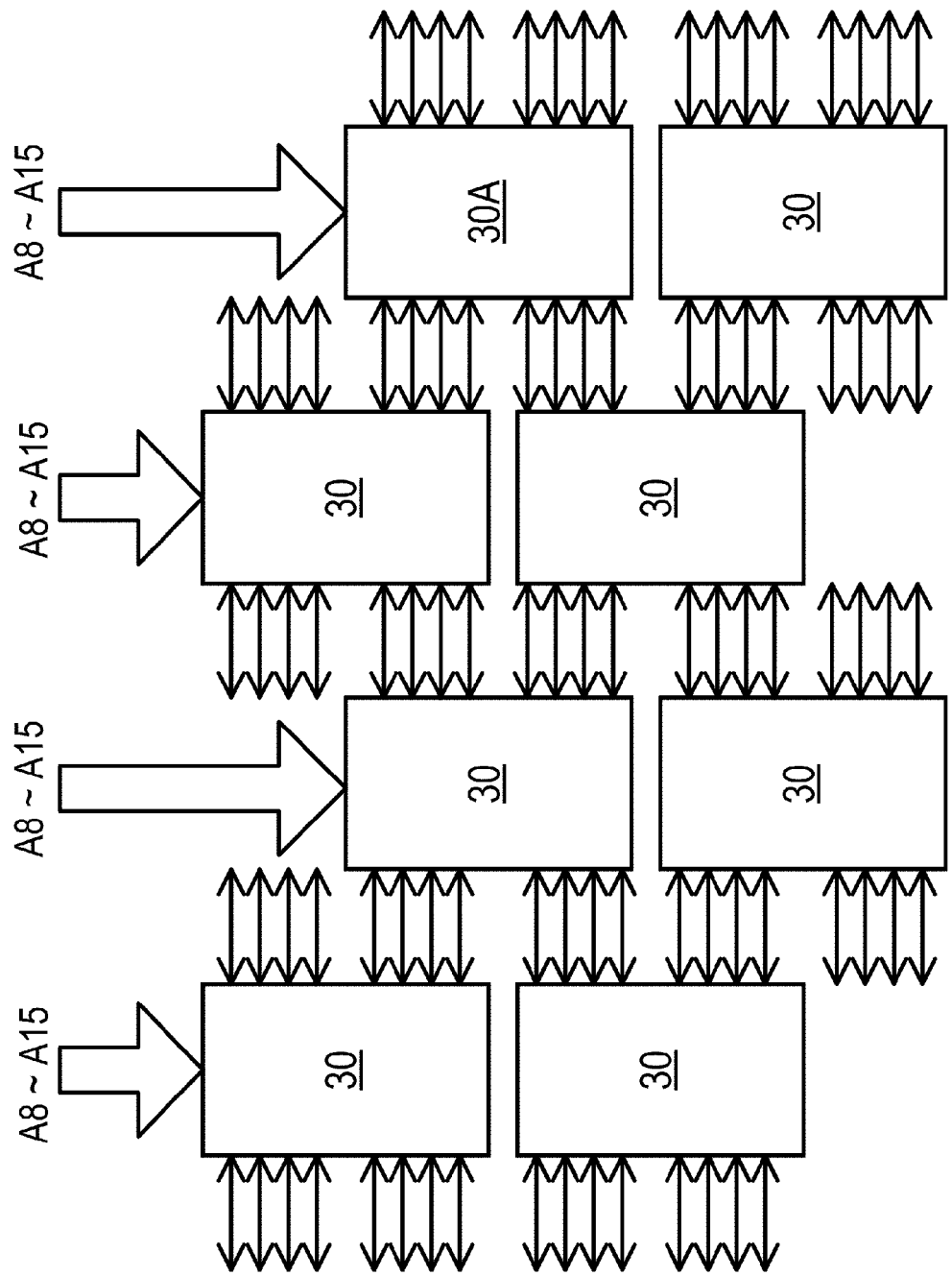
FIG. 21 is a drawing for describing an MPLD using the MLUTs shown in FIG. 19.

FIG. 21 is a drawing for describing an MRLD using the MLUT shown in FIG. 19. As shown in FIG. 21, by controlling a certain MLUT 30 by an external system, the page (truth table data) can be switched by address.

In conventional MRLDs, the state machine of the MRLD needed to be defined by truth table data. Thus, there was a need to provide truth table data defining a plurality of predetermined states according to determined conditions by truth table data. The state machine constituted of MLUTs was the control circuit, and wiring needed to be arranged with logic circuits not on the data path being generated.

The MLUT 30 shown in FIG. 19 has a page switching function, and thus, there is no need for the state machine to be defined by truth table. The address of the same page is outputted to the data line and the page is not switched until the for loop reaches a prescribed value, for example, thus performing the operation on the same page. If a certain condition is satisfied (for example, i=0), then the page switching address is outputted to the data line. The data line is the address line input of another memory cell unit, and thus, it is possible to perform page switching in the other memory cell unit. If a case statement is used, then based on a prescribed value, the jump address can be outputted to the data line to perform page switching, thereby performing page switching and changing the operation. In this manner, whereas the conventional MRLD could only be configured from a logic circuit, an MRLD of the present invention can perform operation synthesis by the C programming language, and it is possible to generate truth table data of the MLUTs of the MRLD using C, thereby allowing greater functionality than FPGAs.

FIG. 22 shows an example of providing a state machine in an MLUT. Data path systems of arithmetic circuits and the like have directionality, and the return method was described (FIGS. 8 to 10). In FIG. 14, an asymmetrically sliced MLUT was described in view of this return state. In the MLUT of FIG. 14, the capacity of one of the memory cell units was reduced, which reduced the amount of memory used, but in FIG. 22, there is no reduction in memory, and the remaining data is used for the switching signal. As a result, it is possible for the MLUT itself to have a control function to change calculation. The memory cell unit 31B of FIG. 14, for example, does not have a memory cell for outputting the addresses A4 to A7 inputted from the right as data D4 to D7. In FIG. 22, a logic calculation to determine page switching is performed on the addresses A0 to A7 inputted from the right and the data D0 to D7 are outputted. The data D0 to D7 are connected to the address signal lines for the addresses A8 to A15, and are used as page switching signals for other MLUTs.

Figure 23:
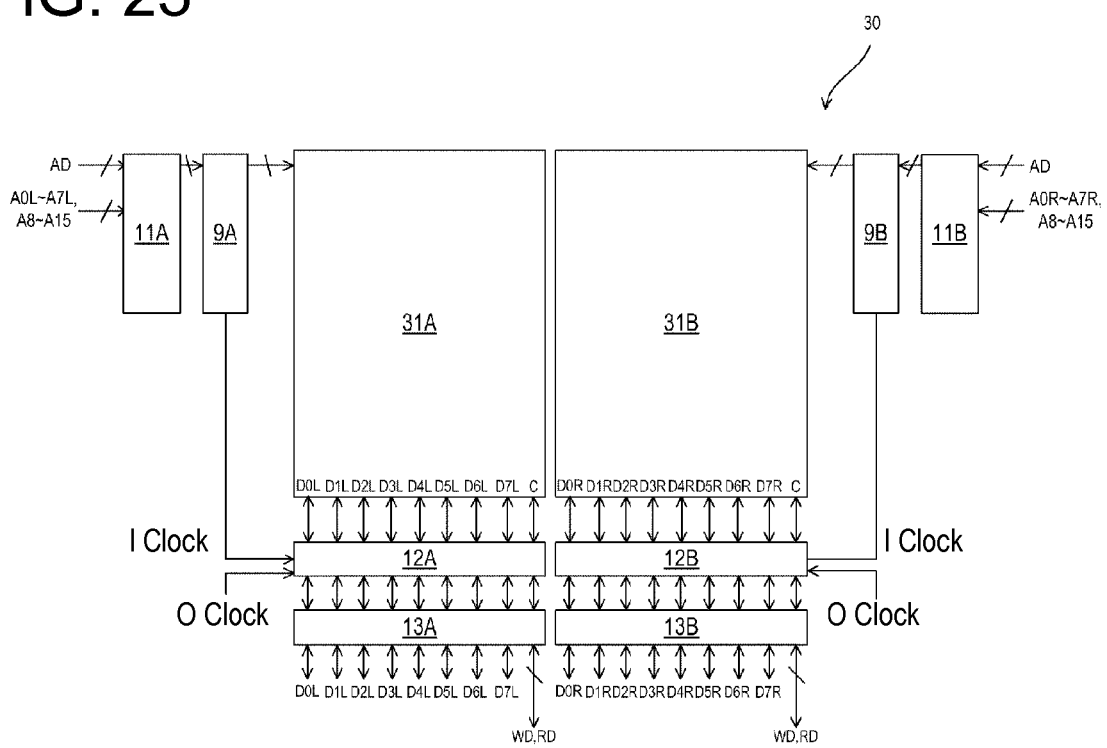
FIG. 23 is a drawing for describing an MPLD using the MLUTs shown in FIG. 22.

FIG. 23 is a drawing for describing an MRLD using the MLUT shown in FIG. 22. In FIG. 23, the lower left block is the MLUT 30B and the remaining blocks are constituted of the MLUTs 30 of FIG. 19. In the MLUT of FIG. 22, if a prescribed value is received at the address/data pair, a prescribed address is outputted and all pages are controlled to switch operation. By doing so, controls such as jump can be performed.

Semiconductor design, prototyping, and manufacturing for miniaturized SRAMs for MRLDs need not be performed, and a conventional high capacity memory device can be used. When configuring an MRLD using a chip, a memory IP (intellectual property) is used, but in the case of small memory capacity needed by conventional MLUTs, an address decoder and the sense amplifier took up a large area, and the proportion taken up by the memory itself was 50% or less. This resulted in overhead for the MRLD and decreased efficiency. In the case of high capacity memory, the proportion taken up by the address decoder and the sense amplifier is reduced and the memory usage efficiency increases. Thus, this configuration using a high capacity memory is effective for MRLD chips.

(7) MLUT Using Reconfigurable Logic Multiplexer

Figure 24:
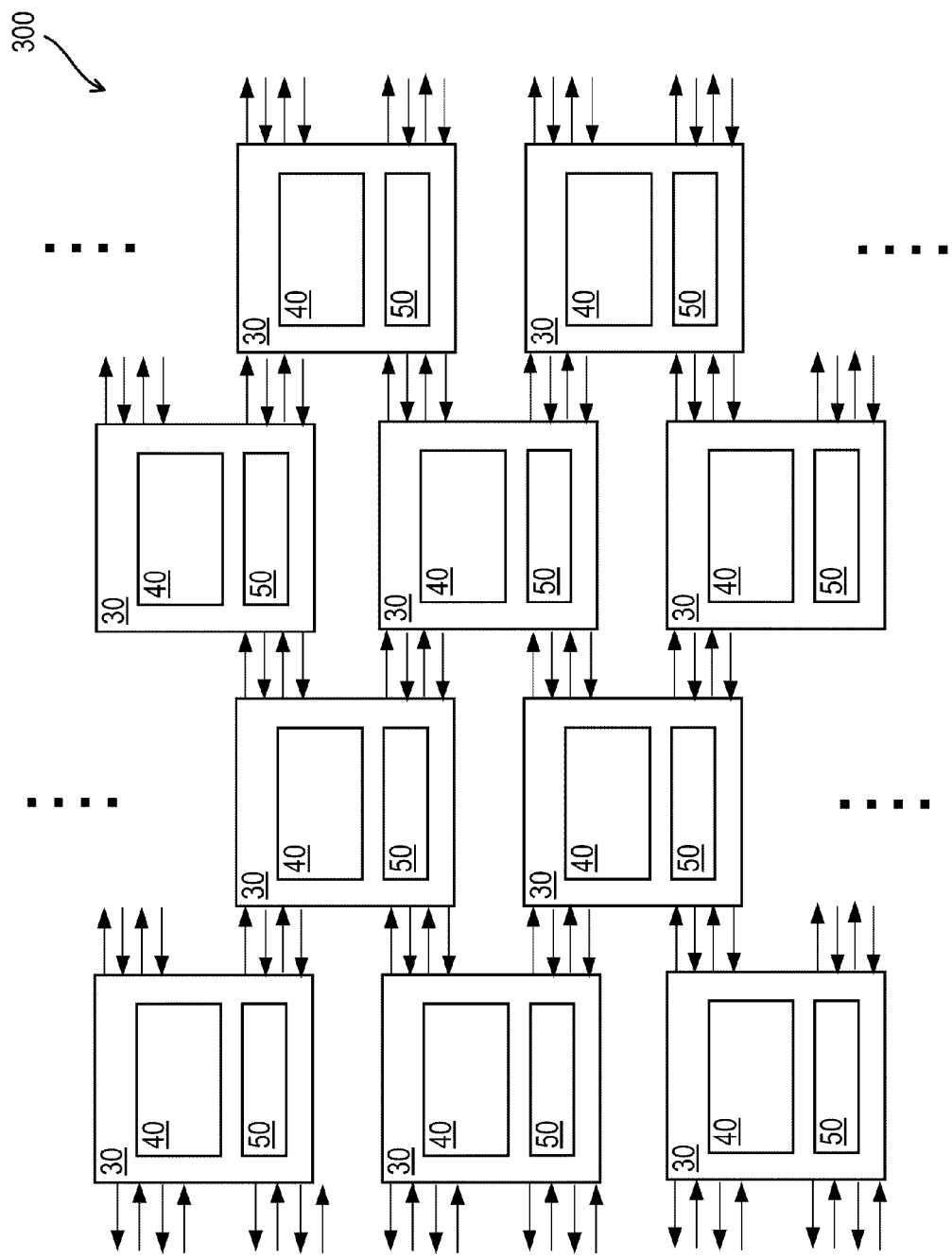
FIG. 24 shows an example of an array of bidirectional MLUTs.

FIG. 24 is a drawing for describing an example of an array of bidirectional MLUTs. The arrows shown in FIG. 24 are data input lines or data output lines connected to other adjacent MLUTs. In the MLUT array 300 shown in FIG. 24, the MLUTs 30 are each connected to other MLUTs 30 through two data input lines or data output lines. In other words, connection between adjacent MLUTs is achieved through a plurality of data input lines or data output lines. In addition, in order to increase configurability, MLUTs are connected respectively to two MLUTs in the input direction and the output direction. This arrangement is referred to as "interleaving."

The interleaved MLUT can process multi-bit data by having a plurality of data lines and bit lines, and the input and output direction data flow can be limited, and thus, logic libraries can be made with ease.

Each MLUT 30 can execute many different logic functions. The MLUT 30 has a memory cell unit 40 and a reconfigurable logic multiplexer 50. The logic function to be executed by the MLUT 30 is determined by configuration data stored in the memory cell unit 40. The MLUT 30 has input for configuration data and output for configuration data to the reconfigurable logic multiplexer 50. The configuration data is loaded from outside the MRLD 20 to inside the memory cell unit 40 through the address lines and data lines.

The reconfigurable logic multiplexer 50 has a configuration input end for receiving data input, data output, and configuration data, and, in response to that, controls the coupling state of the data input and output. The reconfigurable logic multiplexer 50 additionally outputs data resulting from performing logic calculation on data input to the data output line in response to the configuration data.

FIG. 25 is a drawing for describing an example of an array of four-direction MLUTs. The direction arrangement shown in FIG. 25 is similar to that of the FPGA. By doing so, a configuration similar to that of the FPGA is attained, and states attained by logic configurations generated by FPGA tools are used, allowing configuration data of the MRLD to be generated with ease. With the upper left, upper middle, and lower left of the drawing as switch blocks, and the lower middle as the LUT block, for example, the CLB correspondence of the FPGA can be expressed, and it is possible to generate truth table data from the state configured in the FPGA.

Figure 26A:
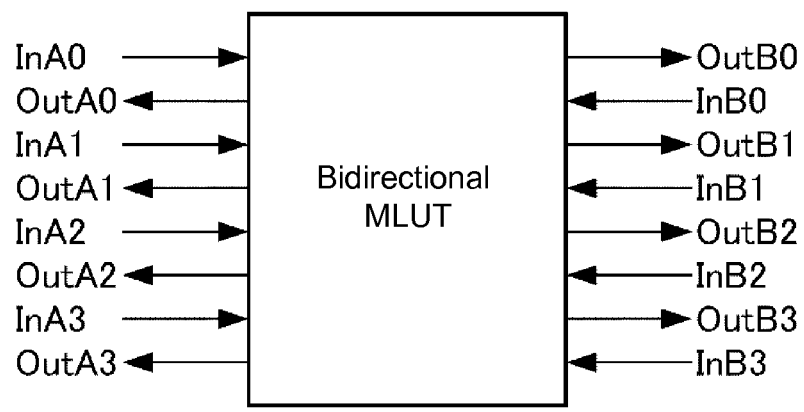
FIG. 26A shows an example of an arrangement of signal lines in a bidirectional MLUT.

FIG. 26A shows an example of an arrangement of signal lines in a bidirectional MLUT. As shown in FIG. 26A, the data input from the left is InA0 to InA3, and the data output to the left is OutA0 to OutA3. In addition, the data input from the right is InB0 to InB3, and the data output to the right is OutB0 to OutB3.

Figure 26B:
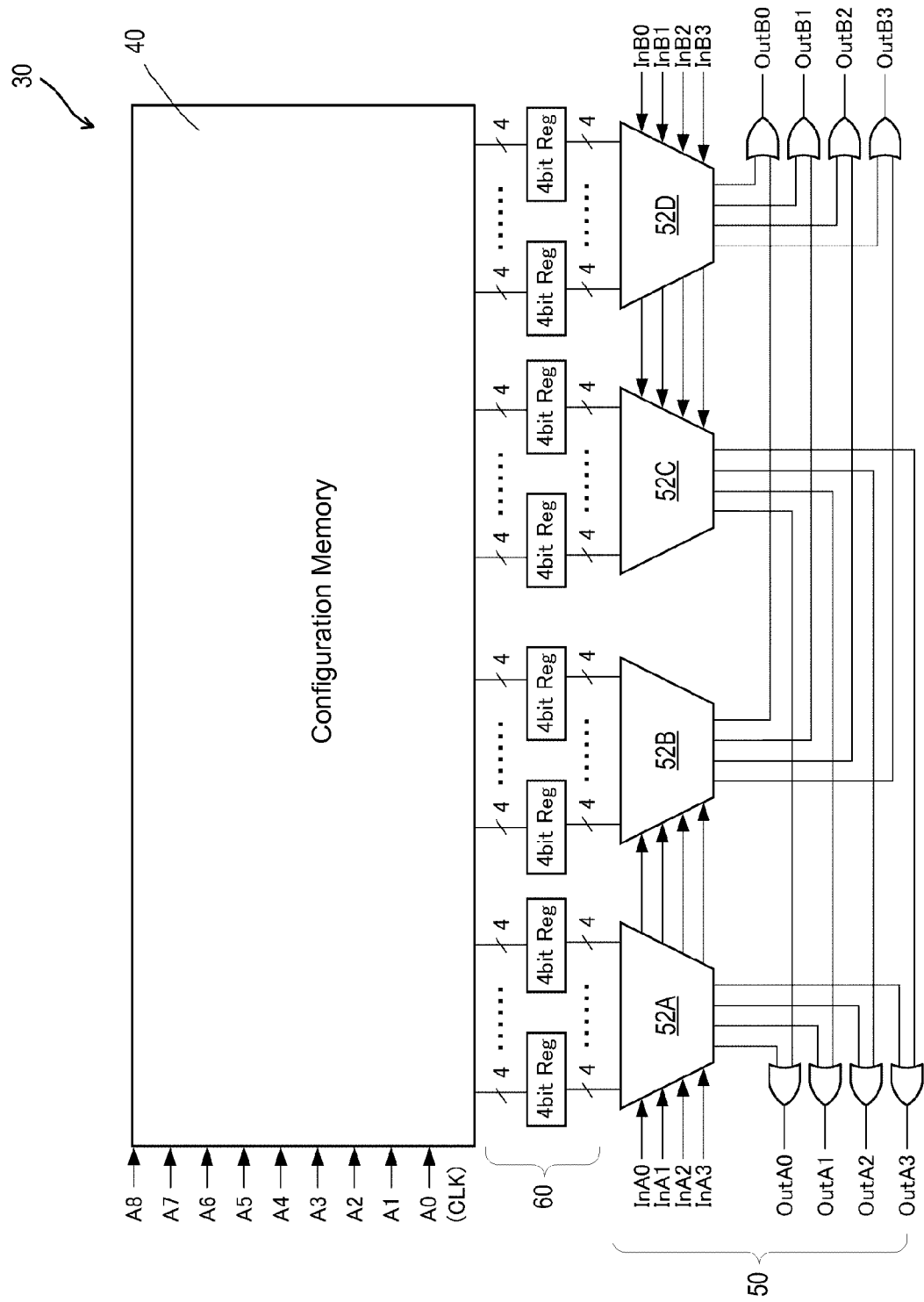
FIG. 26B shows an example of a bidirectional MLUT.

FIG. 26B shows an example of a bidirectional MLUT. The signal lines of the MLUT shown in FIG. 26B are the same as the signal lines of the MLUT shown in FIG. 26A. The MLUT 30 shown in FIG. 26B has a memory cell unit 40, a reconfigurable logic multiplexer 50, and a register unit 60. The memory cell unit 40 is SRAM, for example. The memory cell unit 40 is connected to a plurality of address lines A0 to A8 for identifying the memory cell to which configuration data is stored. In the example shown in FIG. 26B, the memory cell unit has $2^9$, that is, 512 word lines from 9 addresses, and has 256 bit lines (also referred to as "data lines"). There are four input ends having 16 different combinations, and thus, 16 registers are required. With 4 bits, 16 registers are required, and left to left, left to right, right to left, and right to right data is necessary, thus arriving at a total of 4 bits×16×4=256 bit lines. Thus, the memory cell unit has $2^9 \times 256$ memory cells. A0 has connected thereto a positive-type address transition detection (ATD) circuit, and receives a clock signal as input (mentioned later with reference to FIG. 28).

(7.1) Memory Cell Unit

The memory cell unit 40 reads data using a sense amplifier (not shown) from a memory cell identified by the address according to a clock signal A0, and outputs data to the register unit 60 having a register corresponding to the bit (in the example of FIG. 24, 256 bits). The register unit 60 is constituted of a plurality of registers that store data until new data is outputted from the memory cell unit 40.

Figure 27:
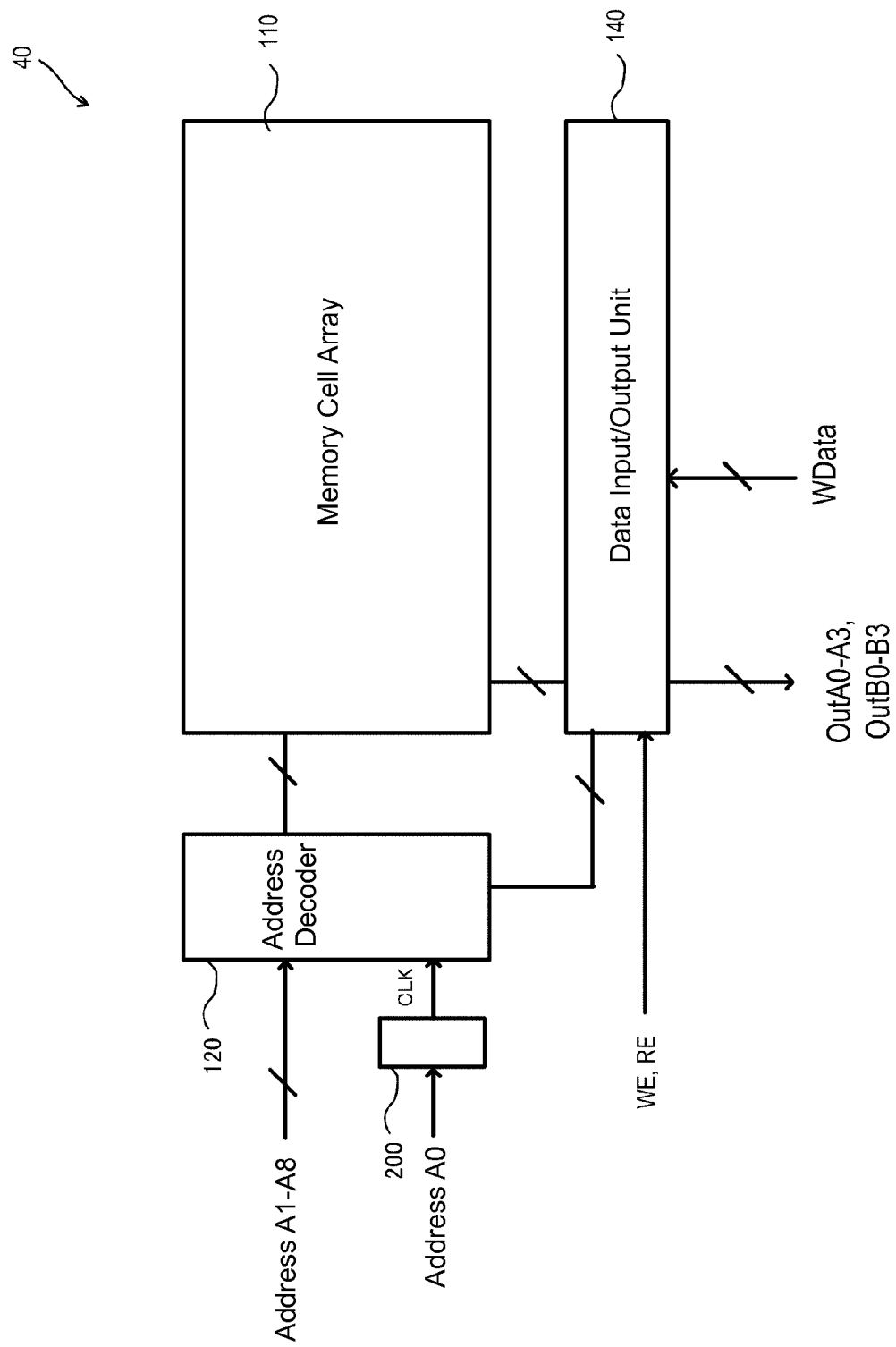
FIG. 27 shows an example of a memory cell unit.

FIG. 27 shows details of a memory cell unit. The memory cell unit 40 shown in FIG. 27 has a memory cell array 110 including memory cells that each store data, an address decoder 120, an address transition detection unit 200 shown in FIG. 28A to be described later, and a data input/output unit 140 that reads data from or writes data to the memory cell array 110. In this example, the memory cell unit 40 is a synchronous SRAM that reads or writes in synchronization with a clock signal. Thus, the address decoder 120 and the data input/output unit 140 operate in synchronization with a clock signal.

The memory cell array 110 has $n \times 2^m$ memory cells (memory elements included therein), and the $n \times 2^m$ memory cells are disposed in the connecting portions of $2^m$ word lines and an n number of bit lines (also referred to as "data lines"; same applies below).

When the address decoder 120 receives an address signal from the m number of address signal lines in synchronization with the clock signal generated at the A0 address transition detection unit, the address decoder 120 decodes this address signal, outputs a word line selection signal, which is a decoding signal to the $2^m$ number of word lines WL, and a data line selection signal to select the data line using the data input/output unit 140, and reads from or writes to the corresponding memory cell.

The data input/output unit 150 has a write amplifier and a sense amplifier. When the write amplifier receives a write-enable (WE) rise edge timing and writing data from an external source, for example, it transmits a signal level for writing data to the m number of data lines b and /b, thereby writing data to the memory cell. Also, when the data input/output unit 140 receives a read-enable (RE) rise edge timing from an external source, the sense amplifier outputs the signal level of the m number of data lines b and /b to outside, thereby reading the reading data.

The memory cell unit shown in FIG. 27 may be provided for each direction of the wiring lines. In the bidirectional arrangement of FIG. 24, for example, this would mean two memory cell units, and in the four-direction arrangement shown in FIG. 25, this would mean four memory cell units. By providing memory cell units for each direction in this manner, the number of addresses is reduced compared to having a single memory configuration ($2^9 \times 4$ is less than $2^{36}$), and thus, it is possible to reduce memory capacity.

Figure 28A:
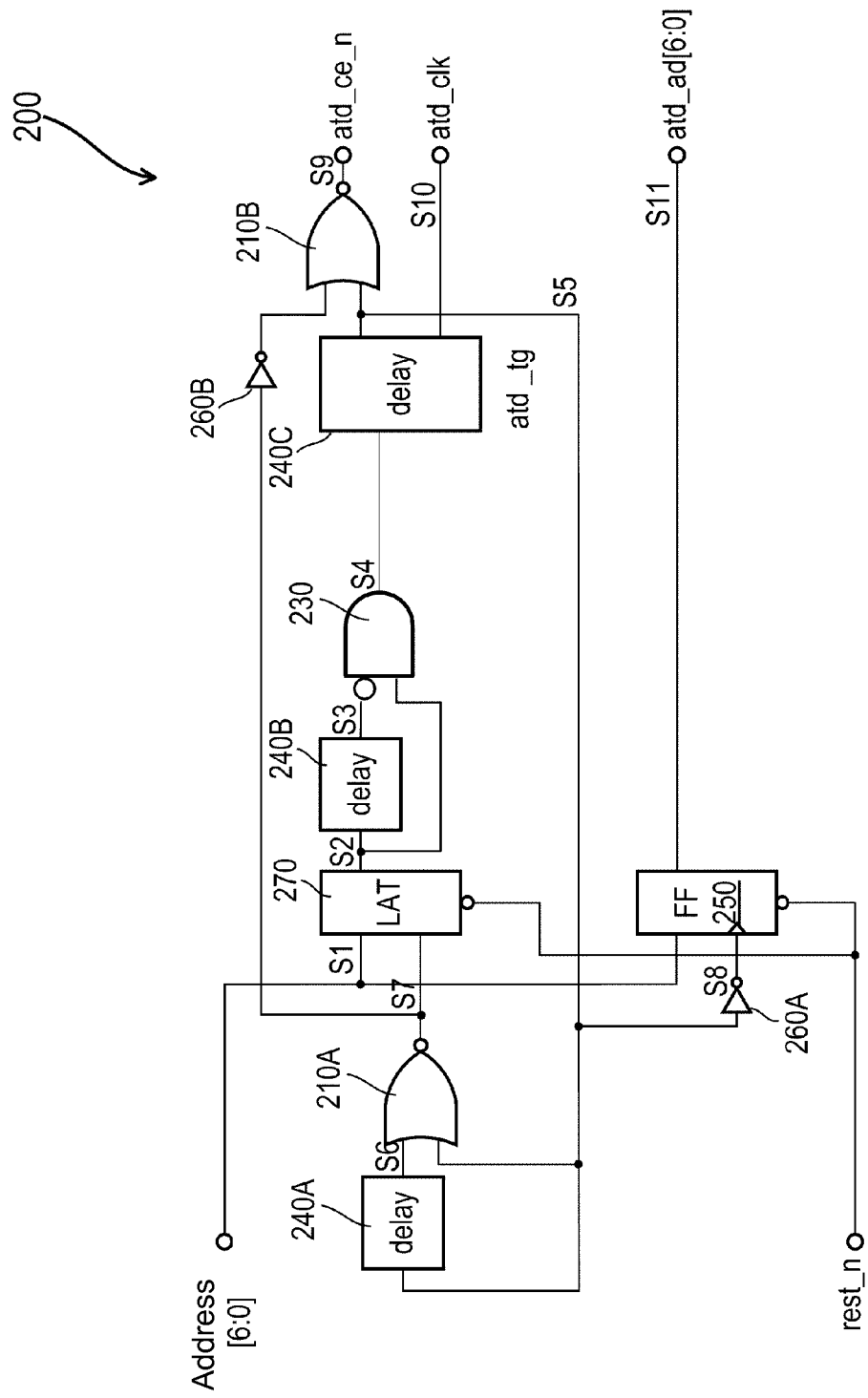
FIG. 28A shows an example of an address transition detection unit.

FIG. 28A is a circuit diagram of the address transition detection unit of the present embodiment. The address transition detection unit 200 shown in FIG. 28A has NOR circuits 210A and 210B, an AND circuit 230, delay circuits 240A to 240C, a flip-flop 250 (FF), inverters 260A and 260B, and a D latch 270.

Figure 28B:
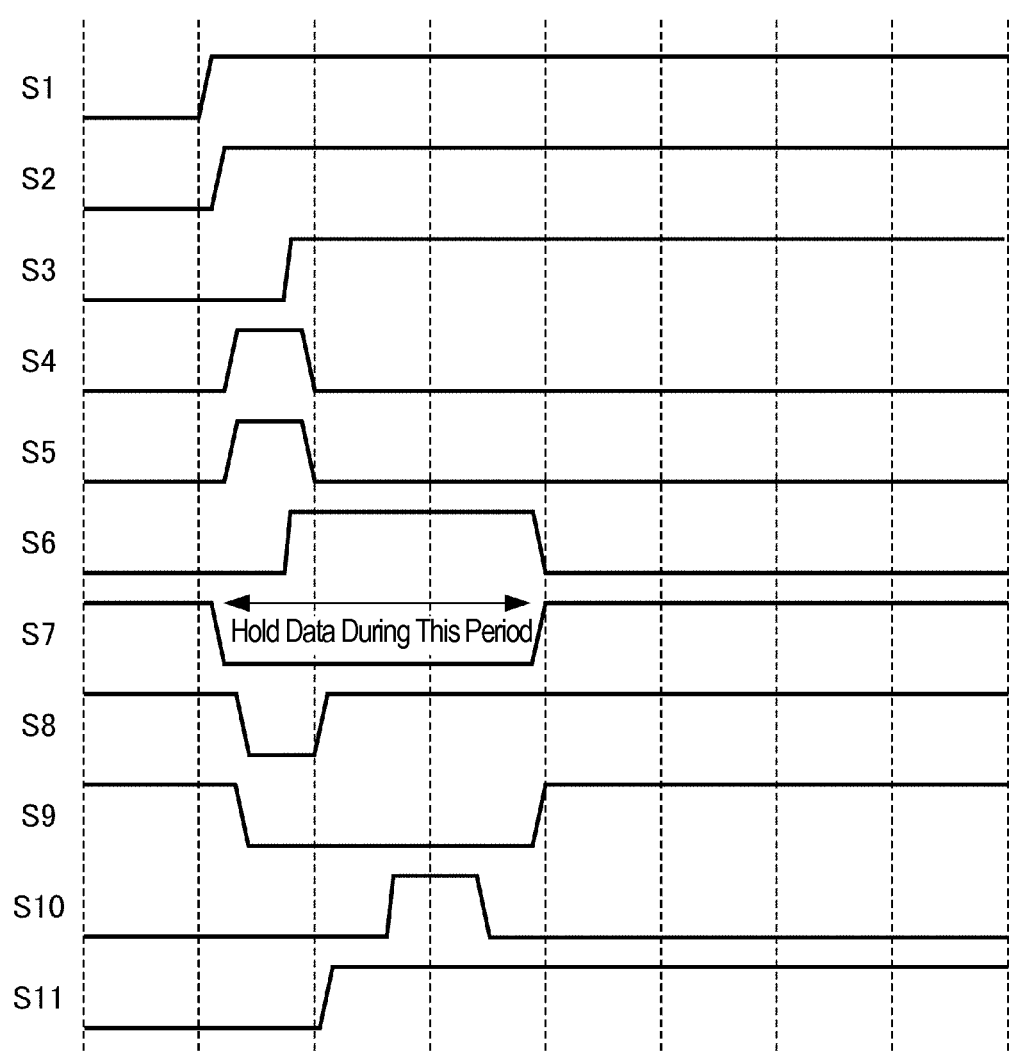
FIG. 28B shows an example of a timing chart of an address transition detection unit.

FIG. 28B is a timing chart for signals of the address transition detection unit shown in FIG. 28A. A signal S1 is an address input signal to the memory cell unit. In the present example, this is the address A0. A signal S2 is output from the D latch. If there is a change in the signal S1, the D latch 270 performs latching so as not to change over a fixed period. This is in order to ignore noise resulting from address transfer occurring later. The signal S3 is a delay signal outputted from the D latch 270. As shown in FIG. 28B, the delay signal is delayed by the delay circuit 240B in order to generate the clock signal width of a signal S4 to form a clock signal constituted of a rise and a fall.

The signal S4 generated as the clock signal is outputted from the AND circuit 230. The input and output from the delay circuit 240B is inputted to the AND circuit 230, and thus, if the signal levels differ therebetween, the AND circuit 230 outputs a signal level "high." As a result, it is possible to detect an address transition.

A signal S5 is a delay signal outputted from the delay circuit 240C and is inputted as a clock signal, waiting for the enable signal for the D latch 270.

A signal S6 is a lengthening of the signal S5 and is a pulse generated for the enable signal. The NOR circuit 210A outputs a signal S7, which is the result of a NOR calculation between the signal S5 and the signal S6. The signal S7 is an enable signal for the D latch 270. A signal S8 is a signal resulting from inverting the signal S5 using the inverter 260A, and is used by the FF 250 as the latch clock signal for the address signal. A signal S9 is an enable signal for the memory cell unit, a signal S10 is a clock signal (atd_clk) for the memory cell unit, and a signal S11 is used as the address of the memory cell unit. In this manner, the clock signal S10 is generated by the signal S1, which is the address A0, and thus, it is possible to use the synchronous SRAM as the memory cell unit.

Figure 28C:
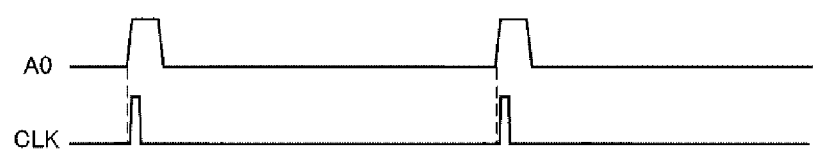
FIG. 28C shows an example of an address and a generated clock signal in an address transition detection unit.

FIG. 28C is a timing chart showing the relation between the address A0 and the generated clock signal. FIG. 28C shows only the signals S1 and S10. If the clock signal is generated by the timing at which the address A0 rises from "low" to "high," and the clock signal is also generated by the timing at which the address A0 falls from "high" to "low," then when writing data, even if data is written during the signal rise, the memory data reverts to the original data during the signal fall, which means that the data is not stored. As a countermeasure, the MLUT 30 has a positive-type address transition detection (ATD) unit 200. In this manner, the positive type ATD circuit only generates a CLK when A0 rises, and thus, the address in the memory can be maintained at "high." The configuration data maintained at "high" is outputted, and when A0 is "low" a CLK is not generated, and the configuration data is stored in a register of the register unit 60. Thus, the MLUT 30 need not have an actual circuit such as a flip-flop circuit, and can constitute a sequential circuit. The CLK generation may be performed using an FF instead of an ATF circuit as in the present example.

(7.2) Reconfigurable Logic Multiplexer

There are the same number of reconfigurable logic multiplexers 50 as there are of data wiring paths. There are reconfigurable logic multiplexers 52A, 52B, 52C, and 52D, for example.

The reconfigurable logic multiplexers are multiplexers coupled to both data input and data output in accordance with configuration data stored in the register unit 60, and the connective path thereof is reconfigurable by the configuration data. Operations include setting the data stored in the register unit 60 as an "input signal," using the data input as a "selection control signal," selecting the "input signal," and outputting the "input signal."

Figure 29A:
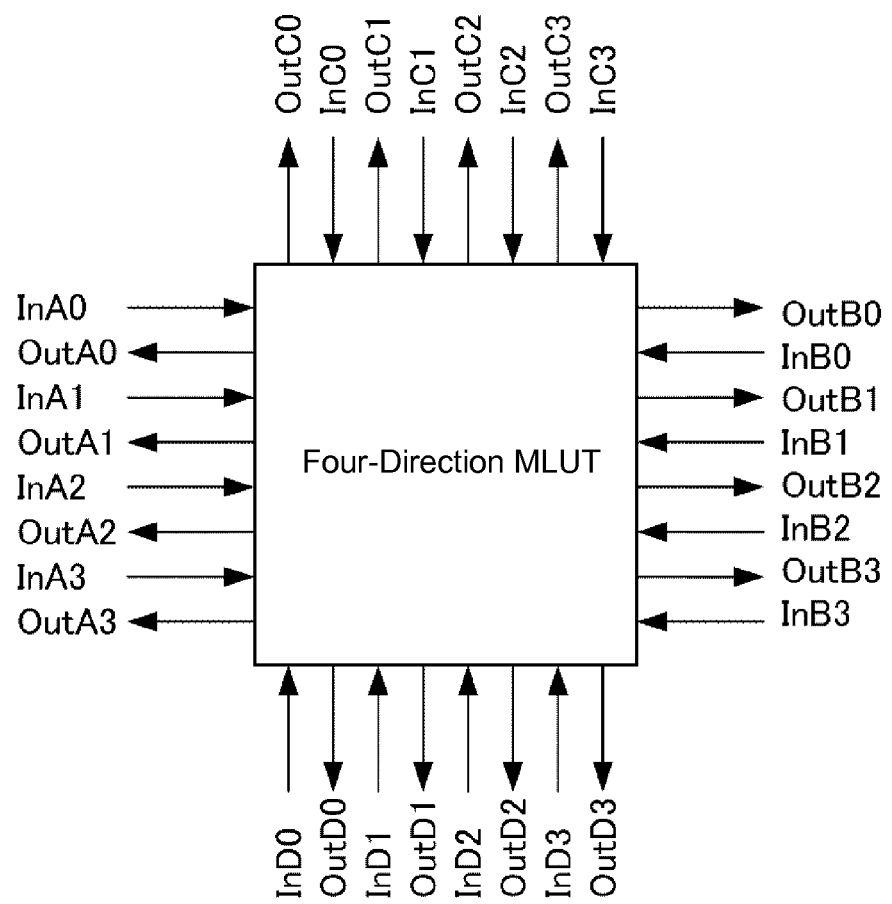
FIG. 29A shows an example of an arrangement of signal lines in a four-direction MLUT.

FIG. 29A shows an example of an arrangement of signal lines in a four-direction MLUT. As shown in FIG. 29A, the input and output of data from left and right is the same as in the bidirectional arrangement, but in addition, there are data input ends InC0 to InC3 from the top, data input ends OutC0 to OutC3 to the top, data input ends InD0 to InD3 from the bottom, and data output ends OutD0 to OutD3 to the bottom.

Figure 29B:
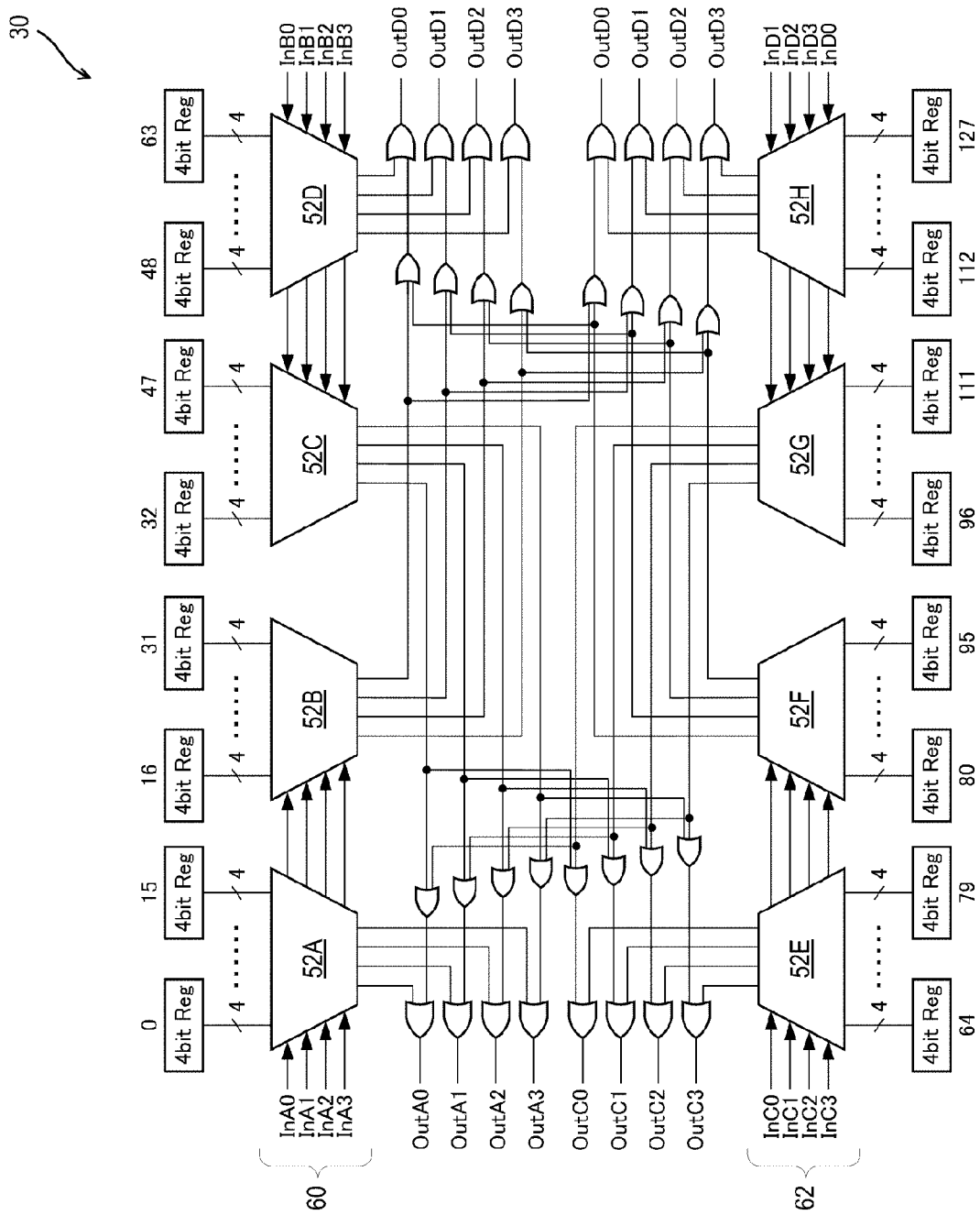
FIG. 29B shows an example of a four-direction MLUT.

FIG. 29B shows an example of a four-direction MLUT. The present example may be modified as appropriate. The signal lines of the MLUT shown in FIG. 29B are the same as the signal lines of the MLUT shown in FIG. 29A. Although the memory cell unit is not shown, the operation of the respective constituent elements is the same as the bidirectional MLUT. Because there are four direction, the number of reconfigurable logic multiplexers increases by four (reconfigurable logic multiplexers 52E to 52H) compared to the bidirectional MLUT, and thus, the number of register units 62 also increases.

The output from the bidirectionally arranged multiplexers undergoes a logical OR operation with other outputs in the same direction, and the same principle applies for the four-direction arrangement. However, because there are four directions, this means there are four logical OR operations. With the data outputs OutC0 to OutC3 as examples, the output from the reconfigurable logic multiplexers 52C, 52E, and 52G undergo a logical OR operation. By setting the data in the reconfigurable logic multiplexers 52E and 52G at "0," the output from 52E can be outputted to the top.

(7.3 Page Control)

Figure 30:
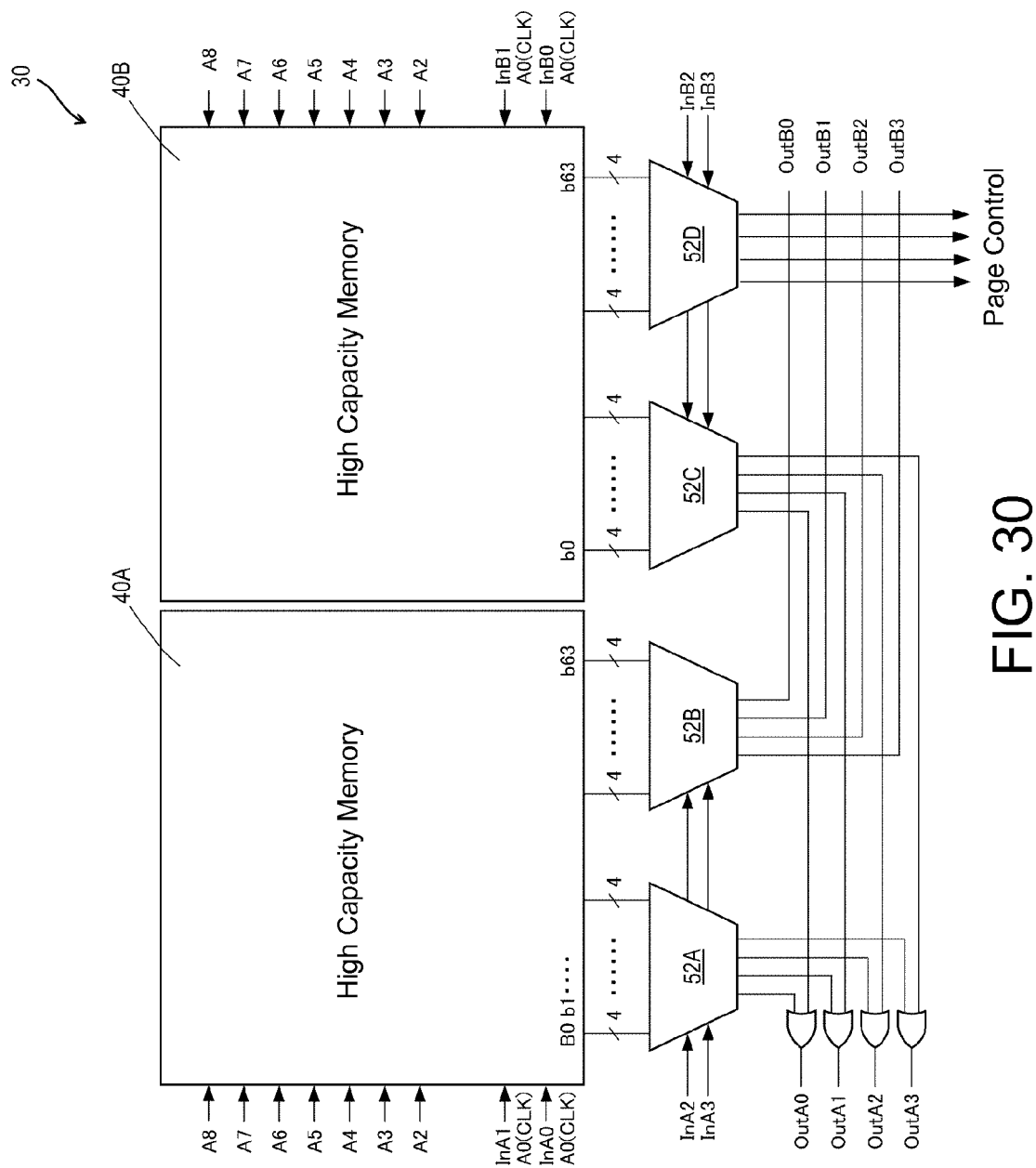
FIG. 30 shows an example of an MLUT performing page control.

FIG. 30 shows an example of an MLUT performing page control. In the MLUT performing page control, a portion of the MLUT operates as a circuit to generate a page control signal for another memory cell unit, and this data output controls the page of the other memory cell unit.

The MLUT 30 shown in FIG. 30 has high capacity memory cell units 40A and 40B, and each memory cell unit has 9 address lines and 64 data lines, and thus, is a high capacity memory of $2^9$ (512) word lines×64 bits. In the present example, logic operations can be multiplexed with A2 to A8 as page addresses. This example includes 128 pages. The present example is a bidirectional MLUT array. The memory cell unit is configured to store configuration data for each page, and thus, the memory capacity is large. Thus, the memory cell unit is constituted of two memories. In this manner, it is possible to perform clock control from left and right.

FIG. 30 is a schematic drawing and circuits peripheral to the memory cell unit such as decoders are not shown, and the decoder 120 and the data input/output unit 140 shown in FIG. 27 are provided for each memory cell unit.

Figure 31:
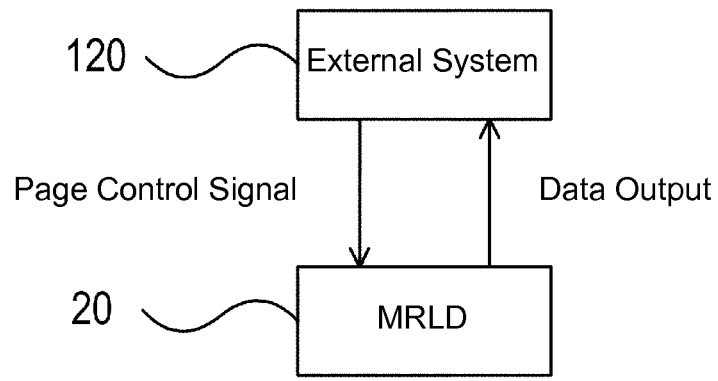
FIG. 31 is a conceptual drawing showing one example of a connection between an external system and an MRLD.

FIG. 31 is a conceptual drawing showing one example of a connection between an external system and an MRLD. An external system 120 is a data processing device or an SoC. The external system 120 is connected to the MRLD 20 shown in FIG. 19, and receives data output from the MRLD 20 and performs logic calculation to determine whether or not to switch pages, and, through this connection, outputs a page switching signal to the addresses A8 to A15. As a result of the external system being equipped with an SoC, it is possible to realize a high functioning device along with the MRLD 20.

(8) Logic or Connective Operation of MRLD

The MLUT realizes the logic element function and/or the connective element function by executing truth table data as a program. The logic or connective operation of the MRLD will be described below. A multi-directional MLUT will be used as an example in the description.

Figure 32:
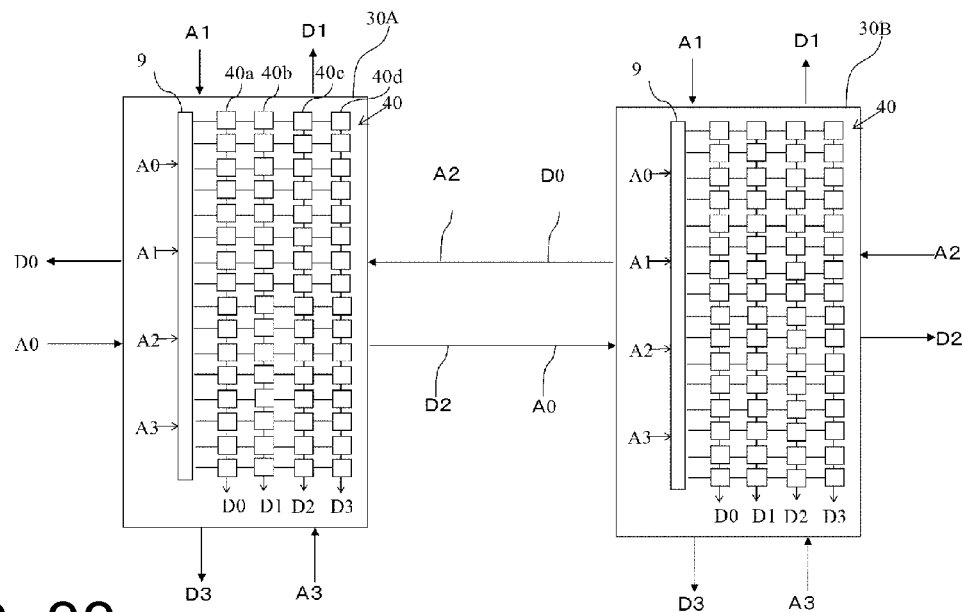
FIG. 32 shows an example of an MLUT operating as a logic element.

A. Logic Element FIG. 32 shows an example of an MLUT operating as a logic element. In FIG. 32, in order to simplify description, the address selector, the data selector, and the input/output buffer are omitted. The MLUTs 30A and 30B shown in FIG. 32 each have four logic address input LA lines A0 to A3, four logic operation data lines D0 to D3, 4×16=64 memory elements 40, and an address decoder 9. The logic operation data lines D0 to D3 are connected in series respectively to 24 of the memory elements 40. The address decoder 9 is configured to select four memory elements connected to any of the 16 word lines on the basis of signals inputted to the logic address input LA lines A0 to A3. The four memory elements are respectively connected to the logic operation data lines D0 to D3, and data stored in the memory elements is outputted to the logic operation data lines D0 to D3. A configuration can be adopted whereby if, for example, an appropriate signal is inputted to the logic address input LA lines A0 to A3, then the four memory elements 40A, 40B, 40C, and 40D are selected. The memory element 40A is connected to the logic operation data line D0, the memory element 40B is connected to the logic operation data line D1, the memory element 40D is connected to the logic operation data line D2, and the memory element 40D is connected to the logic operation data line D3. Signals to be stored in the memory elements 40A to 40D are outputted to the logic operation data lines D0 to D3. In this manner, the MLUTs 30A and 30B receive logic address input LAs from the logic address input LA lines A0 to A3, and the values stored in the four memory elements 40 selected by the address decoder 9 as a result of the logic address input LAs are outputted as logic operation data to the logic operation data lines D0 to D3. The logic address input LA line A2 of the MLUT 30A is connected to the logic operation data line D0 of the adjacent MLUT 30B, and the MLUT 30A receives the logic operation data outputted from the MLUT 30B as the logic address input LA. The logic operation data line D2 of the MLUT 30A is connected to the logic address input LA line A0 of the MLUT 30B, and the MLUT 30B receives the logic operation data outputted from the MLUT 30A as the logic address input LA. The logic operation data line D2 of the MLUT 30A outputs to the logic address input LA line A0 of the MLUT 30B a signal stored in any of the 16 memory elements connected to the logic operation data line D2 on the basis of the signal inputted to the logic address input LA lines A0 to A3 of the MLUT 30A. Similarly, the logic operation data line D0 of the MLUT 30B outputs to the logic address input LA line A2 of the MLUT 30A a signal stored in any of the 16 memory elements connected to the logic operation data line D0 on the basis of the signal inputted to the logic address input LA lines A0 to A3 of the MLUT 30B. In this manner, the connection between MRLDs is achieved by a pair including an address line and a data line.

In FIG. 32, there are four AD pairs in the MLUTs 30A and 30B, but the number of AD pairs is not limited to four as will be described later.

Figure 33:
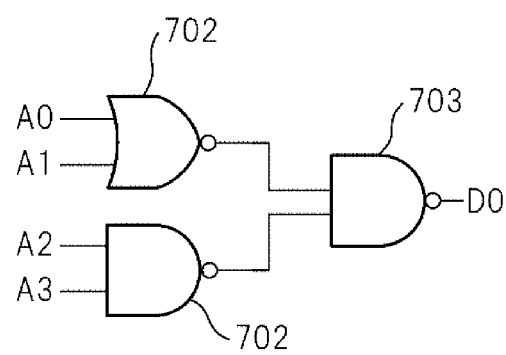
FIG. 33 shows an example of an MLUT operating as a logic circuit.

FIG. 33 shows an example of an MLUT operating as a logic circuit. In the present example, the logic address input LA lines A0 and A1 are the inputs for a two-input NOR circuit 701, and the logic address input LA lines A2 and A3 are inputs for a two-input NAND circuit 702. A logic circuit is configured in which the output from the two-input NOR circuit and the output from the two-input NAND circuit are inputted to a two-input NAND circuit 703, and the output of the two-input NAND circuit 703 is outputted to the logic operation data line D0.

Figures 34, 35, 36:
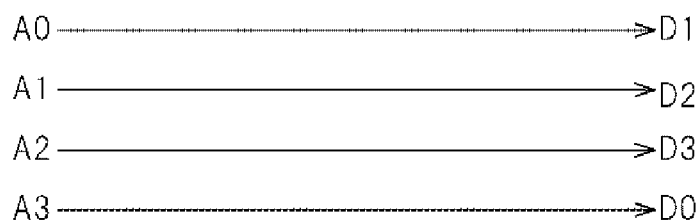
FIG. 34 shows a truth table of the logic circuit shown in FIG. 33.
FIG. 35 shows an example of an MLUT operating as a connective element.
FIG. 36 shows a truth table of the connective element shown in FIG. 35.

FIG. 34 shows a truth table of the logic circuit shown in FIG. 33. The logic circuit of FIG. 33 has four inputs, and thus, the inputs of all of the input ends A0 to A3 are treated as inputs of the logic circuit. On the other hand, there is only one output, and thus, only the output end D0 is treated as the output of the logic circuit. The columns in the truth table under the outputs D1 to D3 have "*" under them. This indicates that "0" and "1" are both acceptable values. However, when actually writing truth table data to the MLUT for reconfiguration, a value of "0" or "1" must be written in these columns. At least data unneeded in the relation between the memory cell unit 31A and the memory cell unit 31B shown in FIG. 12 is set as 0.

B. Connective Element

FIG. 35 shows an example of an MLUT operating as a connective element. In FIG. 35, the MLUT functioning as a connective element operates so as to output the signal from the logic address input LA line A0 to the logic operation data line D1, output the signal from the logic address input LA line A1 to the logic operation data line D2, and output the signal from the logic address input LA line A2 to the logic operation data line D3. The MLUT functioning as the connective element further operates to output the signal from the logic address input LA line A3 to the logic operation data line D1.

FIG. 36 shows a truth table of the connective element shown in FIG. 35. The connective element shown in FIG. 35 has four input ends and four output ends. Thus, all input ends A0 to A3 and all output ends D0 to D3 are used. The MLUT operates as a connective element so as to output the signal of the input end A0 to the output end D1, output the signal of the input end A1 to the output end D2, output the signal of the input end A2 to the output end D3, and output the signal of the input end A3 to the output end D0, according to the truth table shown in FIG. 36.

FIG. 37 shows an example of a connective element realized by an MLUT having four AD pairs including AD0, AD1, AD2, and AD3. AD0 has the logic address input LA line A0 and the logic operation data line D0. AD1 has the logic address input LA line A1 and the logic operation data line D1. AD2 has the logic address input LA line A2 and the logic operation data line D2. AD3 has the logic address input LA line A3 and the logic operation data line D3. In FIG. 37, the two-dot chain line shows the path of the signal inputted to the logic address input LA line A0 of the AD pair 0 being outputted to the logic operation data line D1 of the AD pair 1. The broken shows the path of the signal inputted to the logic address input LA line A1 of the second AD pair 1 being outputted to the logic operation data line D2 of the AD pair 2. The solid line shows the path of the signal inputted to the logic address input LA line A2 of the AD pair 2 being outputted to the logic operation data line D3 of the AD pair 3. The one-dot chain line shows the path of the signal inputted to the logic address input LA line A3 of the AD pair 3 being outputted to the logic operation data line D0 of the AD pair 0.

In FIG. 37, there are four AD pairs in the MLUT 30, but the number of AD pairs is not limited to four.

C. Function Combining Logic Element and Connective Element

FIG. 38 shows an example of one MLUT operating as a logic element and a connective element. In the example shown in FIG. 38, a logic circuit is configured in which the logic address input LA lines A0 and A1 function as the inputs for a two-input NOR circuit 171, the output from the two-input NOR circuit 171 and the logic address input LA line A2 function as inputs for a two-input NAND circuit 172, and the output from the two-input NAND circuit 172 is outputted to the logic operation data line D0. At the same time, a connective element outputting the signal from the logic address input LA line A3 to the logic operation data line D2 is configured.

FIG. 39 shows a truth table of the logic element and the connective element shown in FIG. 38. The logic operation in FIG. 38 uses three input ends D0 to D3 and one output end D0. On the other hand, the connective element of FIG. 38 is configured such that the signal from the input end A3 is outputted to the output end D2.

Figure 40:
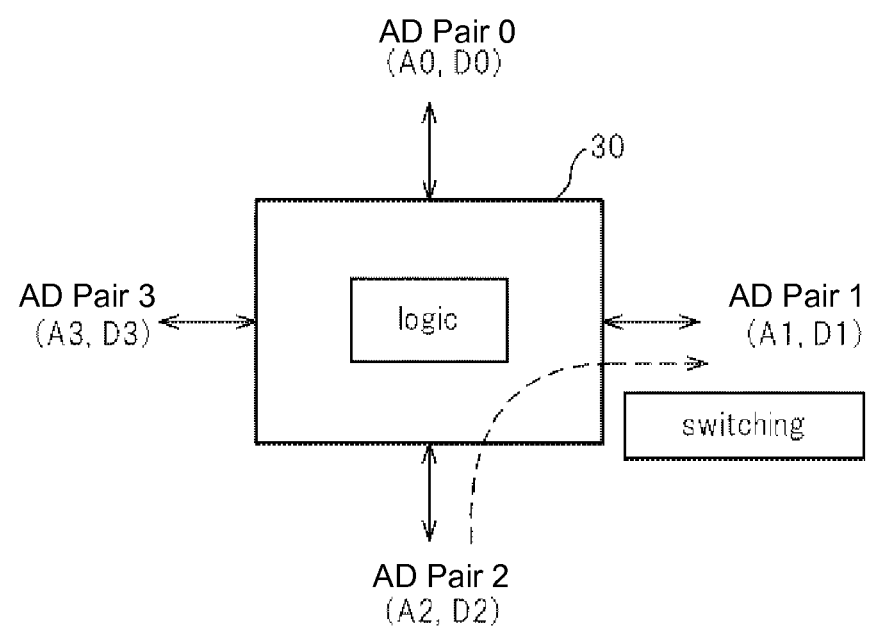
FIG. 40 shows an example of a logic operation and a connective element realized by an MLUT having AD pairs.

FIG. 40 shows an example of a logic element and a connective element realized by an MLUT having four AD pairs including AD0, AD1, AD2, and AD3. In a manner similar to the MLUT shown in FIG. 37, AD0 has the logic address input LA line A0 and the logic operation data line D0. AD1 has the logic address input LA line A1 and the logic operation data line D1. AD2 has the logic address input LA line A2 and the logic operation data line D2. AD3 has the logic address input LA line A3 and the logic operation data line D3. As described above, a single MLUT 30 realizes two operations: the logic element having three input ends and one output end, and the connective element having one input end and one output end. Specifically, the logic element uses the logic address input LA line A0 of the AD pair 0, the logic address input LA line A1 of the AD pair 1, and the logic address input LA line A2 of the AD pair 2 as inputs. The logic element uses the address line of the logic operation data line D0 of the AD pair 0 as the output. In the connective element, as shown with the broken line, the signal inputted to the logic address input LA line A2 of the AD pair 2 is outputted to the logic operation data line D1 of the AD pair 1.

D. Truth Table Data of MLUT Using Reconfigurable Logic Multiplexer

Figure 41:
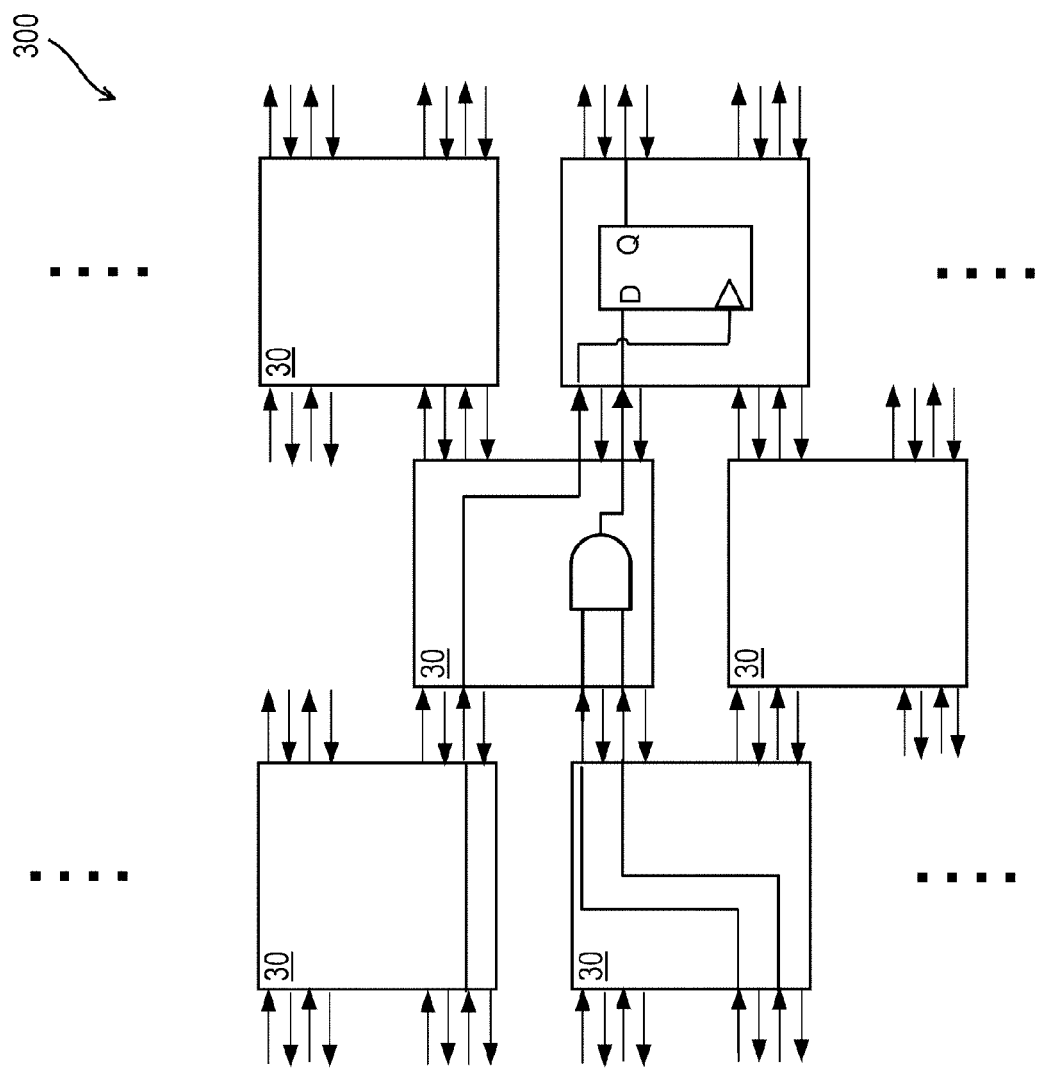
FIG. 41 shows a logic circuit and wiring constituted of interleaved MLUTs as depicted in FIG. 24.

Configuration data in the example shown in FIG. 41 is shown in FIGS. 42A to 42J. FIG. 41 shows a logic circuit and wiring constituted of interleaved MLUTs as depicted in FIG. 24. Two memory cell units (left and right) shown in FIG. 41 are included, and the logic circuit and the wiring lines are constituted of the MLUTs 30A to 30D. FIGS. 42A to 42J also include truth table data selected by page control.

Figure 42A:
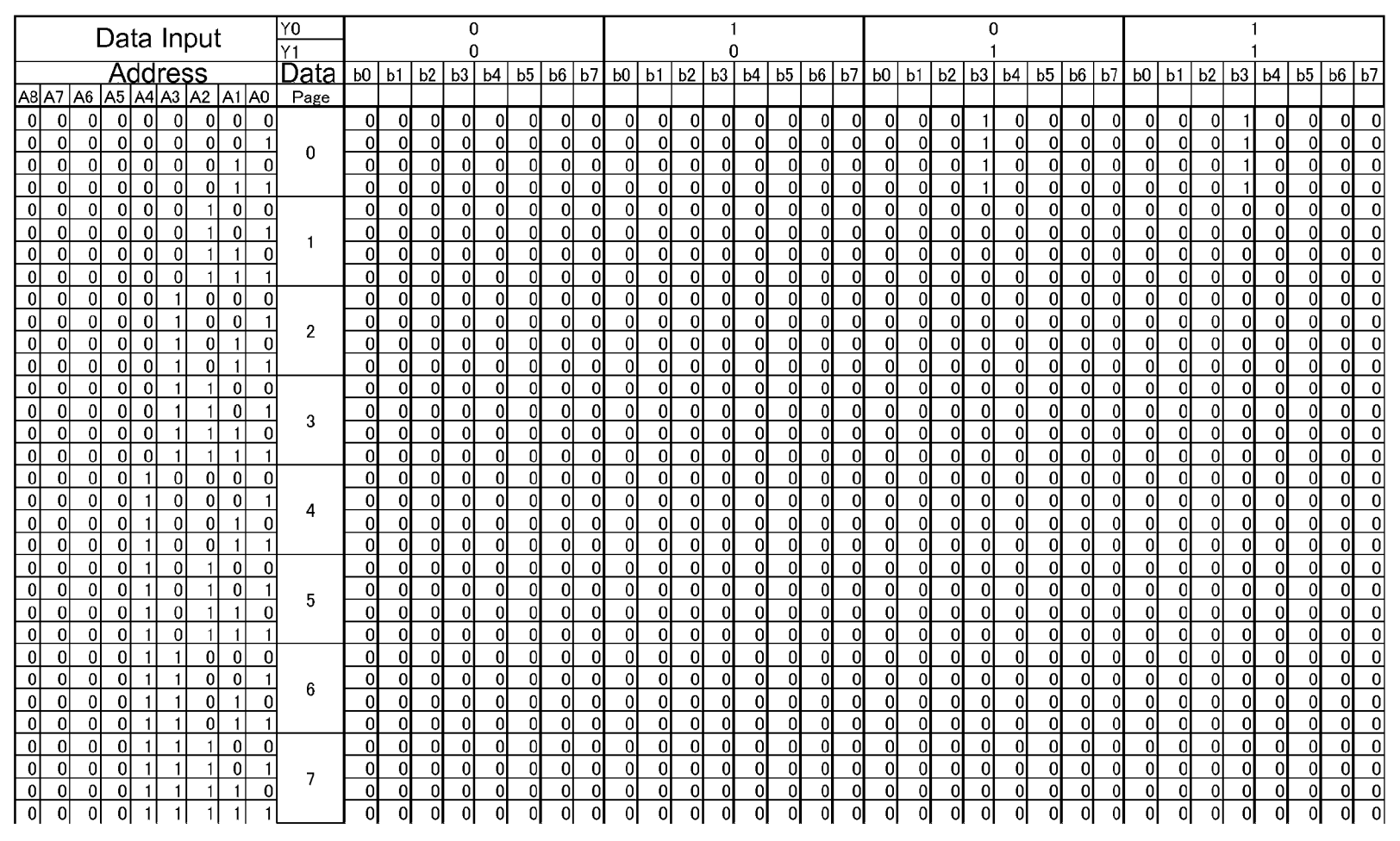
Figure 42B:
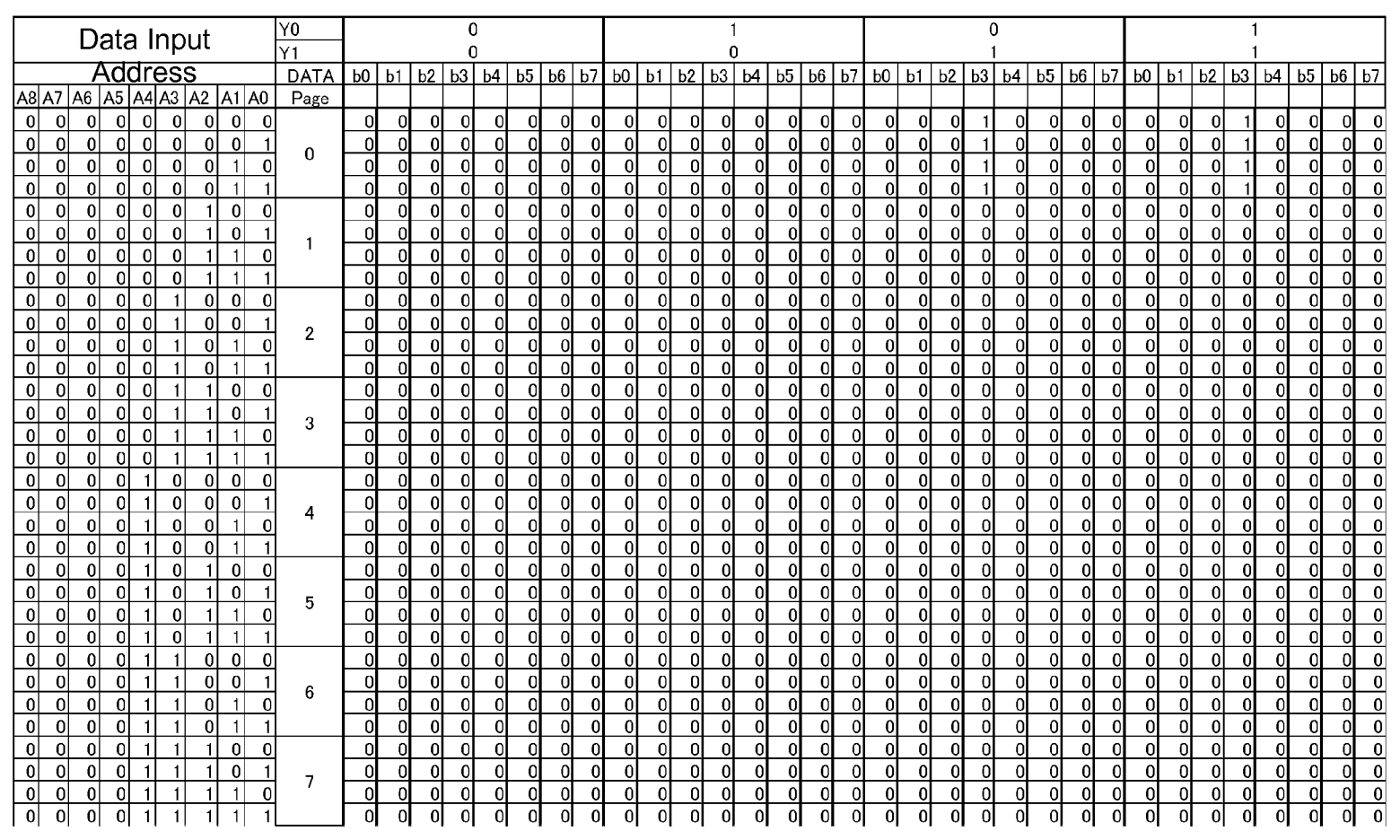
Figure 42C:
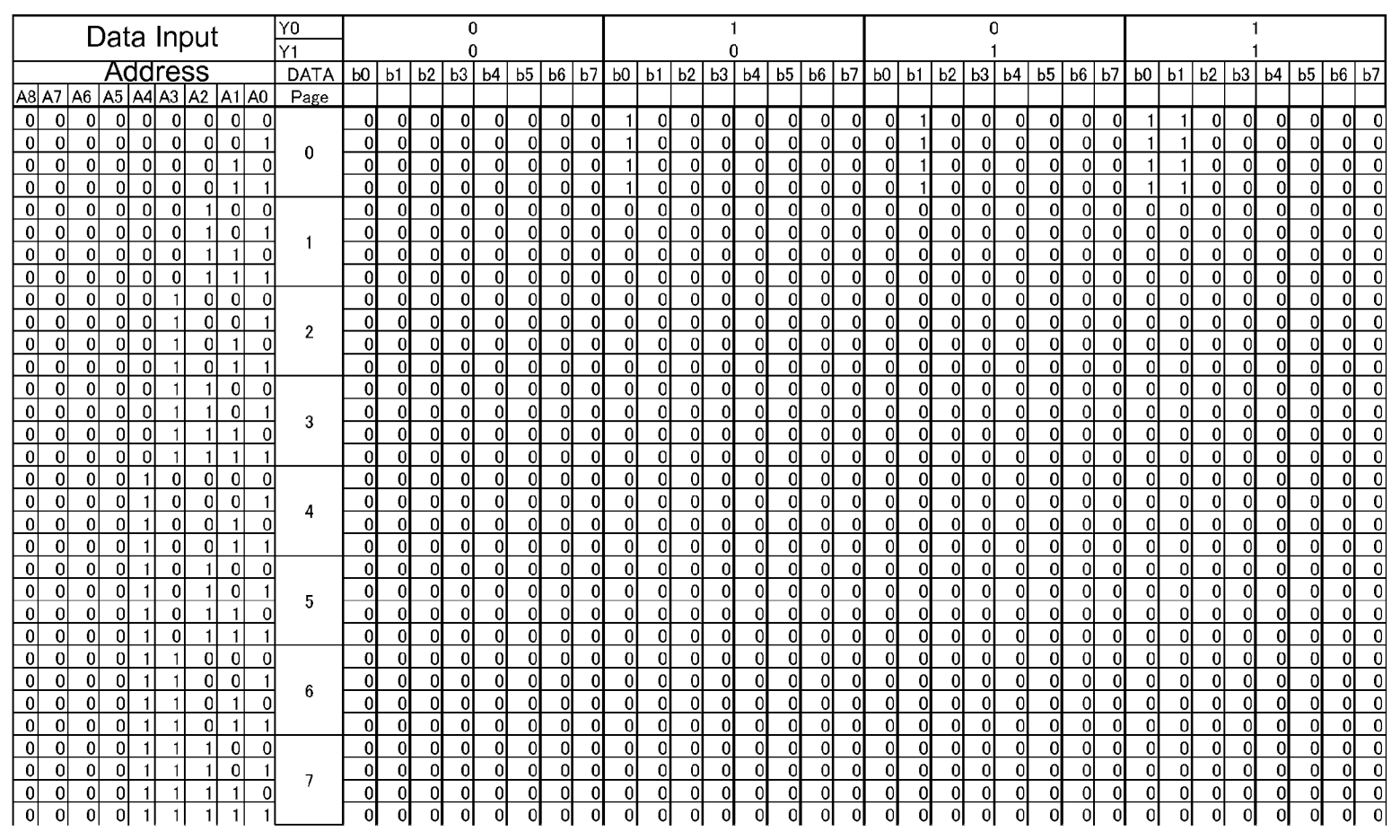
Figure 42D:
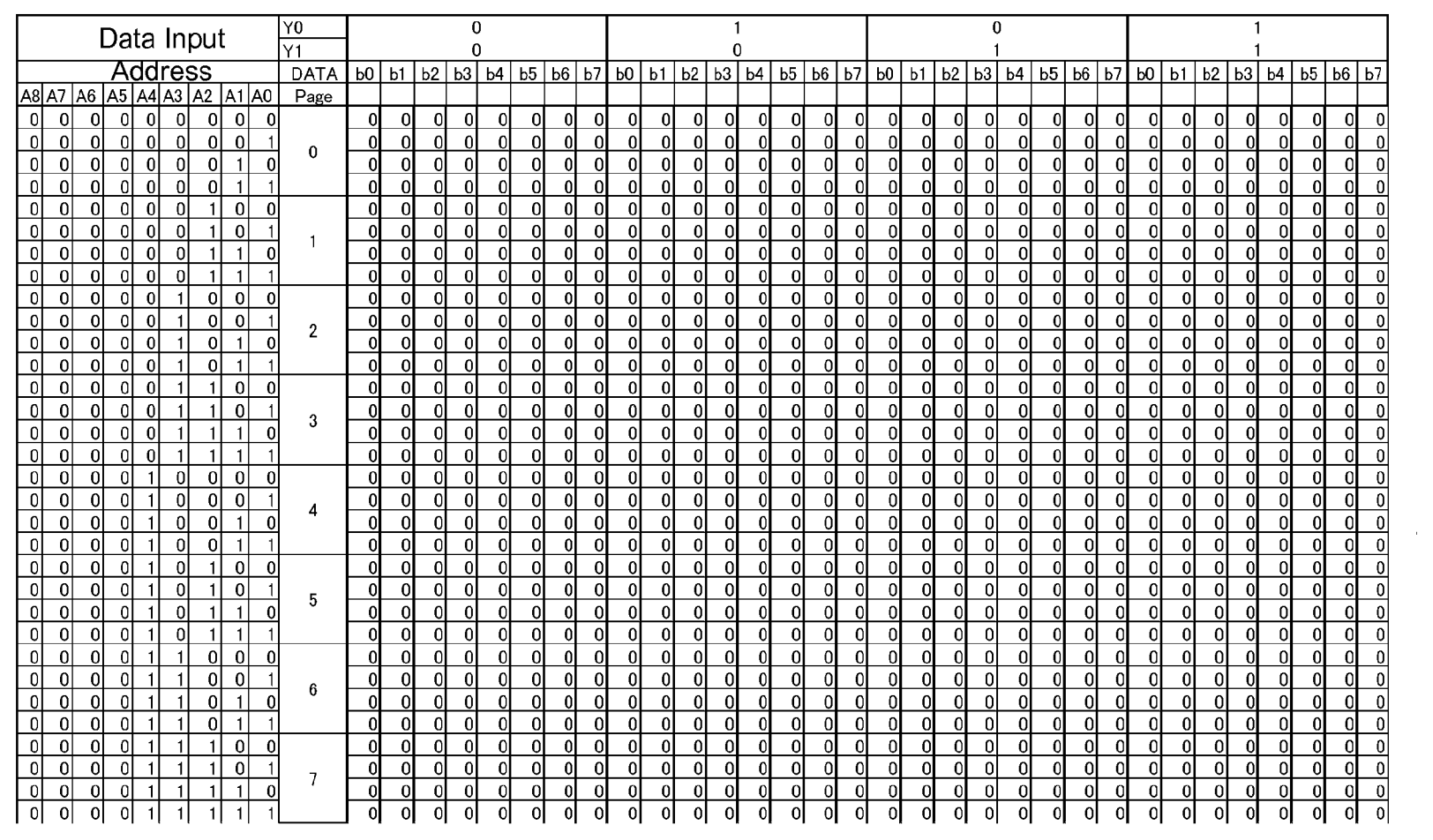
Figure 42E:
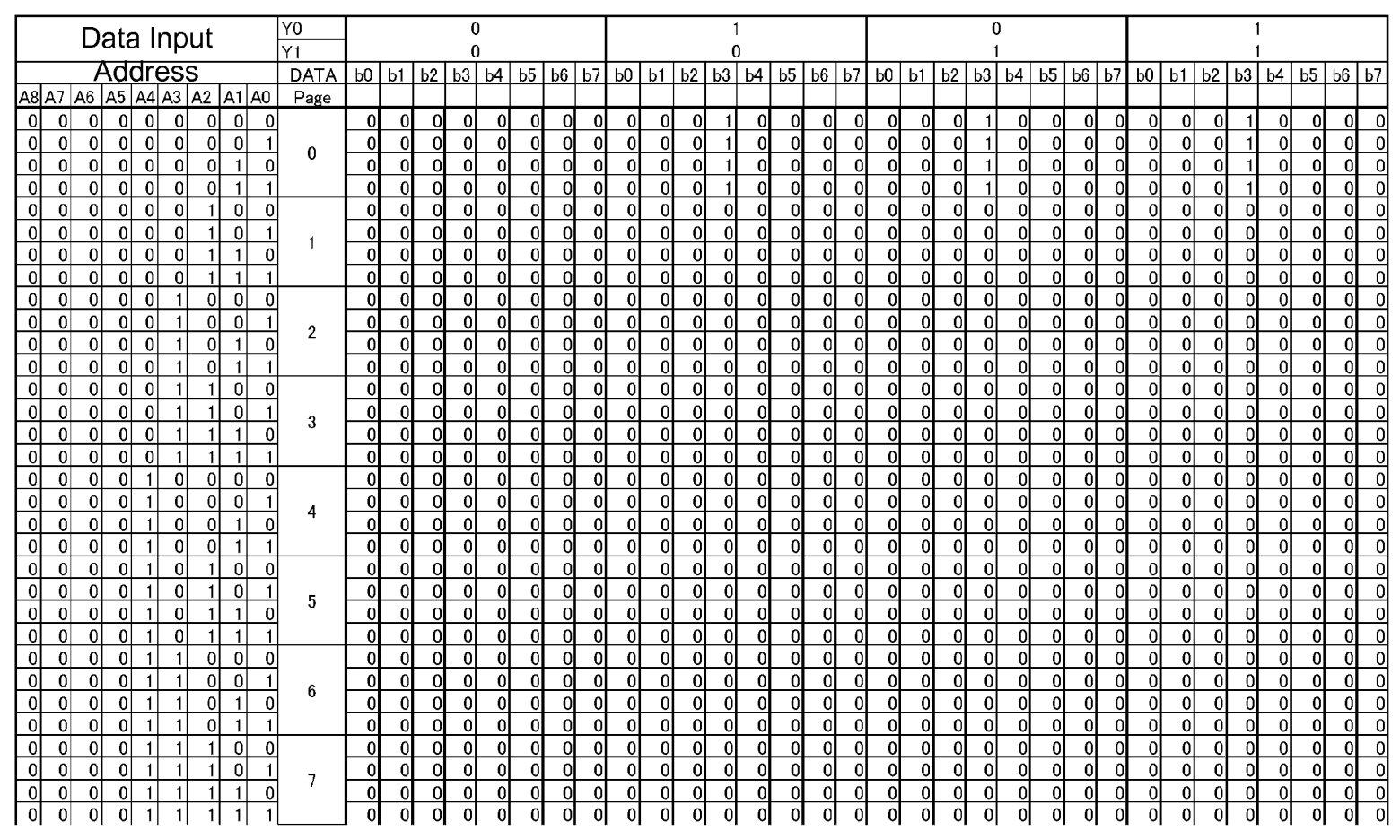
Figure 42F:
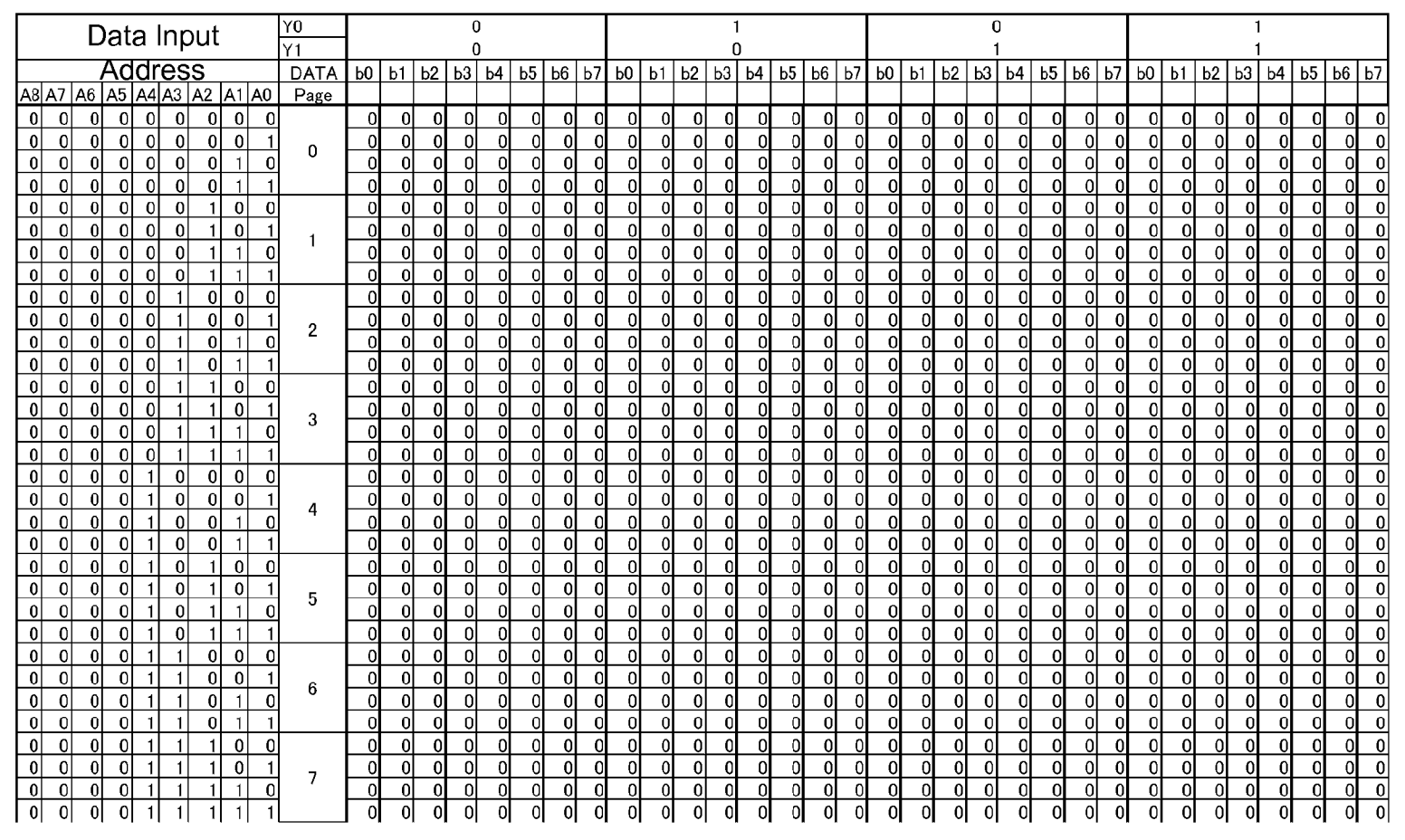

FIG. 42A shows an example of configuration data stored in the left memory cell unit of the MLUT 30A. FIG. 42B shows an example of configuration data stored in the right memory cell unit of the MLUT 30A. FIG. 42C shows an example of configuration data stored in the left memory cell unit of the MLUT 30B. FIG. 42D shows an example of configuration data stored in the right memory cell unit of the MLUT 30B. FIG. 42E shows an example of configuration data stored in the left memory cell unit of the MLUT 30C. FIG. 42F shows an example of configuration data stored in the right memory cell unit of the MLUT 30C.

Figure 42G:
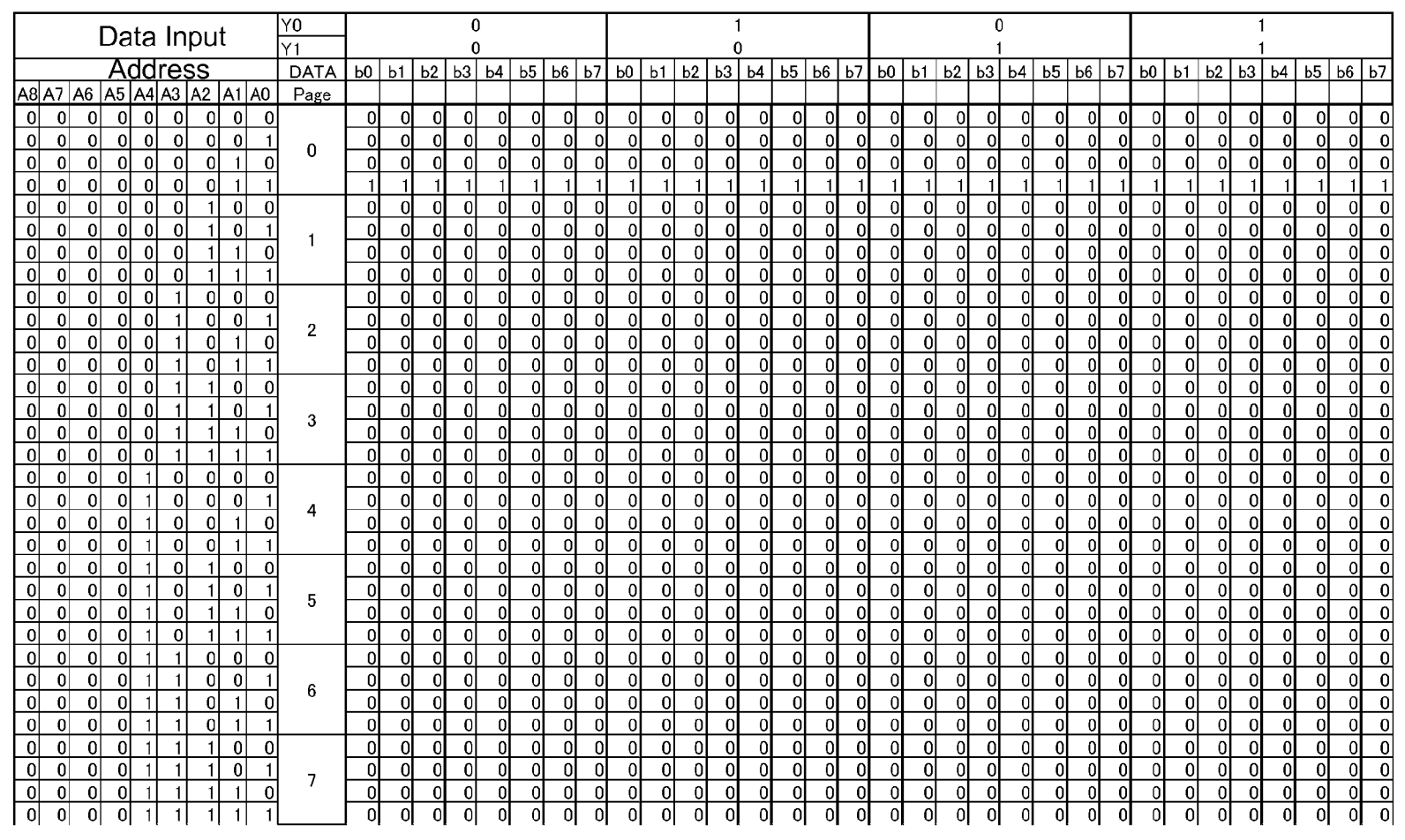
Figure 42H:
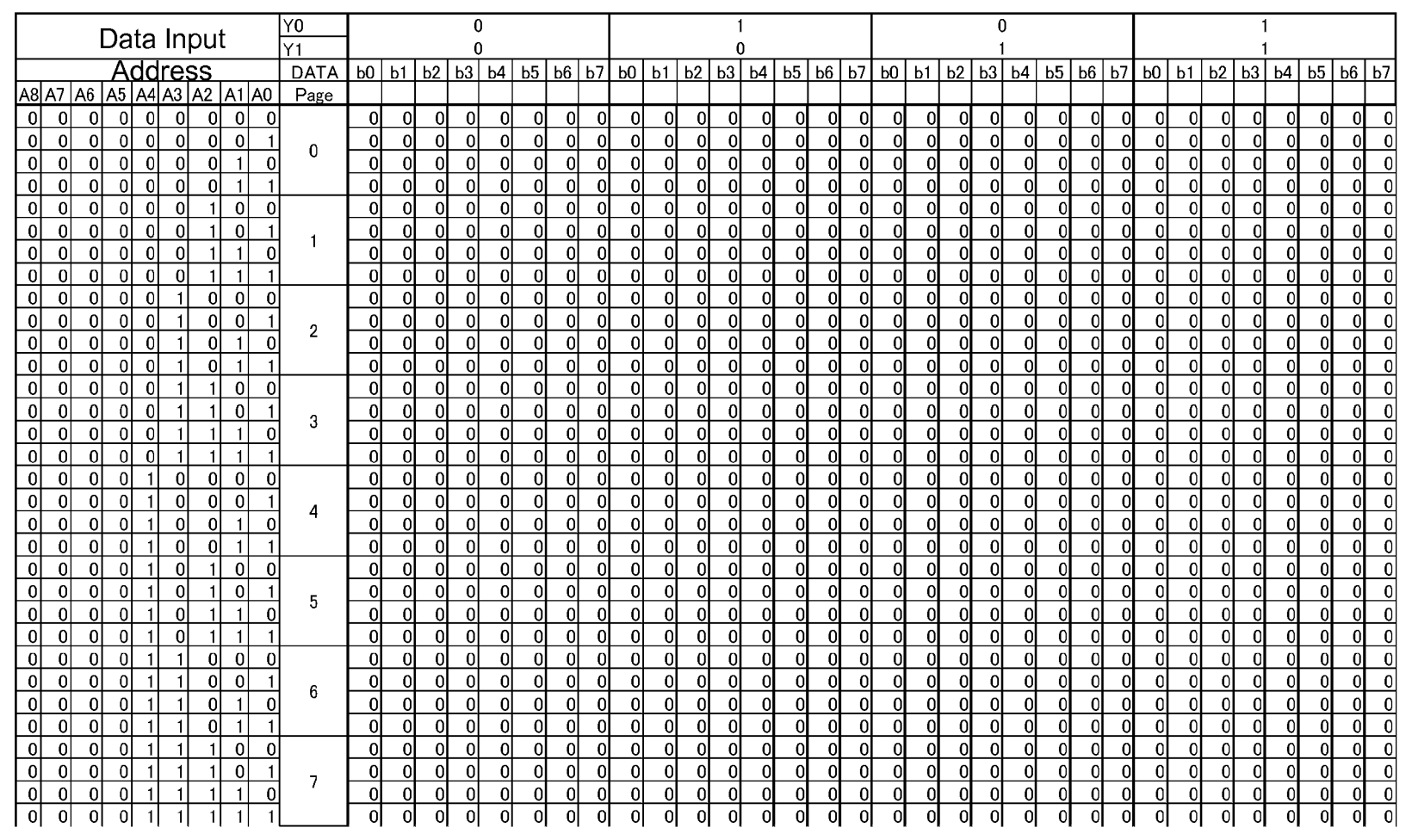
Figure 42I:
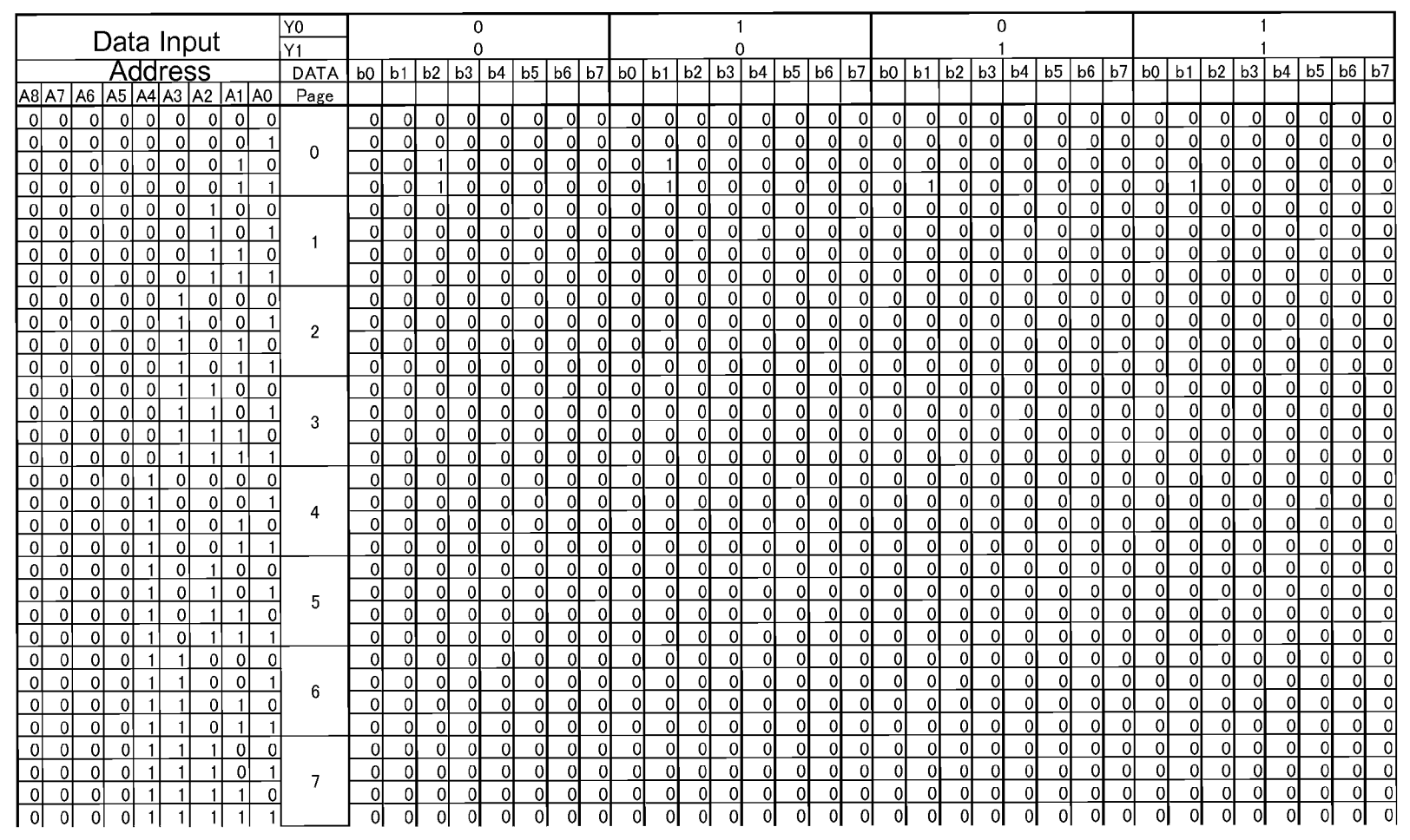
Figure 42J:
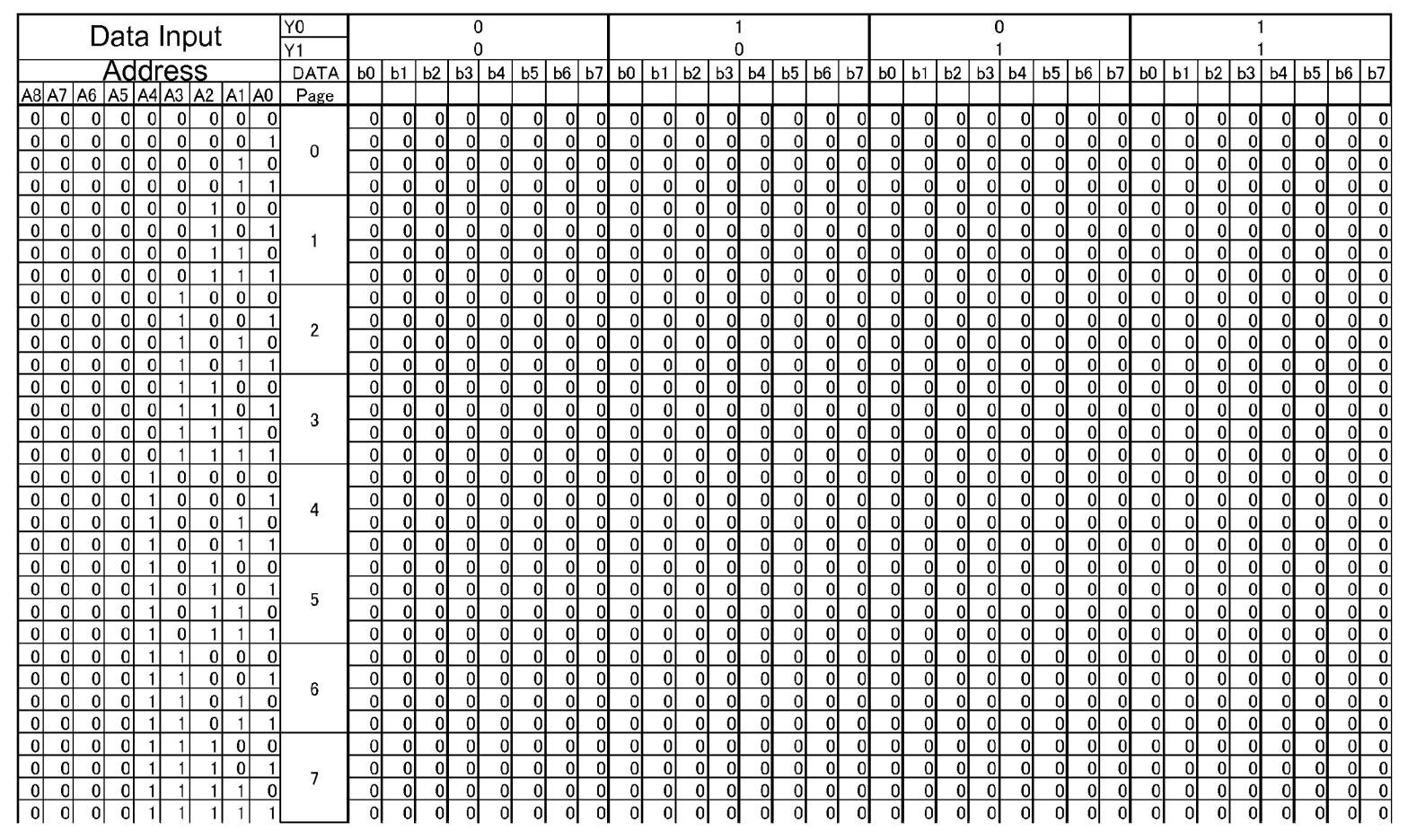

FIG. 42G shows an example of configuration data stored in the left memory cell unit of the MLUT 30D. FIG. 42G shows an example of configuration data stored in the right memory cell unit of the MLUT 30D. FIG. 42I shows an example of configuration data stored in the left memory cell unit of the MLUT 30E. FIG. 42J shows an example of configuration data stored in the right memory cell unit of the MLUT 30E.

As described above, the outputs from the reconfigurable logic multiplexer undergo an OR operation, and thus, configuration data is set to output the result of a desired logic operation by setting the configuration data for paths with no signal output at "0."

(9) Method of Generating Truth Table Data

Truth table data of a recoverable semiconductor device is generated by a data processing device that executes a software program for logical configuration.

Figure 43:
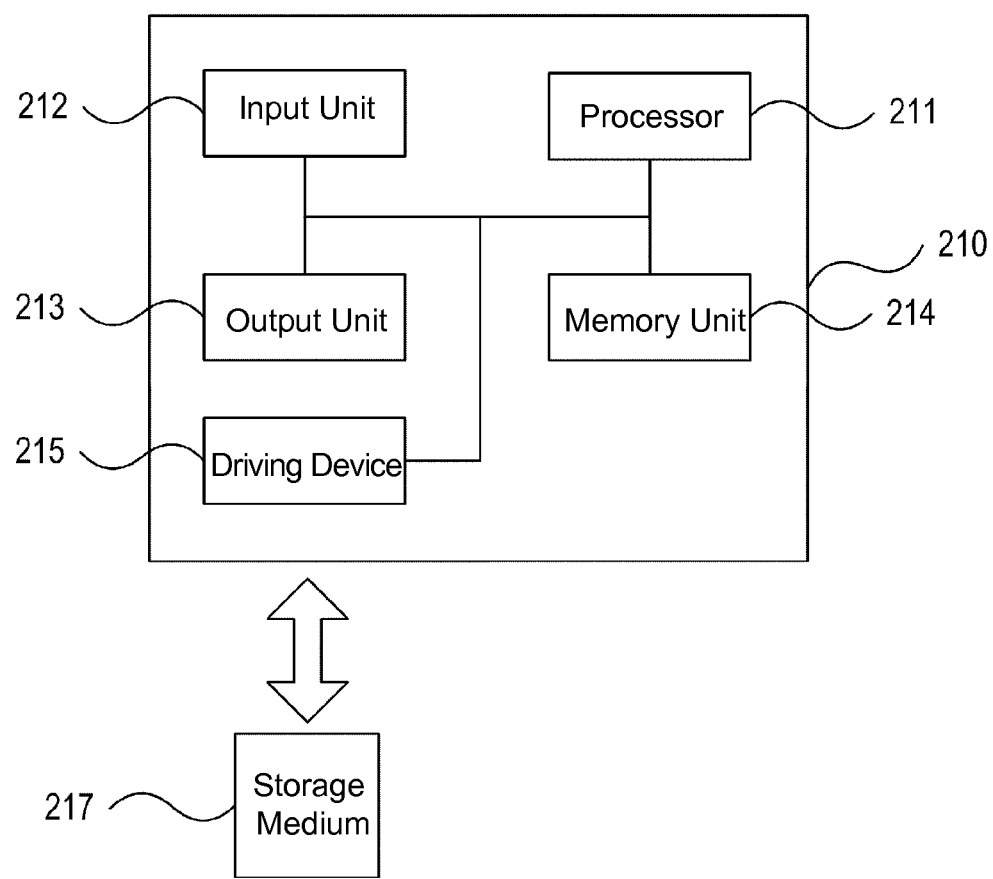
FIG. 43 shows a hardware configuration of a data processing device generating truth table data.

FIG. 43 shows an example of a hardware configuration of a data processing device. The data processing device 210 has a processor 211, an input unit 212, an output unit 213, a memory unit 214, and a drive device 215. The processor 211 stores in the memory unit 214 software for arrangement/wiring inputted to the input unit 212, C programming code or code in a circuit description language such as a hardware description language (HDL) for designing an integrated circuit, and truth table data generated by executing the aforementioned software. The processor 211 executes the software for arrangement/wiring, performs an arrangement/wiring process described below on the circuit description stored in the memory unit 214, and outputs truth table data to the output unit 213. A reconfigurable logic device 20 (not shown in FIG. 34) can be connected to the output unit 213, and the processor 211 executes the logic configuration process and writes the truth table data generated as a result to the reconfigurable logic device 20 through the output unit 213. The output unit 213 may be connected to an external network. In such a case, the software program for logic configuration is transmitted/received through the network. The drive device 215 is a device for reading from and writing to a storage medium 217 such as a DVD (digital versatile disc) and flash memory, for example. The drive device 215 includes a motor for rotating the storage medium 217, a head for reading/writing data on the storage medium 217, and the like. The storage medium 217 can store a program for logic configuration or truth table data. The drive device 215 reads the program from the set storage medium 217. The processor 211 stores the program or truth table data read by the drive device 215 in the memory unit 214.

The embodiment described above is merely a typical example, and it is apparent those skilled in the art that combinations, modifications, and variations of the components of the respective embodiments can be made. Thus, it is apparent to those skilled in the art that various modifications can be made to the embodiments above without deviating from the gist of the present invention or from the scope of the invention defined by the claims. In particular, during logic or connective operation of the MRLD, having a bidirectional MLUT operate as a multi-directional MLUT can be accomplished by modifying an embodiment.

DESCRIPTION OF REFERENCE CHARACTERS

20 MRLD
30 MLUT
31 memory cell unit
40 memory element
60 MLUT array

What is claimed is:

1. A reconfigurable semiconductor device, comprising:
a plurality of logic units connected to each other by address lines or data lines,
wherein each of the logic units includes:
 a plurality of address lines;
 a plurality of data lines;
 a first address decoder that decodes an address inputted from some of the plurality of address lines;
 a second address decoder that decodes an address inputted from the other of the plurality of address lines;
 a first memory cell unit having a plurality of memory cells, the first memory cell receiving the address decoded by the first address decoder and selecting, among the plurality of memory cells, a predetermined number of memory cells in accordance with the decoded address; and
 a second memory cell unit having a plurality of memory cells, the first memory cell receiving the address decoded by the second address decoder and selecting, among the plurality of memory cells, a predetermined number of memory cells in accordance with the decoded address.

2. The semiconductor device according to claim 1, wherein the first and second memory cell units are multiple lookup tables.

3. The semiconductor device according to claim 1, wherein the logic units are rectangular, and are each connected on one side to other logic units through the plurality of address lines or the plurality of data lines, the logic units being connected to the other logic units through the plurality of address lines or the plurality of data lines from another side opposite to the one side.

4. The semiconductor device according to claim 3,
wherein the plurality of address lines are divided into a first plurality of address lines and a second plurality of address lines,
wherein in the first memory cell unit, said predetermined number of memory cells are selected by the decoded address provided by the first plurality of address lines from the one side, the predetermined number of memory cells respectively outputting data stored therein to a first plurality of data lines, respectively, the predetermined number being twice as many as the number of the first plurality of address lines,
wherein in the second memory cell unit, said predetermined number of memory cells are selected by the decoded address provided by the second plurality of address lines from said another side, the predetermined number of memory cells respectively outputting data stored therein to a second plurality of data lines, respectively, the predetermined number being twice as many as the number of the second plurality of address lines, and
wherein in each of the logic units, some of the first plurality of data lines and some of the second plurality of data lines are outputted to the one side, and the other of the first plurality of data lines and the other of the second plurality of data lines are outputted to said another side.

5. The semiconductor device according to claim 4,
wherein the first memory cell unit stores first truth table data for outputting data to the one side and second truth table data for outputting data to said another side in response to address input from the one side,
wherein the second memory cell unit stores third truth table data for outputting data to the one side and fourth truth table data for outputting data to said another side in response to address input from said another side, and
wherein a direction of output of the data is changed according to the first to fourth truth table data.

6. The semiconductor device according to claim 3,
wherein the plurality of address lines are divided into a first plurality of address lines and a second plurality of address lines,
wherein in the first memory cell unit, said predetermined number of memory cells are selected by the decoded address provided by the first plurality of address lines from the one side, the predetermined number of memory cells respectively outputting data stored therein to a first plurality of data lines, respectively, the predetermined number being twice as many as the number of the first plurality of address lines,
wherein in the second memory cell unit, said predetermined number of memory cells are selected by the decoded address provided by the second plurality of address lines from said another side, the predetermined number of memory cells respectively outputting data stored therein to a second plurality of data lines, respectively, the predetermined number being the same as the number of the second plurality of address lines, and
wherein in each of the logic units, the second plurality of data lines and some of the first plurality of data lines are outputted to the one side, and the other of the first plurality of data lines are outputted to said another side.

7. The semiconductor device according to claim 1,
wherein each of the first and second memory cell units is configured to do either or both of the following:
 operate as a logic circuit by storing truth table data for outputting to the data lines logic calculations of values stored in memory cells selected by some of said address lines; and
 operate as a connecting circuit by storing truth table data for outputting to the data lines that are connected to address lines of other logic units, values stored in memory cells selected by some of the address lines.

8. The semiconductor device according to claim 1, wherein the first memory cell unit and the second memory cell unit each store a plurality of truth table data and are connected to a second plurality of address lines outputting data identifying one of the plurality of truth table data.

9. The semiconductor device according to claim 8, wherein the second plurality of address lines are connected to an exterior.

10. The semiconductor device according to claim 1, wherein the second memory cell unit stores a plurality of truth table data and is connected to a second plurality of address lines outputting data identifying one of the plurality of truth table data, and
wherein some of the data lines of the first memory cell unit are connected to the second plurality of address lines, and the first memory cell unit stores truth table data for identifying said one of the plurality of truth table data in the second memory cell unit and outputs to the second plurality of address lines the data identifying said one of the plurality of truth table data.

11. A method of controlling a reconfigurable semiconductor device,
wherein the reconfigurable semiconductor device includes a plurality of logic units connected to each other by address lines or data lines,
wherein each of the logic units includes:
a plurality of address lines;
a plurality of data lines;
a first address decoder;
a second address decoder;
a first memory cell unit having a plurality of memory cells; and
a second memory cell unit having a plurality of memory cells, and wherein the method comprises:
decoding by the first address decoder an address inputted from some of the plurality of address lines;
decoding by the second address decoder an address inputted from the other of the plurality of address lines;
selecting a predetermined number of memory cells in the first memory cell unit in accordance with the address decoded by the first address decoder; and
selecting a predetermined number of memory cells in the second memory cell unit in accordance with the address decoded by the second address decoder.

12. The method of controlling a reconfigurable semiconductor device according to claim 11, wherein the first and second memory cell units are multiple lookup tables.

13. The method of controlling a reconfigurable semiconductor device according to claim 11, wherein the logic units are rectangular, and are each connected on one side to other logic units through the plurality of address lines or the plurality of data lines, the logic units being connected to the other logic units through the plurality of address lines or the plurality of data lines from another side opposite to the one side.

14. The method of controlling a reconfigurable semiconductor device according to claim 13,
wherein the plurality of address lines are divided into a first plurality of address lines and a second plurality of address lines,
wherein in the first memory cell unit, said predetermined number of memory cells are selected by the decoded address provided by the first plurality of address lines from the one side, the predetermined number of memory cells respectively outputting data stored therein to a first plurality of data lines, respectively, the predetermined number being twice as many as the number of the first plurality of address lines,
wherein in the second memory cell unit, the predetermined number of memory cells are selected by the decoded address provided by the second plurality of address lines from said another side, the predetermined number of memory cells respectively outputting data stored therein to a second plurality of data lines, respectively, the predetermined number being twice as many as the number of the second plurality of address lines, and
wherein in each of the logic units, some of the first plurality of data lines and some of the second plurality of data lines are outputted to the one side, and the other of the first plurality of data lines and the other of the second plurality of data lines are outputted to said another side.

15. The method of controlling a reconfigurable semiconductor device according to claim 14,
wherein the first memory cell unit stores first truth table data for outputting data to the one side and second truth table data for outputting data to said another side in response to address input from the one side,
wherein the second memory cell unit stores third truth table data for outputting data to the one side and fourth truth table data for outputting data to said another side in response to address input from said another side, and
wherein a direction of output of the data is changed according to the first to fourth truth table data.

16. The method of controlling a reconfigurable semiconductor device according to claim 13,
wherein the plurality of address lines are divided into a first plurality of address lines and a second plurality of address lines,
wherein in the first memory cell unit, said predetermined number of memory cells are selected by the decoded address provided by the first plurality of address lines from the one side, the predetermined number of memory cells respectively outputting data stored therein to a first plurality of data lines, respectively, the predetermined number being twice as many as the number of the first plurality of address lines,
wherein in the second memory cell unit, said predetermined number of memory cells are selected by the decoded address provided by the second plurality of address lines from said another side, the predetermined number of memory cells respectively outputting data stored therein to a second plurality of data lines, respectively, the predetermined number being the as the number of the second plurality of address lines, and
wherein in each of the logic units, the second plurality of data lines and some of the first plurality of data lines are outputted to the one side, and the other of the first plurality of data lines are outputted to said another side.

17. The method of controlling a reconfigurable semiconductor device according to claim 11,
wherein each of the first and second memory cell units is configured to do either or both of the following:
operate as a logic circuit by storing truth table data for outputting to the data lines logic calculations of values stored in memory cells identified by certain said address lines; and
operate as a connecting circuit by storing truth table data for outputting to the data lines, connected to address lines of other logic units, values stored in memory cells identified by certain said address lines.

18. The method of controlling a reconfigurable semiconductor device according to claim 11, wherein the first memory cell unit and the second memory cell unit each store a plurality of truth table data and are connected to a second plurality of address lines outputting data identifying one of the plurality of truth table data.

19. The method of controlling a reconfigurable semiconductor device according to claim 18, wherein the second plurality of address lines are connected to an exterior.

20. The method of controlling a reconfigurable semiconductor device according to claim 11,
wherein the second memory cell unit stores a plurality of truth table data and is connected to a second plurality of address lines outputting data identifying one of the plurality of truth table data, and
wherein some of the data lines of the first memory cell unit are connected to the second plurality of address lines, and the first memory cell unit stores truth table data for identifying said one of the plurality of truth table data in the second memory cell unit and outputs to the second plurality of address lines the data identifying said one of the plurality of truth table data.

21. A non-transitory storage medium that stores instructions executable by a reconfigurable semiconductor device,
wherein the semiconductor device includes a plurality of logic units connected to each other by address lines or data lines,
wherein each of the logic units includes:
a plurality of address lines;
a plurality of data lines;
a first address decoder;
a second address decoder;
a first memory cell unit having a plurality of memory cells; and
a second memory cell unit having a plurality of memory cells,
wherein the first address decoder decodes an address inputted from some of the plurality of address lines,
wherein the second address decoder decodes an address inputted from the other of the plurality of address lines,
wherein the logic units are rectangular, and are each connected on one side to other logic units through the plurality of address lines or the plurality of data lines, the logic units being connected to other logic units through the plurality of address lines or the plurality of data lines from another side opposite to the one side, and
wherein said instructions cause the reconfigurable semiconductor device to perform one of the
following operations in the first or second memory cell unit
causing the first or second memory cell unit to output a result of logic calculation on values stored in memory cells selected by the address lines connected to the one side, to the data lines connected on said another side opposite to the one side so that the first or second memory cell unit operates as a logic circuit; and
causing the first or second memory cell unit to output values stored in memory cells selected by the address lines connected to the one side, to the data lines connected on said another side opposite to the one side so that the first or second memory cell unit operates as a connecting circuit.

22. The non-transitory storage medium according to claim 21, first and second memory cell units are multiple lookup tables.

23. The non-transitory storage medium according to claim 21,
wherein the plurality of address lines are divided into a first plurality of address lines
and a second plurality of address lines,
wherein in the first memory cell unit, said predetermined number of memory cells are selected by the decoded address provided by the first plurality of address lines from the one side, the predetermined number of memory cells respectively outputting data stored therein to a first plurality of data lines, respectively, the predetermined number being twice as many as the number of the first plurality of address lines,
wherein in the second memory cell unit, said predetermined number of memory cells are selected by the decoded address provided by the second plurality of address lines from said another side, the predetermined number of memory cells respectively outputting data stored therein to a second plurality of data lines, respectively, the predetermined number being twice as many as the number of the second plurality of address lines, and
wherein in each of the logic units, some of the first plurality of data lines and
some of the second plurality of data lines are outputted to the one side, and the other of the first plurality of data lines and the other of the second plurality of data lines are outputted to said another side.

24. The non-transitory storage medium according to claim 21,
wherein the first memory cell unit stores first truth table data for outputting data to the one side and second truth table data for outputting data to said another side in response to address input from the one side,
wherein the second memory cell unit stores third truth table data for outputting data to the one side and fourth truth table data for outputting data to said another side in response to address input from said another side, and
wherein, in the first or second memory cell unit, a process to change a direction of output of the data according to the first to fourth truth table data is executed.

25. The non-transitory storage medium according to claim 21,
wherein the first memory cell unit has a plurality of memory cells identified by a first plurality of address lines from the one side, the plurality of memory cells outputting to a first plurality of data lines numbering twice as many as the first plurality of address lines,
wherein the second memory cell unit has a plurality of memory cells identified by a second plurality of address lines from said another side, the plurality of memory cells outputting to a second plurality of data lines of which there are the same number as the second plurality of address lines, and
wherein, in the first or second memory cell unit, in each of the logic units, the second plurality of data lines and some of the first plurality of data lines are outputted to the one side, and the other of the first plurality of data lines are outputted to said another side.

26. The non-transitory storage medium according to claim 21,
wherein the second memory cell unit stores a plurality of truth table data and is connected to a second plurality of address lines outputting data identifying one of the plurality of truth table data, and
wherein some of the data lines of the first memory cell unit are connected to the second plurality of address lines, and
the first memory cell unit stores truth table data for identifying said one of the plurality of truth table data in the second memory cell unit and outputs to the second plurality of address lines the data identifying said one of the plurality of truth table data.

* * * * *